(12) United States Patent
Nakamura et al.

(10) Patent No.: US 9,768,201 B2
(45) Date of Patent: Sep. 19, 2017

(54) DISPLAY DEVICE AND ELECTRONIC DEVICE

(71) Applicant: Semiconductor Energy Laboratory Co., Ltd., Kanagawa-ken (JP)

(72) Inventors: Daiki Nakamura, Kanagawa (JP); Kensuke Yoshizumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/256,968

(22) Filed: Sep. 6, 2016

(65) Prior Publication Data

US 2017/0069664 A1    Mar. 9, 2017

(30) Foreign Application Priority Data

Sep. 8, 2015 (JP) ................................. 2015-176532

(51) Int. Cl.
*H01L 27/12* (2006.01)
*H01L 27/15* (2006.01)
(Continued)

(52) U.S. Cl.
CPC ............ *H01L 27/124* (2013.01); *H01L 27/15* (2013.01); *H01L 27/323* (2013.01);
(Continued)

(58) Field of Classification Search
CPC ... H01L 25/0753; H01L 27/153; H01L 33/62; H01L 33/20; H01L 27/3293
See application file for complete search history.

(56) References Cited

U.S. PATENT DOCUMENTS

| 5,801,797 A | 9/1998 | Iida et al. |
|---|---|---|
| 7,399,991 B2 | 7/2008 | Seo et al. |

(Continued)

FOREIGN PATENT DOCUMENTS

| JP | 2001-100662 A | 4/2001 |
|---|---|---|
| JP | 2002-324673 A | 11/2002 |

(Continued)

OTHER PUBLICATIONS

International Search Report re Application No. PCT/IB2016/055096, dated Nov. 15, 2016.

(Continued)

*Primary Examiner* — Quoc Hoang
(74) *Attorney, Agent, or Firm* — Husch Blackwell LLP

(57) ABSTRACT

A display device includes overlapping two display panels. The display panel on the upper side includes a first display region and a region that transmits visible light. The display panel on the lower side includes a second display region and a region that blocks visible light. The second display region overlaps with the region that transmits visible light. The region that blocks visible light overlaps with the first display region. The display panel on the lower side includes a third display region between the second display region and the region that blocks visible light. The gate signal and the source signal supplied to a first pixel in the third display region are the same as the gate signal and the source signal supplied to a second pixel in the second display region. The second pixel is closer to the first pixel than any other pixels included in the second display region.

19 Claims, 47 Drawing Sheets

(51) Int. Cl.
*H01L 27/32* (2006.01)
*H01L 51/00* (2006.01)
*H01L 33/00* (2010.01)
*H01L 33/62* (2010.01)

(52) U.S. Cl.
CPC ...... *H01L 27/3262* (2013.01); *H01L 27/3276* (2013.01); *H01L 33/0041* (2013.01); *H01L 33/62* (2013.01); *H01L 51/0097* (2013.01)

(56) References Cited

U.S. PATENT DOCUMENTS

| | | |
|---|---|---|
| 7,663,149 B2 | 2/2010 | Seo et al. |
| 8,367,440 B2 | 2/2013 | Takayama et al. |
| 8,415,208 B2 | 4/2013 | Takayama et al. |
| 9,088,006 B2 | 7/2015 | Yamazaki et al. |
| 9,092,196 B2 * | 7/2015 | Yoo .............. G06F 1/1641 |
| 2002/0011783 A1 | 1/2002 | Hosokawa |
| 2004/0014252 A1 | 1/2004 | Shimoda et al. |
| 2005/0285811 A1 | 12/2005 | Kawase et al. |
| 2007/0262916 A1 | 11/2007 | Kee et al. |
| 2010/0117928 A1 | 5/2010 | Shim et al. |
| 2010/0177018 A1 | 7/2010 | Wang et al. |
| 2011/0050657 A1 | 3/2011 | Yamada |
| 2011/0057861 A1 | 3/2011 | Cok et al. |
| 2012/0268445 A1 | 10/2012 | Ogata et al. |
| 2013/0200783 A1 | 8/2013 | Van Heck et al. |
| 2013/0201636 A1 | 8/2013 | Van Den Brand et al. |
| 2013/0201637 A1 | 8/2013 | De Kok et al. |
| 2013/0214324 A1 | 8/2013 | Takayama et al. |
| 2015/0028316 A1 | 1/2015 | Kojima et al. |
| 2015/0228704 A1 | 8/2015 | Miyake et al. |
| 2015/0325812 A1 | 11/2015 | Yamazaki et al. |
| 2016/0019019 A1 | 1/2016 | Ikeda et al. |
| 2016/0037608 A1 | 2/2016 | Ikeda et al. |
| 2016/0044751 A1 | 2/2016 | Ikeda et al. |
| 2016/0103649 A1 | 4/2016 | Yoshitani et al. |
| 2016/0132281 A1 | 5/2016 | Yamazaki et al. |
| 2016/0155391 A1 | 6/2016 | Takesue et al. |
| 2016/0210103 A1 | 7/2016 | Yoshizumi et al. |

FOREIGN PATENT DOCUMENTS

| | | | |
|---|---|---|---|
| JP | 2003-022037 A | 1/2003 | |
| JP | 2003-029667 A | 1/2003 | |
| JP | 2003-174153 A | 6/2003 | |
| JP | 2004-251981 A | 9/2004 | |
| JP | 2006-010811 A | 1/2006 | |
| JP | 2007-304584 A | 11/2007 | |
| JP | 2010-113359 A | 5/2010 | |
| JP | 2012-028638 A | 2/2012 | |
| JP | 2013-504092 | 2/2013 | |
| JP | 2014-197522 A | 10/2014 | |
| JP | 2015-180924 A | 10/2015 | |
| WO | WO 01/24585 A1 | 4/2001 | |
| WO | WO 2011/031605 A1 | 3/2011 | |
| WO | WO 2015/121770 A1 | 8/2015 | |

OTHER PUBLICATIONS

Written Opinion re Application No. PCT/IB2016/055096, dated Nov. 15, 2016.

* cited by examiner

P1

Q2

P3

149(m+1, n+1)
149(m+1, n)
141(m, n)
149(m, n+1)
120

Q4

149a(m+1, n+1)
149a(m+1, n)   141c(1, n)  141d(1, 1)
141b(m, 1)
149a(m+1, n−1)
141b(m, 2)
141b(m−1, 1)
110c
141b(m−1, 2)
141a(m, n)
141a(m, n−1)
110d
141a(m−1, n)
141b(m−3, 2)
141b(m−3, 1)
110b
141b(m−4, 2)
149a(m, n+1)  141b(m−4, 1)

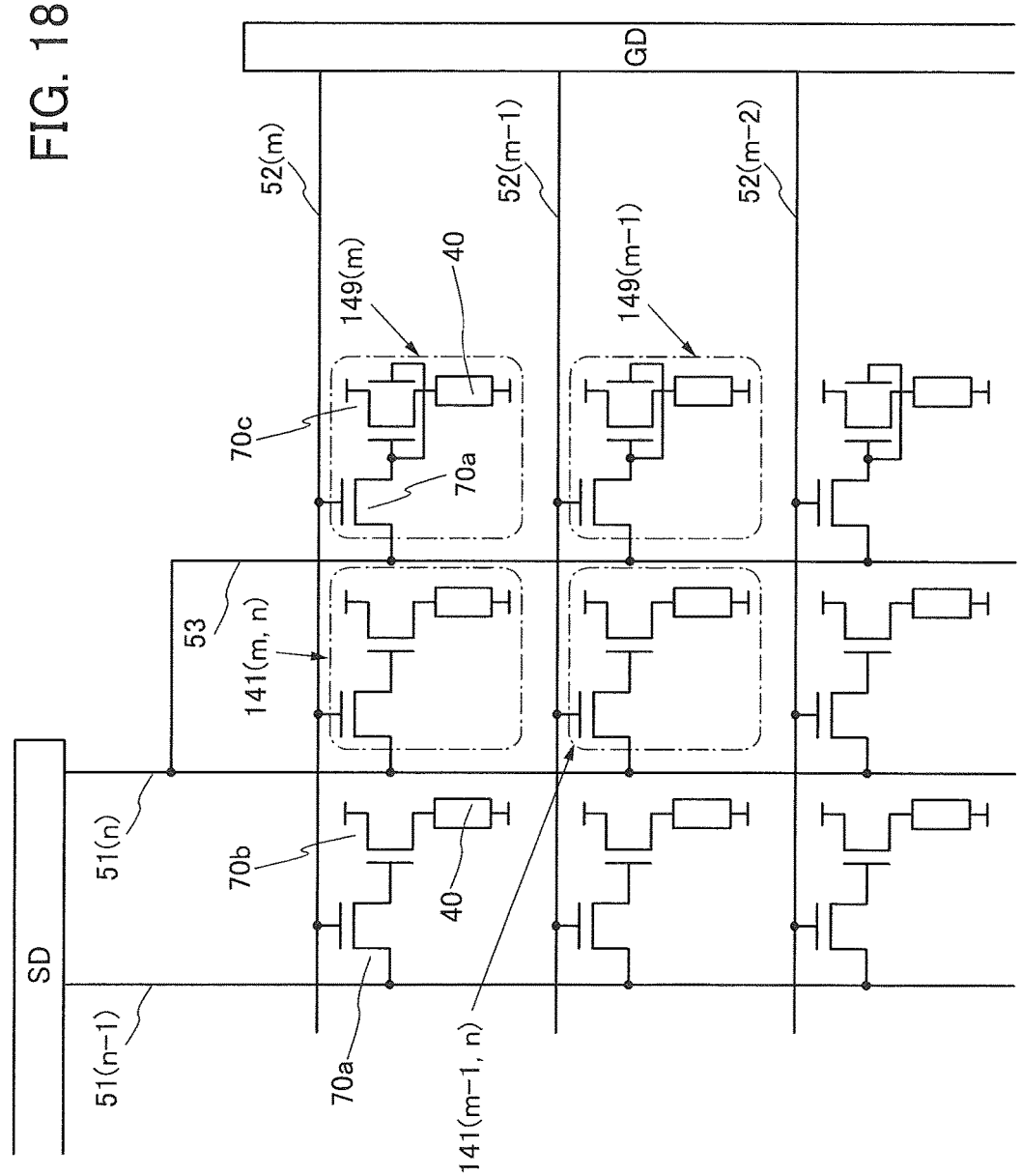

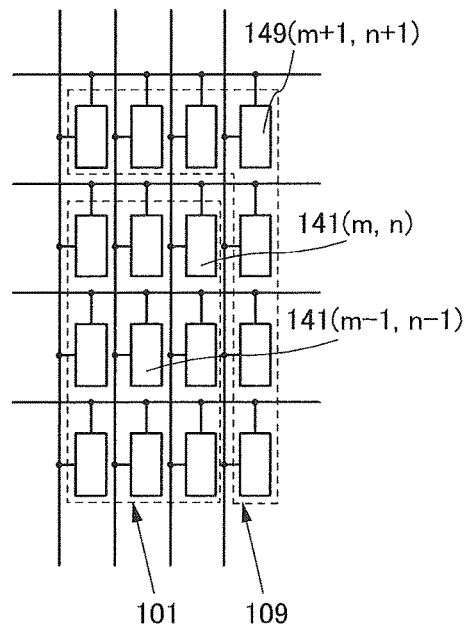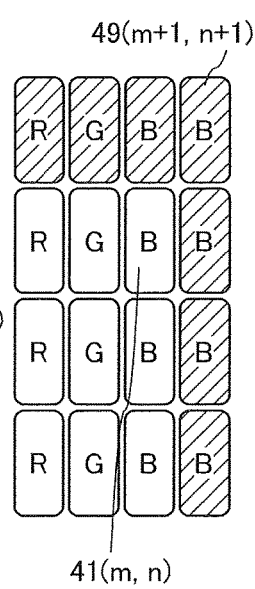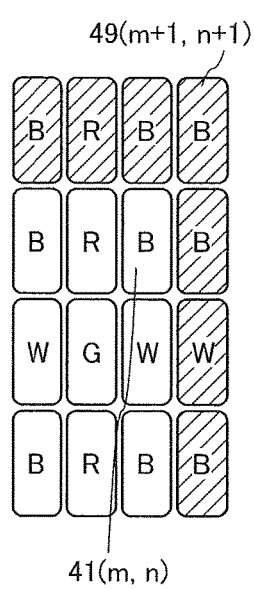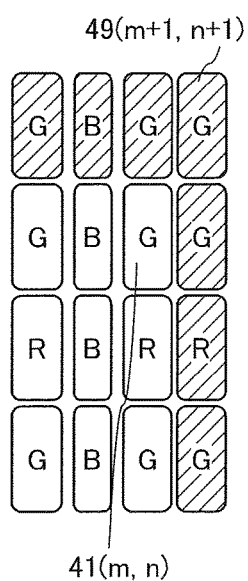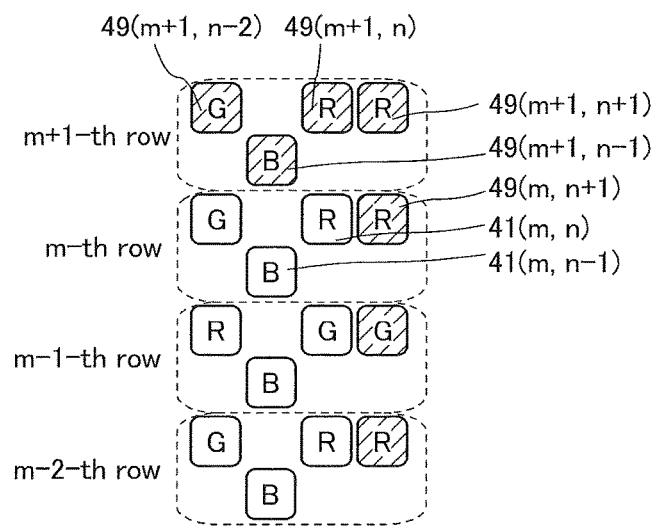

FIG. 23A
FIG. 23B
FIG. 23C
FIG. 23D
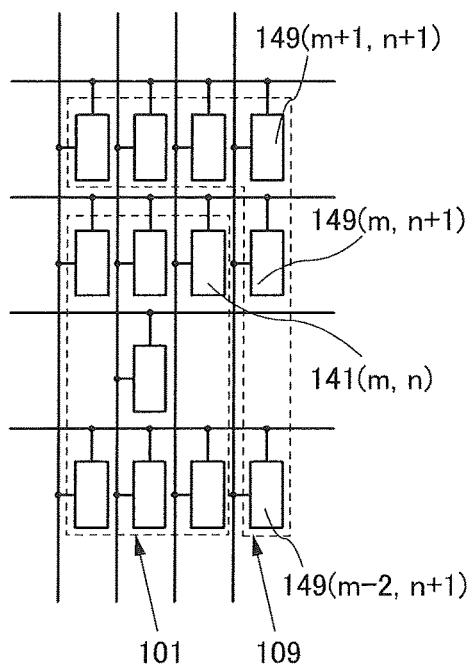
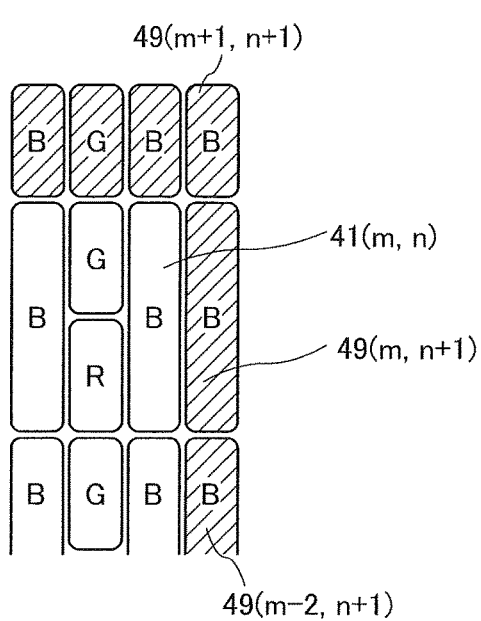
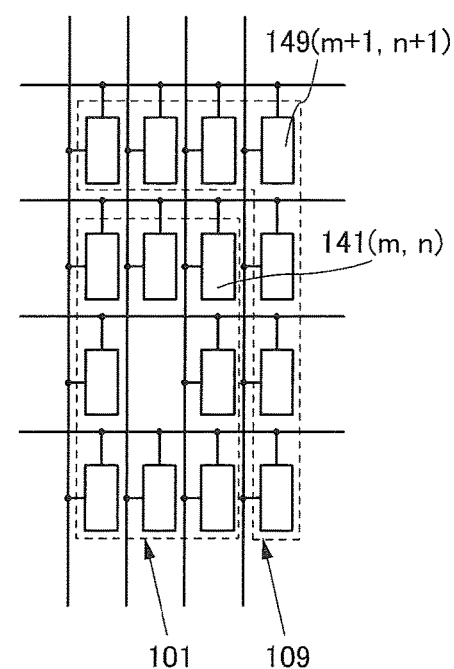
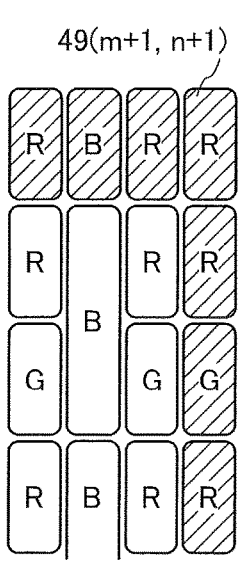

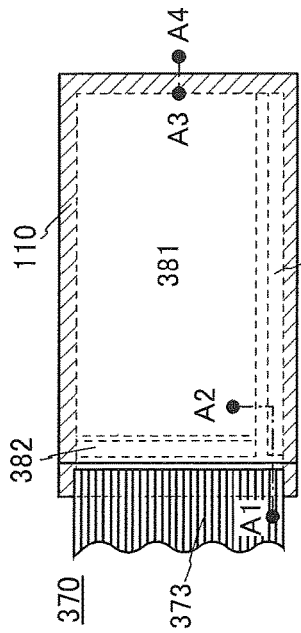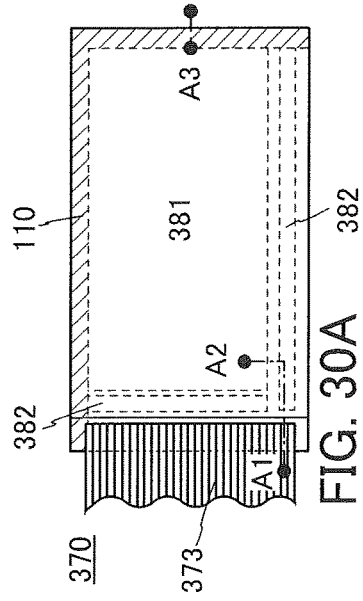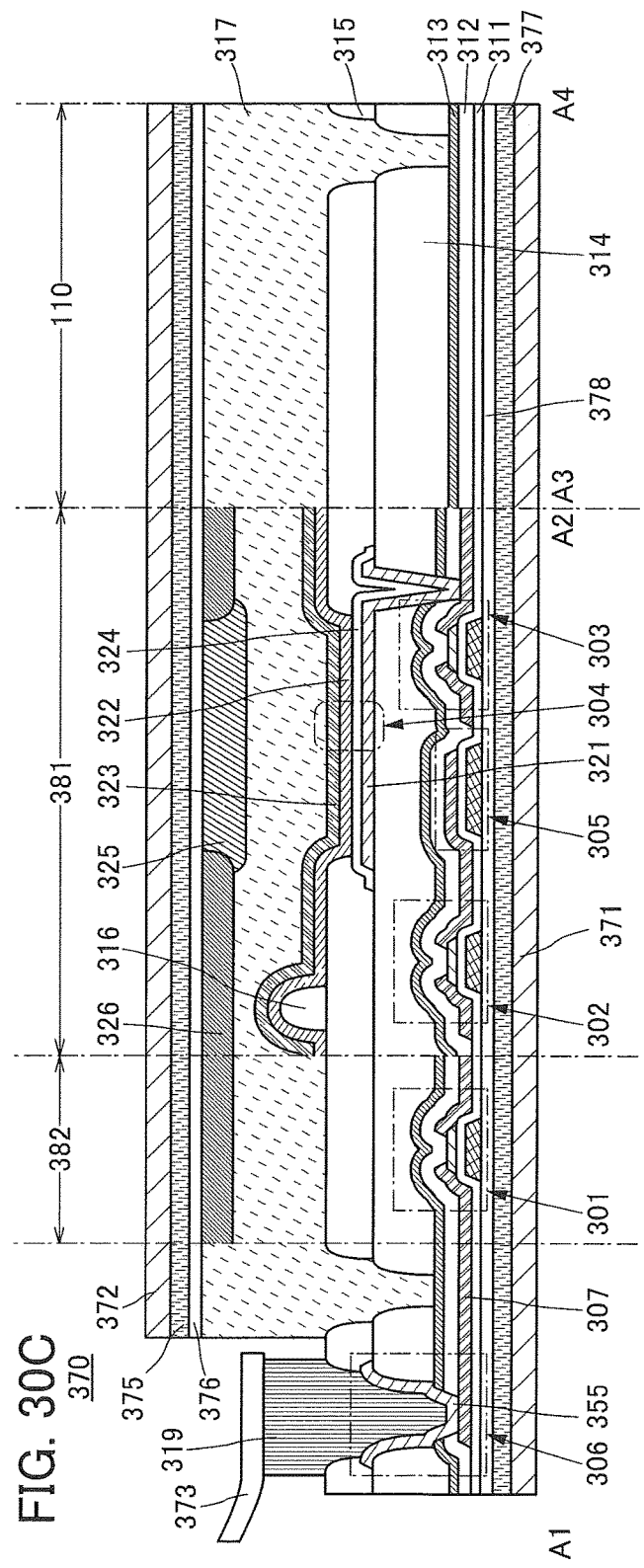
FIG. 30A
FIG. 30B
FIG. 30C

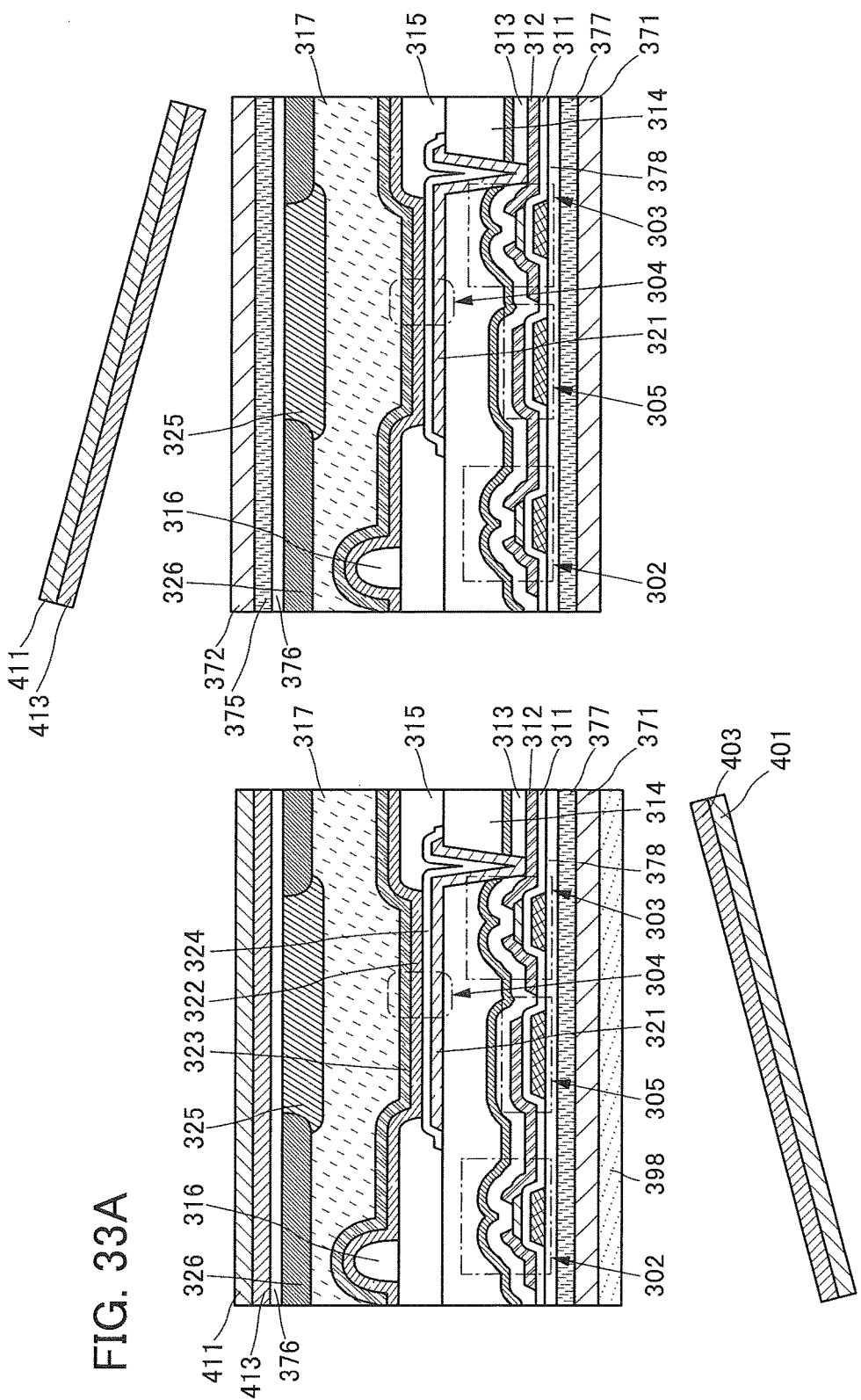

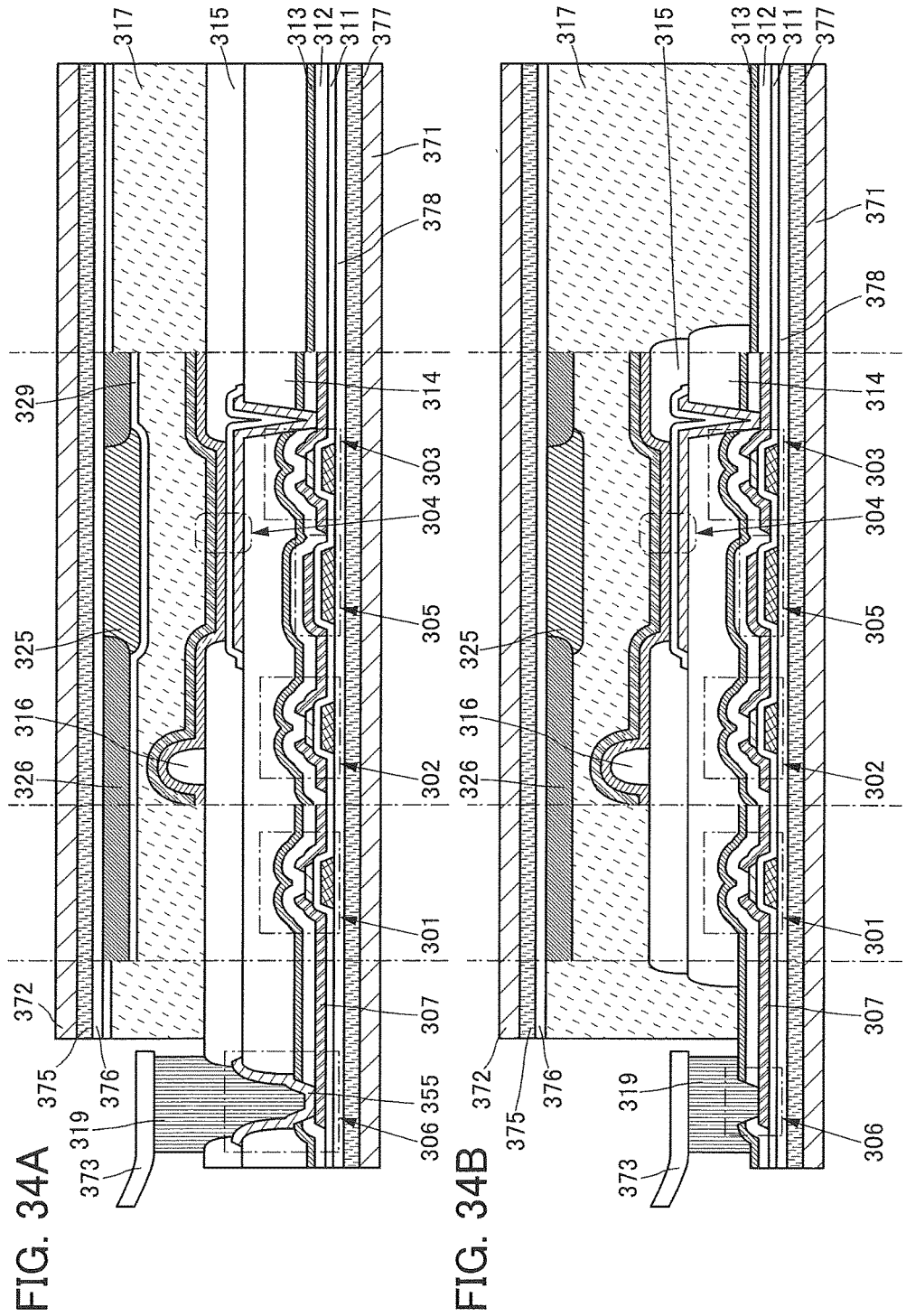

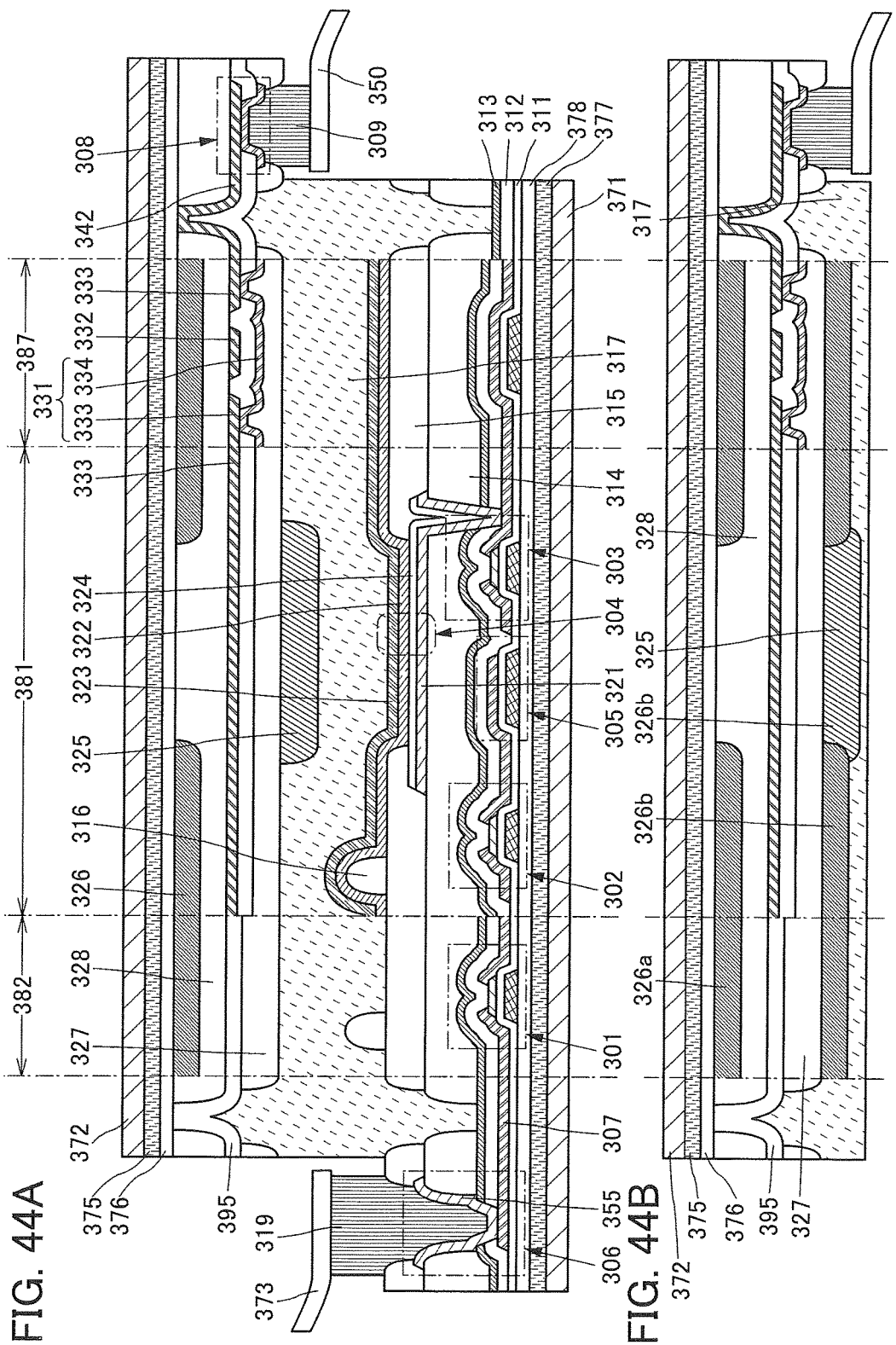

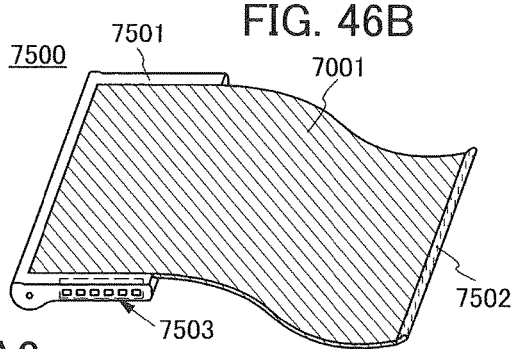
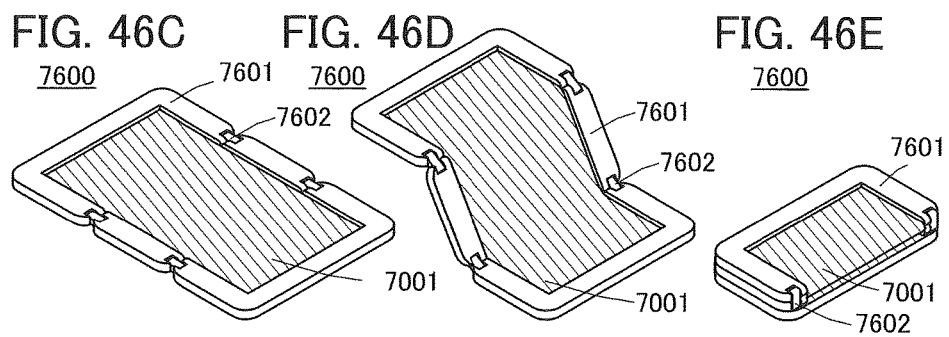
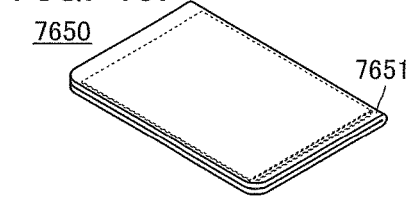
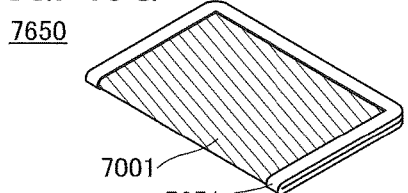
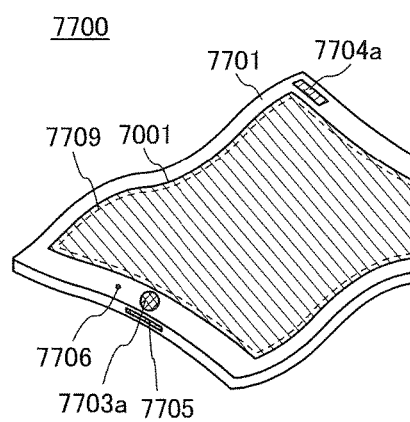
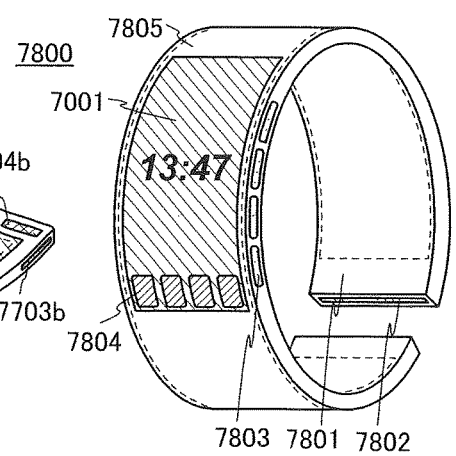

DISPLAY DEVICE AND ELECTRONIC DEVICE

TECHNICAL FIELD

One embodiment of the present invention relates to a display device including a plurality of display panels.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input-output device (e.g., a touch panel), a driving method thereof, and a manufacturing method thereof.

BACKGROUND ART

In recent years, larger display devices have been demanded. Large display devices can be used for a television device for home use (also referred to as a TV or a television receiver), digital signage, and a public information display (HD), for example. A larger display region of a display device can provide more information at a time. In addition, a larger display region attracts more attention, so that the effectiveness of the advertisement is expected to be increased, for example.

Light-emitting elements utilizing electroluminescence (also referred to as EL elements) have features such as ease of thinning and lightening, high-speed response to an input signal, and driving with a direct-current low voltage source; thus, application of the EL elements to display devices has been proposed. For example, Patent Document 1 discloses a flexible light-emitting device including an organic EL element.

REFERENCE

Patent Document

[Patent Document 1] Japanese Published Patent Application No. 2014-197522

DISCLOSURE OF INVENTION

An object of one embodiment of the present invention is to increase the size of a display device. Another object of one embodiment of the present invention is to provide a display device including a wide display region in which a joint is hardly recognized. Another object of one embodiment of the present invention is to provide a highly browsable display device. Another object of one embodiment of the present invention is to reduce the thickness or weight of a display device. Another object of one embodiment of the present invention is to provide a display device that can display images along a curved surface. Another object of one embodiment of the present invention is to provide a display device with high reliability.

Note that the descriptions of these objects do not preclude the existence of other objects. In one embodiment of the present invention, there is no need to achieve all the objects. Other objects can be derived from the description of the specification, the drawings, and the claims.

A display device of one embodiment of the present invention includes a first display panel and a second display panel. The first display panel includes a first display region and a region that transmits visible light. The second display panel includes a second display region, a third display region, and a region that blocks visible light. The first display region is adjacent to the region that transmits visible light. The third display region is positioned between the second display region and the region that blocks visible light and is adjacent to the second display region and the region that blocks visible light. The second display region overlaps with, on a display surface side, the region that transmits visible light. The region that blocks visible light overlaps with the first display region. At least one of the first display region and the region that transmits visible light overlaps with the third display region. The second display region includes a plurality of pixels arranged in m rows and n columns (m and n separately represent an integer of greater than or equal to 2). The third display region includes a plurality of pixels arranged in a column direction. The third display region is adjacent to the pixel in the n-th column in the second display region. A gate signal and a source signal supplied to the pixel in the i-th row (i represents an integer of greater than or equal to 1 and less than or equal to m) in the third display region are the same as a gate signal and a source signal supplied to the pixel in the i-th row and the n-th column in the second display region.

In the above structure, it is preferable that the pixel in the i-th row and the n-th column in the second display region include a first light-emitting element and a first driving transistor and the pixel in the i-th row in the third display region include a second light-emitting element and a second driving transistor. A source or a drain of the first driving transistor is electrically connected to the first light-emitting element. A source or a drain of the second driving transistor is electrically connected to the second light-emitting element.

The area of the second light-emitting element is preferably larger than the area of the first light-emitting element. At this time, the W/L ratio between a channel length (L) and a channel width (W) of the second driving transistor is preferably larger than the W/L ratio of the first driving transistor.

It is preferable that the first driving transistor be a single-gate transistor and the second driving transistor be a dual-gate transistor.

It is preferable that the second display panel include a plurality of source lines, and the source lines in the n+1-th and subsequent columns be connected to the source line in the n-th column.

Alternatively, in the above structure, it is preferable that the pixel in the i-th row and the n-th column in the second display region include a first light-emitting element, a first driving transistor, and a selection transistor, the pixel in the i-th row in the third display region include a second light-emitting element and a second driving transistor, a source or a drain of the first driving transistor be electrically connected to the first light-emitting element, a source or a drain of the second driving transistor be electrically connected to the second light-emitting element, and a source or a drain of the selection transistor be electrically connected to a gate of the first driving transistor and a gate of the second driving transistor.

Alternatively, in the above structure, it is preferable that the pixel in the i-th row and the n-th column in the second display region include a first light-emitting element, a first driving transistor, and a selection transistor, the pixel in the i-th row in the third display region include a second light-emitting element, a source or a drain of the first driving transistor be electrically connected to a pixel electrode of the first light-emitting element and a pixel electrode of the second light-emitting element, and a source or a drain of the selection transistor be electrically connected to a gate of the first driving transistor.

It is preferable that the pixel in the i-th row in the third display region have the same color as the pixel in the i-th row and the n-th column in the second display region.

Furthermore, it is preferable that the third display region include a plurality of pixels arranged in a row direction, the third display region be adjacent to the pixel in the m-th row in the second display region, and a gate signal and a source signal supplied to the pixel in the j-th column (j represents an integer of greater than or equal to 1 and less than or equal to n) in the third display region be the same as a gate signal and a source signal supplied to the pixel in the m-th row and the j-th column in the second display region.

In the above structure, it is preferable that the pixel in the m-th row and the j-th column in the second display region include a third light-emitting element and a third driving transistor and the pixel in the j-th column in the third display region include a fourth light-emitting element and a fourth driving transistor. A source or a drain of the third driving transistor is electrically connected to the third light-emitting element. A source or a drain of the fourth driving transistor is electrically connected to the fourth light-emitting element.

The area of the fourth light-emitting element is preferably larger than the area of the third light-emitting element. At this time, the W/L ratio of the fourth driving transistor is preferably larger than the W/L ratio of the third driving transistor.

It is preferable that the third driving transistor be a single-gate transistor and the fourth driving transistor be a dual-gate transistor.

It is preferable that the second display panel include a plurality of gate lines, and the gate lines in the m+1-th and subsequent rows be connected to the gate line in the m-th row.

Alternatively, in the above structure, it is preferable that the pixel in the m-th row and the j-th column in the second display region include a third light-emitting element, a third driving transistor, and a selection transistor, the pixel in the j-th column in the third display region include a fourth light-emitting element and a fourth driving transistor, a source or a drain of the third driving transistor be electrically connected to the third light-emitting element, a source or a drain of the fourth driving transistor be electrically connected to the fourth light-emitting element, and a source or a drain of the selection transistor be electrically connected to a gate of the third driving transistor and a gate of the fourth driving transistor.

Alternatively, in the above structure, it is preferable that the pixel in the m-th row and the j-th column in the second display region include a third light-emitting element, a selection transistor, and a third driving transistor, the pixel in the j-th column in the third display region include a fourth light-emitting element, a source or a drain of the third driving transistor be electrically connected to a pixel electrode of the third light-emitting element and a pixel electrode of the fourth light-emitting element, and a source or a drain of the selection transistor be electrically connected to a gate of the third driving transistor.

It is preferable that the pixel in the j-th column in the third display region have the same color as the pixel in the m-th row and the j-th column in the second display region.

It is preferable that the second display region and the third display region include m+x rows and n+y columns of pixels in total (x and y separately represent an integer of greater than or equal to 1), and a gate signal and a source signal supplied to each of the pixels in the m+1-th and subsequent rows and the n+1-th and subsequent columns be the same as a gate signal and a source signal supplied to the pixel in the m-th row and the n-th column.

The area of the light-emitting element included in the pixel in the m+1-th row and the n+1-th column is preferably larger than the area of the light-emitting element included in the pixel in the m-th row and the n-th column. At this time, the W/L ratio of the driving transistor included in the pixel in the m+1-th row and the n+1-th column is preferably larger than the W/L ratio of the driving transistor included in the pixel in the m-th row and the n-th column.

It is preferable that the driving transistor included in the pixel in the m-th row and the n-th column be a single-gate transistor and the driving transistor included in the pixel in the m+1-th row and the n+1-th column be a dual-gate transistor.

It is preferable that the pixels in the m+1-th and subsequent rows and the n+1-th and subsequent columns have the same color as the pixel in the m-th row and the n-th column.

A display device of one embodiment of the present invention includes a first display panel and a second display panel. The first display panel includes a first display region and a region that transmits visible light. The second display panel includes a second display region and a region that blocks visible light. The first display region is adjacent to the region that transmits visible light. The second display region is adjacent to the region that blocks visible light. The second display region overlaps with, on a display surface side, the region that transmits visible light. The region that blocks visible light overlaps with the first display region. The second display region includes a plurality of pixels arranged in m rows and n columns (m and n separately represent an integer of greater than or equal to 2). The region that blocks visible light is adjacent to the pixel in the n-th column. The pixel in the i-th row and the n−1-th column includes a first light-emitting element and a first driving transistor. The pixel in the i-th row and the n-th column includes a second light-emitting element and a second driving transistor. A source or a drain of the first driving transistor is electrically connected to the first light-emitting element. A source or a drain of the second driving transistor is electrically connected to the second light-emitting element. The area of the second light-emitting element is larger than the area of the first light-emitting element.

It is preferable that the W/L ratio of the second driving transistor be larger than the W/L ratio of the first driving transistor.

It is preferable that the first driving transistor be a single-gate transistor and the second driving transistor be a dual-gate transistor.

It is preferable that the region that blocks visible light be adjacent to the pixel in the m-th row in the second display region and the area of the light-emitting element included in the pixel in the m-th row and the j-th column (j is an integer of greater than or equal to 1 and less than or equal to n) be larger than the area of the light-emitting element included in the pixel in the m−1-th row and the j-th column.

The W/L ratio of the driving transistor included in the pixel in the m-th row and the j-th column is preferably larger than the W/L ratio of the driving transistor included in the pixel in the m−1-th row and the j-th column.

It is preferable that the driving transistor included in the pixel in the m−1-th row and the j-th column be a single-gate transistor and the driving transistor included in the pixel in the m-th row and the j-th column be a dual-gate transistor.

One embodiment of the present invention is an electronic device including any of the above display devices and at least one of an antenna, a battery, a housing, a camera, a speaker, a microphone, and an operation button.

One embodiment of the present invention can increase the size of a display device. One embodiment of the present invention can provide a display device including a wide display region in which a joint is hardly recognized. One embodiment of the present invention can provide a highly browsable display device. One embodiment of the present invention can reduce the thickness or weight of a display device. One embodiment of the present invention can provide a display device that can display images along a curved surface. One embodiment of the present invention can provide a display device with high reliability.

Note that the description of these effects does not preclude the existence of other effects. One embodiment of the present invention does not necessarily have all the effects listed above. Other effects can be derived from the description of the specification, the drawings, and the claims.

BRIEF DESCRIPTION OF DRAWINGS

FIG. 18 is a circuit diagram illustrating an example of connection between pixels and driver circuits.

FIGS. 22A to 22E illustrate pixel arrangement and layouts of display regions of display elements.

FIGS. 23A to 23D illustrate pixel arrangement and layouts of display regions of display elements.

FIGS. 30A to 30C are top views and a cross-sectional view illustrating examples of a display panel.

FIGS. 33A and 33B are cross-sectional views illustrating an example of a method for manufacturing a display panel.

FIGS. 34A and 34B are cross-sectional views each illustrating an example of a display panel.

FIGS. 44A and 44B are cross-sectional views each illustrating an example of a touch panel.

FIGS. 46A1, 46A2, and 46B to 46I illustrate examples of electronic devices.

BEST MODE FOR CARRYING OUT THE INVENTION

Figure 1A:
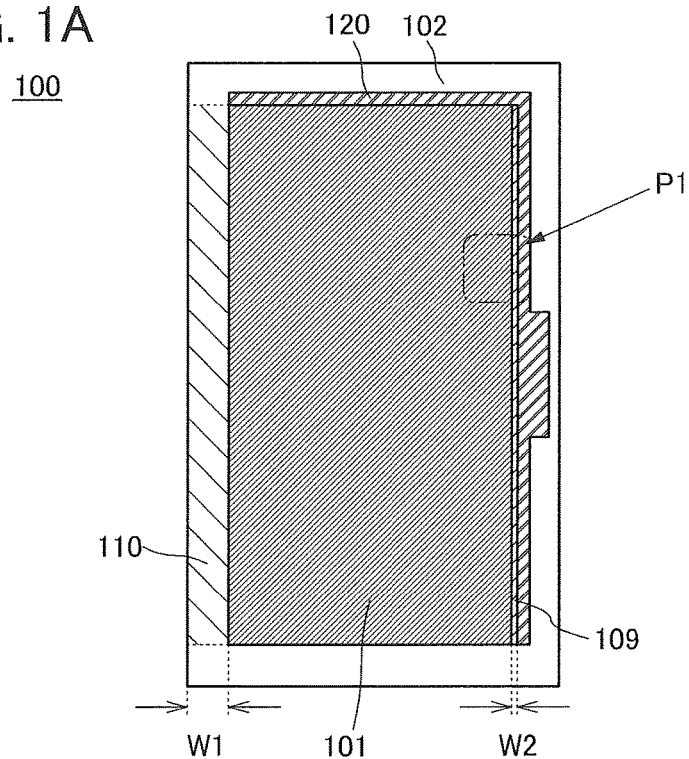
FIGS. 1A to 1C are top views illustrating examples of a display panel.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated.

Furthermore, the same hatching pattern is applied to portions having similar functions, and the portions are not denoted by particular reference numerals in some cases.

In addition, the position, size, range, or the like of each structure illustrated in drawings is not accurately represented in some cases for easy understanding. Therefore, the disclosed invention is not necessarily limited to the position, the size, the range, or the like disclosed in the drawings.

Note that the terms "film" and "layer" can be interchanged with each other depending on the case or circumstances. For example, the term "conductive layer" can be changed into the term "conductive", and the term "insulating film" can be changed into the term "insulating layer".

Embodiment 1

In this embodiment, display devices of embodiments of the present invention will be described with reference to FIGS. 1A to 1C, FIGS. 2A and 2B, FIGS. 3A and 3B, FIGS. 4A to 4C, FIGS. 5A and 5B, FIGS. 6A to 6C, FIGS. 7A and 7B, FIGS. 8A and 8B, FIGS. 9A to 9C, FIGS. 10A and 10B, FIG. 11, FIG. 12, FIG. 13, FIG. 14, FIG. 15, FIGS. 16A to 16D, FIG. 17, FIG. 18, FIGS. 19A to 19D, FIGS. 20A and 20B, FIGS. 21A and 21B, FIGS. 22A to 22E, FIGS. 23A to 23D, FIGS. 24A and 24B, FIGS. 25A to 25C, FIG. 26A to 26E, and FIG. 27A to 27D.

When a plurality of display panels are arranged in one or more directions (e.g., in one column or in matrix), a display device with a large display region can be manufactured.

In the case where a large display device is manufactured using a plurality of display panels, each of the display panels is not required to be large. Thus, an apparatus for manufacturing the display panel does not need to be increased in size, whereby space-saving can be achieved. Furthermore, since an apparatus for manufacturing small- and medium-sized display panels can be used and a novel apparatus for manufacturing large display devices is unnecessary, manufacturing cost can be reduced. In addition, a decrease in yield caused by an increase in the size of a display panel can be suppressed.

A display device including a plurality of display panels has a larger display region than a display device including one display panel when the display panels have the same size, and has an effect of displaying more information at a time, for example.

However, in the case where output images of the plurality of display panels are displayed as one image, a user of the display device sees the image as divided because each of the display panels has a non-display region that surrounds a display region.

Making the non-display regions of the display panels small (using display panels with narrow frames) can prevent an image on the display panels from appearing divided; however, it is difficult to totally remove the non-display region of the display panel.

A small non-display region of the display panel leads to a decrease in the distance between an edge of the display panel and an element in the display panel, in which case the element easily deteriorates by impurities entering from outside the display panel in some cases.

Thus, in one embodiment of the present invention, a plurality of display panels are arranged to partly overlap with one another. In two display panels overlapping with each other, at least a display panel positioned on the display surface side (upper side) includes a region that transmits visible light and a display region adjacent to each other. In one embodiment of the present invention, a display region of a display panel positioned on a lower side and the region that transmits visible light of the display panel on the upper side overlap with each other. Thus, a non-display region that appears between the display regions of the two display panels overlapping with each other can be reduced or even removed. Accordingly, a large display device in which a joint between display panels is hardly recognized by a user can be obtained.

At least part of a non-display region of the display panel on the upper side transmits visible light, and can overlap with the display region of the display panel on the lower side. Furthermore, at least part of a non-display region of the display panel on the lower side can overlap with the display region of the display panel on the upper side or a region that blocks visible light thereof. It is not necessary to reduce the areas of the non-display regions because a reduction in the area of the frame of the display device (a reduction in area except a display region) is not affected by these regions.

A large non-display region of the display panel leads to an increase in the distance between the edge of the display panel and an element in the display panel, in which case the deterioration of the element due to impurities entering from outside the display panel can be suppressed. For example, in the case where an organic EL element is used as a display element, impurities such as moisture or oxygen are less likely to enter (or less likely to reach) the organic EL element from outside the display panel as the distance between the edge of the display panel and the organic EL element increases. Since a sufficient area of the non-display region of the display panel can be secured in the display device of one embodiment of the present invention, a highly reliable large display device can be fabricated even when a display panel including an organic EL element or the like is used.

Here, after two display panels are positioned to overlap with each other, shifts of the relative positions of the two display panels might occur. When the density of pixels provided in the display region of the display panel is high, high alignment accuracy is required and thus, in overlapping the two display panels with each other, the display panels are easily shifted from the predetermined positions.

When the relative positions of the two display panels are shifted in a direction such that the two display panels are moved away from each other, the non-display region of the display panel positioned on the lower side and the region that transmits visible light of the display panel on the upper side overlap with each other. That is, in the display device, a non-display region is formed between the display regions of the two display panels. For example, a driver circuit, a wiring, or the like in the vicinity of the display region is easily recognized by a user of the display device. As a result, in the case where output images of the two display panels are displayed as one image, the user sees the one image as divided.

In view of the above, in one embodiment of the present invention, extra pixels (also referred to as dummy pixels) are provided between a display region and a region that blocks visible light in the display panel on the lower side. The dummy pixel has the same color as the pixel that is the closest to the dummy pixel in the display region. The gate signal and the source signal supplied to the dummy pixel are the same as the gate signal and the source signal supplied to the pixel that is the closest to the dummy pixel in the display region. When the two display panels are shifted in a direction such that they are moved away from each other, the dummy pixels of the display panel positioned on the lower side and the region that transmits visible light of the display panel on the upper side overlap with each other. By performing display using these dummy pixels, even when the two display panels are misaligned in the direction such that they are moved away from each other, a non-display region can be prevented from being formed between display regions of the two overlapping display panels in the display device. Accordingly, a large display device in which a joint between display panels is hardly recognized by a user can be obtained.

Alternatively, in the display panel on the lower side in one embodiment of the present invention, the area of a display element of a pixel that is adjacent to a region that blocks visible light (which can be regarded as the area of a display region of the display element) is made larger than the area of a display element of other pixels. When the two display panels are shifted in a direction such that they are moved away from each other, the area where the pixel that is adjacent to the region that blocks visible light of the display panel positioned on the lower side and the region that transmits visible light of the display panel on the upper side overlap with each other increases. Even when the display panels are misaligned, a non-display region can be prevented from being formed between display regions of the two overlapping display panels. Accordingly, a large display device in which a joint between display panels is hardly recognized by a user can be obtained.

Specific examples of a display panel and a display device of embodiments of the present invention will be described below.

Structure Example A

FIG. 1A is a top view of a display panel 100.

The display panel 100 in FIG. 1A includes a display region 101, a display region 109, and a region 102. Here, the region 102 is a portion other than the display region 101 and the display region 109 of the display panel 100 in a top view. The region 102 can also be referred to as a non-display region.

The region 102 includes the region 110 that transmits visible light and the region 120 that blocks visible light. The region 110 that transmits visible light is adjacent to the display region 101. The display region 109 is adjacent to and positioned between the display region 101 and the region 120 that blocks visible light. The display region 109, the region 110 that transmits visible light, and the region 120 that blocks visible light can each be provided along part of the outer edge of the display region 101.

In the display panel 100 illustrated in FIG. 1A, the display region 109 is provided along one side of the display region 101. In the display panel 100, the display region 109 can be provided along one or more sides of the display region 101.

In the display panel 100 illustrated in FIG. 1A, the region 110 that transmits visible light is provided along one side of the display region 101. In the display panel 100, the region 110 that transmits visible light can be provided along one or more sides of the display region 101. The region 110 that transmits visible light is preferably in contact with the display region 101 and provided so as to extend to an end portion of the display panel 100 as in FIG. 1A.

The region 110 that transmits visible light is provided along one of the two opposite sides of the display region 101, while the display region 109 is provided along the other.

In the display panel 100 in FIG. 1A, the region 120 that blocks visible light is provided along two sides of the display region 101. In the display panel 100, the region 120 that blocks visible light can be extended close to an end portion of the display panel 100.

Note that in each of the regions 102 illustrated in FIG. 1A, a region other than the region 110 that transmits visible light and the region 120 that blocks visible light does not necessarily have visible light transmittance.

The display region 101 includes a plurality of pixels arranged in a matrix and can display an image. One or more display elements are provided in each pixel. As the display element, a light-emitting element such as an EL element, an electrophoretic element, a display element using micro electro mechanical systems (MEMS), a liquid crystal element, or the like can be used, for example. In this embodiment, an EL element is mainly used.

The display region 109 includes a plurality of pixels arranged in one or more directions and can display an image. One or more display elements are provided in each pixel. A display element similar to that used in the display region 101 can be used in the display region 109. Note that it can be said that the display region 109 includes a dummy pixel.

A material that transmits visible light is used for the region 110 that transmits visible light. The region 110 that transmits visible light includes, for example, a substrate, a bonding layer, and the like that are included in the display panel 100. The transmittance of the region 110 that transmits visible light with respect to visible light is preferably higher because extraction efficiency of light from the display panel under the region 110 that transmits visible light can be increased. The region 110 that transmits visible light preferably has a light transmittance of higher than or equal to 70%, further preferably higher than or equal to 80%, and still further preferably higher than or equal to 90% on average at a wavelength longer than or equal to 450 nm and shorter than or equal to 700 nm.

In the region 120 that blocks visible light, for example, a wiring electrically connected to the pixels (specifically, transistors, display elements, or the like) included in the display region 101 is provided. In addition to such a wiring, driver circuits (e.g., a scan line driver circuit or a signal line driver circuit) for driving the pixels can be provided.

The display panel can include at least one of the scan line driver circuit and the signal line driver circuit. Alternatively, the display panel may include neither the scan line driver circuit nor the signal line driver circuit. For example, an integrated circuit (IC) serving as at least one of the scan line driver circuit and the signal line driver circuit can be electrically connected to the display panel. A display device that includes the display panel and the IC can be manufactured. The IC can be mounted on the display panel by a chip on glass (COG) method or a chip on film (COF) method. A flexible printed circuit (hereinafter FPC), a tape automated bonding (TAB) tape, a tape carrier package (TCP), or the like on which the IC is mounted can alternatively be used for the display device.

The region 120 that blocks visible light includes a terminal electrically connected to an FPC or the like (also referred to as a connection terminal), a wiring electrically connected to the terminal, and the like. Note that in the case where the terminal, wiring, and the like transmit visible light, the terminal, wiring, and the like can be provided to extend to the region 110 that transmits visible light.

Here, a width $W_1$ of the region 110 that transmits visible light illustrated in FIG. 1A is preferably greater than or equal to 0.1 mm and less than or equal to 150 mm, further preferably greater than or equal to 0.5 mm and less than or equal to 100 mm, and still further preferably greater than or equal to 1 mm and less than or equal to 50 mm. In the case where the width $W_1$ of the region 110 that transmits visible light varies depending on the display panel, or in the case where the width varies depending on the position of the same display panel, the shortest length is preferably within the above range. The region 110 that transmits visible light serves as a sealing region. As the width $W_1$ of the region 110 that transmits visible light is larger, the distance between the edge of the display panel 100 and the display region 101 can become longer, in which case entry of an impurity such as water from the outside into the display region 101 can be suppressed. Note that the width $W_1$ of the region 110 that transmits visible light corresponds to the shortest distance between the display region 101 and the edge of the display panel 100 in some cases.

In the case where an organic EL element is used as the display element, for example, the width $W_1$ of the region 110 that transmits visible light is set to be greater than or equal to 0.5 mm, whereby deterioration of the organic EL element can be effectively suppressed, which leads to an improvement in reliability. Note that also in a portion other than the region 110 that transmits visible light, the distance between the edge of the display region 101 and the edge of the display panel 100 is preferably in the above range.

A width $W_2$ of the display region 109 illustrated in FIG. 1A is preferably greater than or equal to 0.1 mm and less than or equal to 5 mm, further preferably greater than or equal to 0.5 mm and less than or equal to 5 mm, and still further preferably greater than or equal to 1 mm and less than or equal to 5 mm. The width $W_2$ of the display region 109 is preferably larger because the acceptable range of misalignment in overlapping the two display panels can be wider. Note that when the width of one pixel is greater than 5 mm, the width $W_2$ of the display region 109 can also be greater than 5 mm.

In the case where the width $W_2$ of the display region 109 varies depending on the display panel, or in the case where the width varies depending on the position of the same display panel, the shortest length can be referred to as the width $W_2$.

Figure 1B:
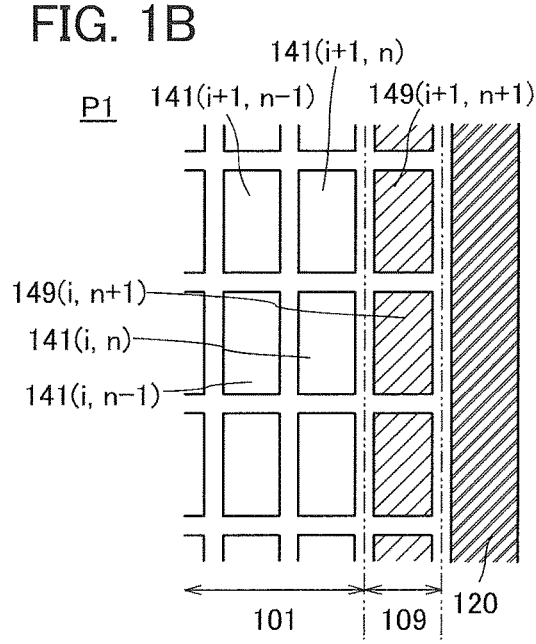
Figure 1C:
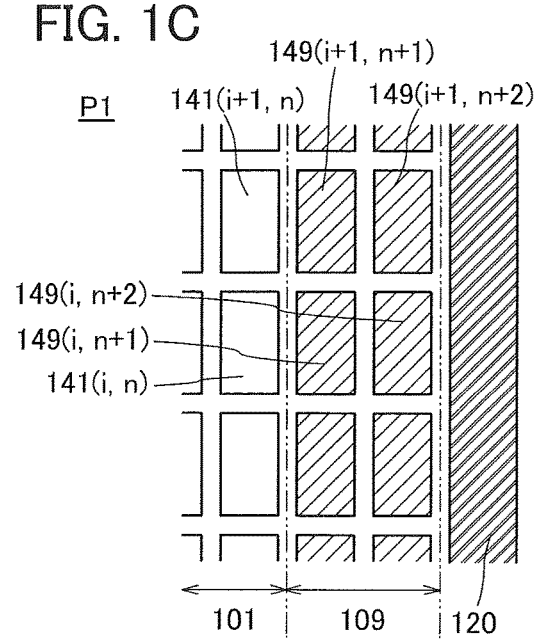

FIGS. 1B and 1C each show an example of an enlarged view of a region P1 in FIG. 1A.

As illustrated in FIGS. 1B and 1C, in the display region 101, a plurality of pixels 141 are arranged in matrix. In the case where the display panel 100 capable of full color display with three colors of red, green, and blue is formed, each of the pixels 141 corresponds to a sub-pixel capable of displaying any of the three colors. In addition to the above three colors, a sub-pixel of white, yellow, or the like can also be provided.

In this embodiment, an example is described in which the display region 101 includes the pixels 141 arranged in m rows and n columns (m and n separately represent an integer of 2 or more). The display region 109 includes a pixel 149. Note that the pixel in the a-th row and the b-th column is denoted with a reference numeral followed by (a, b).

In the description of this embodiment, the horizontal direction in a drawing is the row direction and the vertical direction is the column direction; however, one embodiment of the present invention is not limited thereto and the row direction and the column direction can be replaced with each other. In one embodiment of the present invention, any of the signal line direction and the scan line direction may be regarded as the row direction. The present invention is not limited by the description in which the bottom row is the first row and the leftmost column is the first column, either; the top row can be the first row or the rightmost column can be the first column.

In FIGS. 1B and 1C, the pixels 149 are arranged in the column direction to be adjacent to the pixels 141 in the n-th column (i.e., the pixels 141 in the endmost column in the display region 101). The pixels 149 can be provided in one or more columns. FIG. 1B illustrates an example in which the pixels 149 are provided in one column. FIG. 1C illustrates an example in which the pixels 149 are provided in two columns.

The pixels 149 are preferably provided in a plurality of rows or a plurality of columns because the acceptable range of misalignment in overlapping the two display panels can be widened.

In FIG. 1B, the pixel 141(i, n−1) is located on the left of the pixel 141(i, n) (i is an integer of greater than or equal to 1 and less than or equal to m), and the pixel 149(i, n+1) is located on the right of the pixel 141(i, n). In a similar manner, the pixel 141(i+1, n−1) is located on the left of the pixel 141(i+1, n) and the pixel 149(i+1, n+1) is located on the right of the pixel 141(i+1, n).

In FIG. 1C, the pixel 149(i, n+1) is located on the right of the pixel 141(i, n), and the pixel 149(i, n+2) is located on the right of the pixel 149(i, n+1). In a similar manner, the pixel 149(i+1, n+1) is located on the right of the pixel 141(i+1, n), and the pixel 149(i+1, n+2) is located on the right of the pixel 149(i+1, n+1).

The pixel 149 in the i-th row has the same color as the pixel 141 in the i-th row and the n-th column. Furthermore, a gate signal and a source signal supplied to the pixel 149 in the i-th row are the same as those supplied to the pixel 141 in the i-th row and the n-th column. Accordingly, the pixel 149 in the i-th row and the pixel 141 in the i-th row and the n-th column output light of the same color at the same timing and at the same level of luminance. As a result, even when the overlapping two display panels are misaligned, an image can be prevented from appearing divided at the boundary between the two display panels. For example, in FIG. 1B, the pixel 149(i, n+1) has the same color as the pixel 141(i, n). Furthermore, a gate signal and a source signal supplied to the pixel 149(i, n+1) are the same as those supplied to the pixel 141(i, n). In FIG. 1C, the pixel 149(i, n+1) and the pixel 149(i, n+2) have the same color as the pixel 141(i, n). A gate signal and a source signal supplied to the pixel 149(i, n+1) and the pixel 149(i, n+2) are the same as those supplied to the pixel 141(i, n).

Figure 2A:
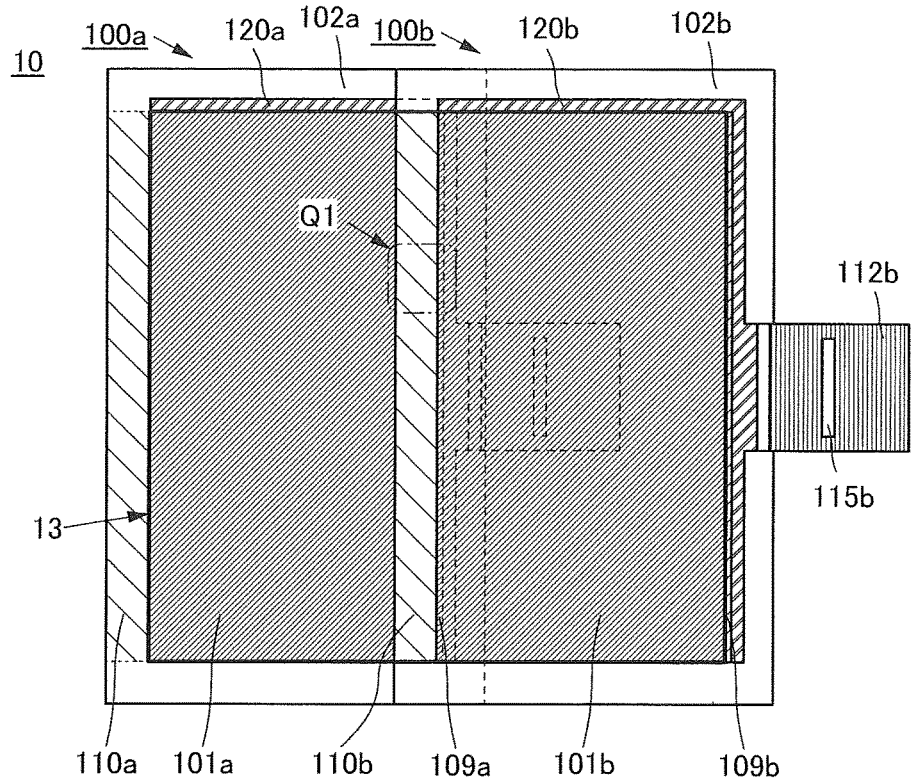
FIGS. 2A and 2B are top views illustrating an example of a display device.

FIG. 2A is a top view of a display device 10. The display device of one embodiment of the present invention includes a plurality of display panels arranged in one or more directions. The display device 10 illustrated in FIG. 2A includes two display panels 100 illustrated in FIG. 1A. Specifically, the display device 10 includes a display panel 100a and a display panel 100b.

In this embodiment, to distinguish the display panels from each other, the same components included in the display panels from each other, or the same components relating to the display panels from each other, letters are added to reference numerals. Unless otherwise specified, "a" is added to reference numerals for a display panel and components placed on the lowest side (the side opposite to the display surface side), and to one or more display panels and components placed thereover, "b", "c", and the like are added in alphabetical order from the lower side.

The display device 10 is an example in which an FPC 112b is connected to the display panel 100b. An IC 115b is electrically connected to the display panel 100b through the FPC 112*b*. In a similar manner, an IC is electrically connected to the display panel 100*a* through an FPC.

The display panel 100*a* includes a display region 101*a*, a display region 109*a*, and a region 102*a*. The region 102*a* includes a region 120*a* that blocks visible light. The region 102*a* may include a region 110*a* that transmits visible light. For example, in the case where another display panel is provided under the display panel 100*a*, the region 102*a* preferably includes the region 110*a* that transmits visible light.

The display panel 100*b* includes a display region 101*b* and a region 102*b*. The region 102*b* includes a region 110*b* that transmits visible light and a region 120*b* that blocks visible light. The display panel 100*b* may include a display region 109*b*. For example, in the case where another display panel is provided over the display panel 100*b*, the display panel 100*b* preferably includes the display region 109*b*.

The display panel 100*b* is placed so as to partly overlap with an upper side (display surface side) of the display panel 100*a*. Specifically, the region 110*b* that transmits visible light of the display panel 100*b* is provided to overlap with the display region 101*a* of the display panel 100*a*. The region 120*b* that blocks visible light of the display panel 100*b* is provided so as not to overlap with the display region 101*a* of the display panel 100*a*. The display region 101*b* of the display panel 100*b* is provided to overlap with the region 120*a* that blocks visible light of the display panel 100*a*.

The region 110*b* that transmits visible light is provided to overlap with the display region 101*a*; thus, a user of the display device 10 can see the entire image on the display region 101*a* even when the display panel 100*b* overlaps with a display surface of the display panel 100*a*.

The display region 101*b* of the display panel 100*b* overlaps with upper sides of the region 120*a* that blocks visible light; as a result, a non-display region does not exist between the display region 101*a* and the display region 101*b*. Thus, a region where the display region 101*a* and the display region 101*b* are placed seamlessly can serve as a display region 13 of the display device 10.

Figure 2B:
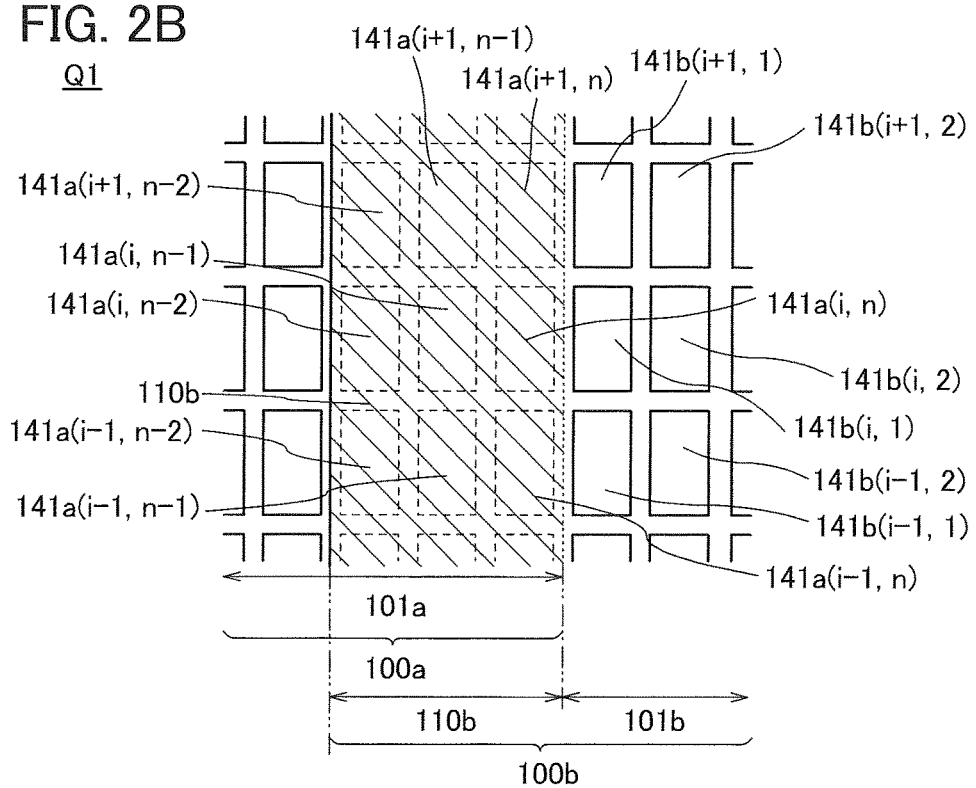

FIG. 2B shows an example of an enlarged view of a region Q1 in FIG. 2A.

FIG. 2B shows, as an example, the case where the region 110*b* that transmits visible light overlaps with pixels 141*a* in the n−2-th column, the n−1-th column, and the n-th column of the display panel 100*a*.

In FIG. 2B, the pixels 141*a* in the n-th column (the column closest to the display panel 100*b*) of the display panel 100*a* are adjacent to pixels 141*b* in the first column (the column closest to the display panel 100*a*) of the display panel 100*b*. In other words, FIG. 2B illustrates an ideal state where the display panel 100*a* and the display panel 100*b* overlap with each other without misalignment.

When the display panel 100*a* and the display panel 100*b* overlap with each other as illustrated in FIGS. 2A and 2B, a user of the display device 10 does not see a region that blocks visible light in the vicinity of the boundary between the two display panels. Accordingly, a seam between the display panels is hardly recognized by the user.

Figure 3A:
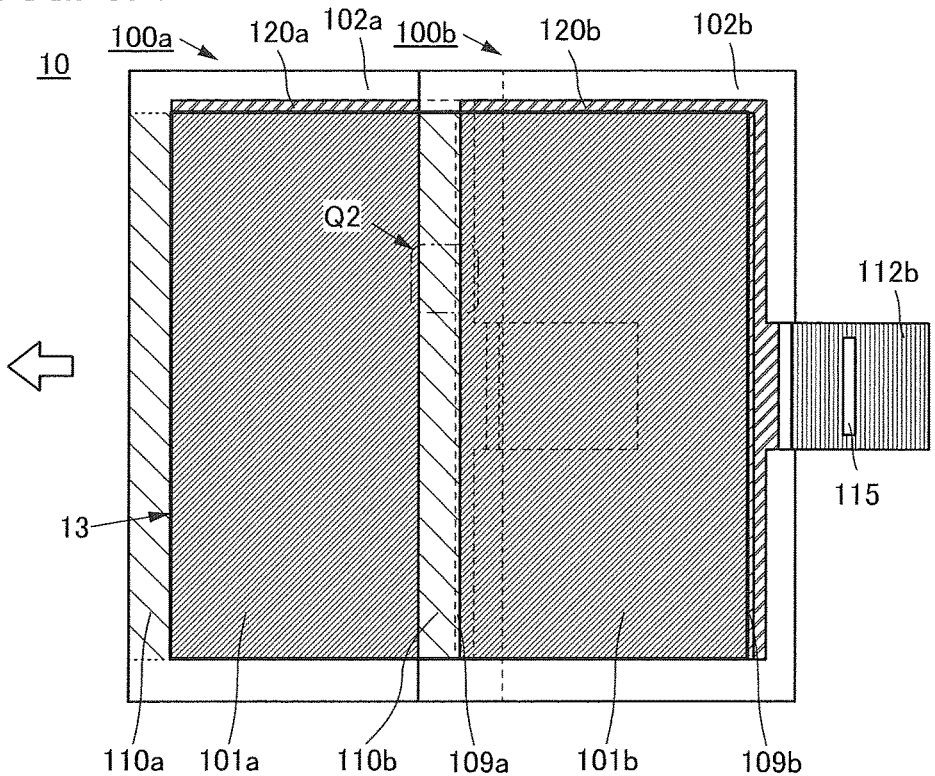
FIGS. 3A and 3B are top views illustrating an example of a display device.
Figure 3B:
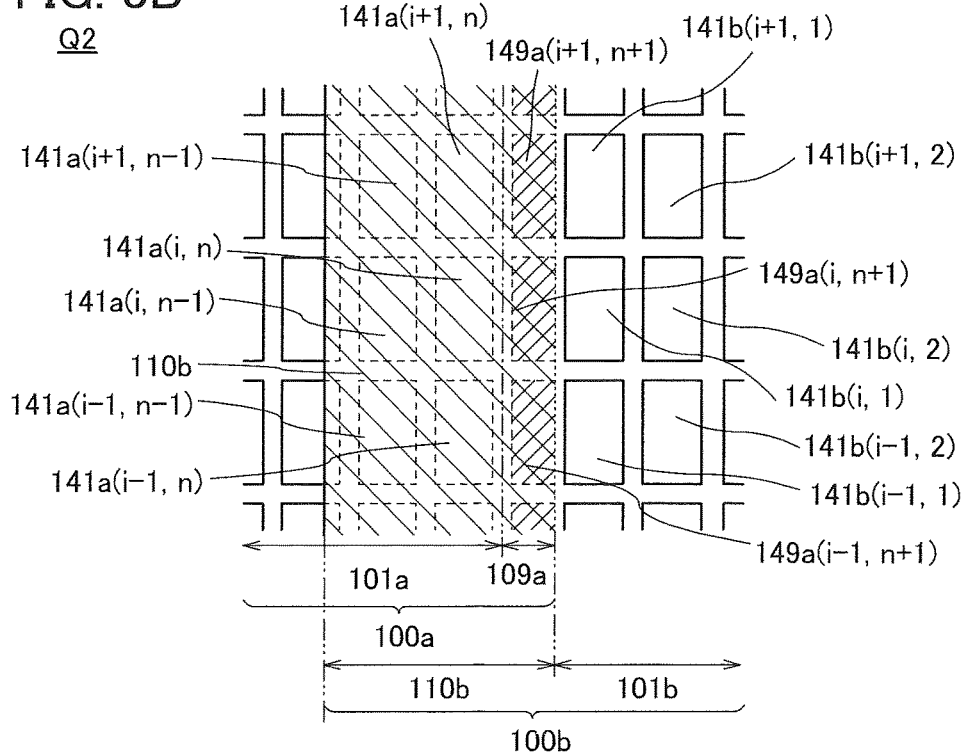

Next, FIG. 3A shows a top view of the display device 10 in the case where the display panel 100*a* in the state illustrated in FIG. 2A is shifted in a direction such that the display panel 100*a* is moved away from the display panel 100*b*. FIG. 3B shows an example of an enlarged view of a region Q2 in FIG. 3A.

In FIG. 3A, the region 110*b* that transmits visible light of the display panel 100*b* overlaps with the display region 101*a* and the display region 109*a* of the display panel 100*a*.

As described above, the display panel 100*a* includes the display region 109*a* between the display region 101*a* and the region 120*a* that blocks visible light. Accordingly, when the display panel 100*a* is shifted in a direction such that the display panel 100*a* is moved away from the display panel 100*b*, the region 110*b* that transmits visible light can be prevented from overlapping with the region 120*a* that blocks visible light. In other words, a user is less likely to recognize the seam between the display panels.

In FIG. 3B, part of a pixel 149*a* is positioned between the pixel 141*a* in the n-th column and the pixel 141*b* in the first column, which are adjacent to each other in FIG. 2B. For example, the pixel 149(*i*, *n*+1) is positioned between the pixel 141*a*(*i*, *n*) and the pixel 141*b*(*i*, 1).

When the display panel 100*a* and the display panel 100*b* overlap with each other as illustrated in FIGS. 3A and 3B, a user of the display device 10 can see at least part of the display region 109*a* in the vicinity of the boundary between the two display panels.

As described above, the pixel 149*a* in the i-th row has the same color as the pixel 141*a* in the i-th row and the n-th column. Furthermore, a gate signal and a source signal supplied to the pixel 149*a* in the i-th row are the same as those supplied to the pixel 141*a* in the i-th row and the n-th column. Accordingly, the pixel 149*a* in the i-th row and the pixel 141*a* in the i-th row and the n-th column output light of the same color at the same timing and at the same level of luminance. As a result, it is possible to prevent an image from appearing divided at the boundary between the display region 101*a* and the display region 101*b* because of misalignment of the display panels.

Structure Example B

Figure 4A:
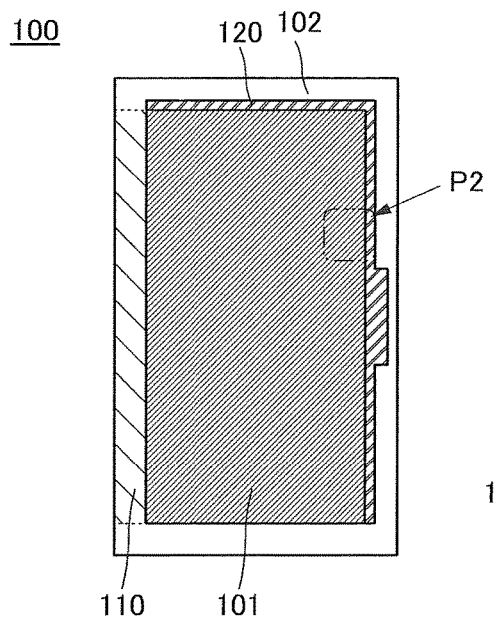
FIGS. 4A to 4C are top views illustrating an example of a display panel and a display device.

FIG. 4A is a top view illustrating the display panel 100 that is different from that in FIG. 1A. The display panel 100 in FIG. 4A is different from that in FIG. 1A in that it does not include the display region 109. Note that the descriptions of the portions similar to those in FIG. 1A are omitted.

The display panel 100 includes the display region 101 and the region 102.

The region 102 includes the region 110 that transmits visible light and the region 120 that blocks visible light. The region 110 that transmits visible light and the region 120 that blocks visible light are each adjacent to the display region 101.

Figure 4B:
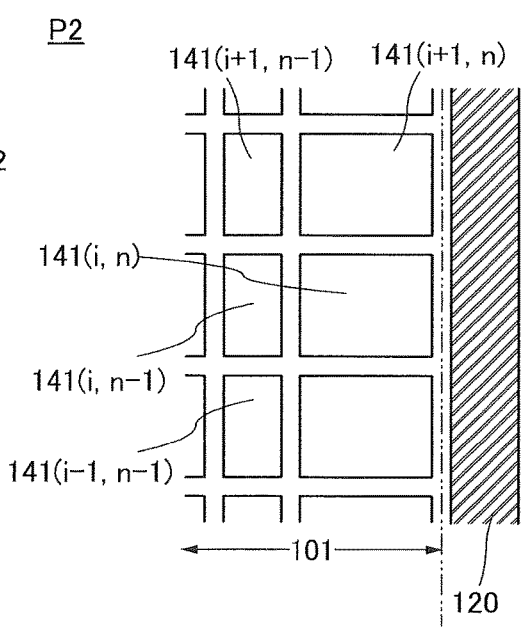

FIG. 4B shows an example of an enlarged view of a region P2 in FIG. 4A.

In FIG. 4B, the area of the pixel 141 in the n-th column is larger than that of the pixel 141 in the n−1-th column. For example, the area of the pixel 141(*i*, *n*) is larger than that of the pixel 141(*i*, *n*−1).

In one embodiment of the present invention, the area of the display element included in the pixel 141 in the n-th column is made larger than that of the display element included in the pixel 141 in the n−1-th column. The area of the display element included in the pixel 141 in the n-th column is preferably larger because the acceptable range of misalignment in overlapping two display panels can be wider.

Here, in the case where the pixel includes a light-emitting element as the display element, the pixel can include a driving transistor that controls a current flowing in the light-emitting element. A source or a drain of the driving transistor is connected to the light-emitting element.

In FIG. 4B, the potential that is supplied to the gate of the driving transistor included in each of the pixels 141 in the n-th column is preferably higher than the potential supplied to the gate of the driving transistor included in each of the pixels 141 in the n−1-th column. In that case, a difference in brightness per unit area between the pixels 141 in the n−1-th column and the pixels 141 in the n-th column can be reduced.

Alternatively, in FIG. 4B, it is preferable that a higher current can flow in the driving transistor included in each of the pixels 141 in the n-th column than in the driving transistor included in each of the pixels 141 in the n−1-th column. In that case, a difference in brightness per unit area between the pixels 141 in the n−1-th column and the pixels 141 in the n-th column can be reduced. For example, a dual-gate transistor can be used as a transistor in which a higher current desirably flows, while single-gate transistors are used as the other transistors. For example, a W/L ratio between the channel length (L) and the channel width (W) of a transistor in which a higher current desirably flows can be made larger than the W/L ratio of the other transistors.

In the case where the two display panels 100a and 100b overlap with each other, the area where the pixel 141a in the n-th column of the display panel 100a on the lower side overlaps with the region 110b that transmits visible light of the display panel 100b on the upper side is preferably the same as the area of the pixel 141a in the n−1-th column. At this time, part of the pixel 141a in the n-th column of the display panel 100a overlaps with the display region 101b of the display panel 100b.

Figure 4C:
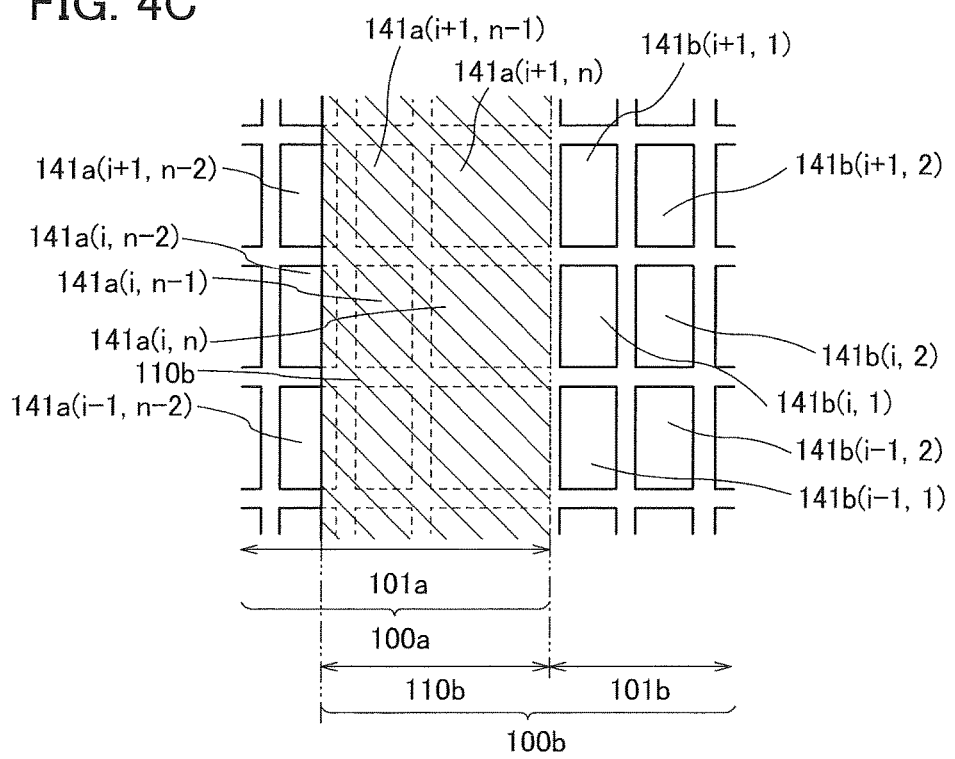

As illustrated in FIG. 4C, the narrower the region where the two display panels overlap with each other, the larger the area where the pixels 141a in the n-th column of the display panel 100a overlap with the region 110b that transmits visible light of the display panel 100b. The display region 101a and the display region 101b can be prevented from being moved away from each other even when the two display panels are shifted in a direction such that they are moved away from each other. As a result, it is possible to prevent an image from appearing divided because of misalignment of the display panels.

Structure Example C

Figure 5A:
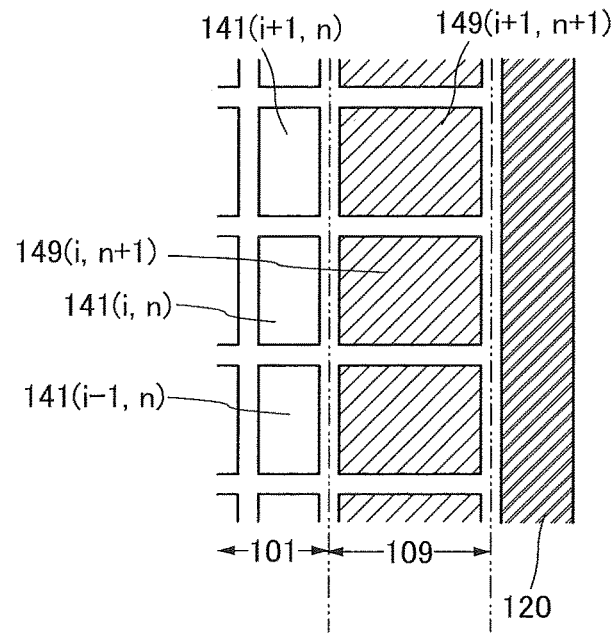
FIGS. 5A and 5B are top views illustrating an example of a display panel and a display device.
Figure 5B:
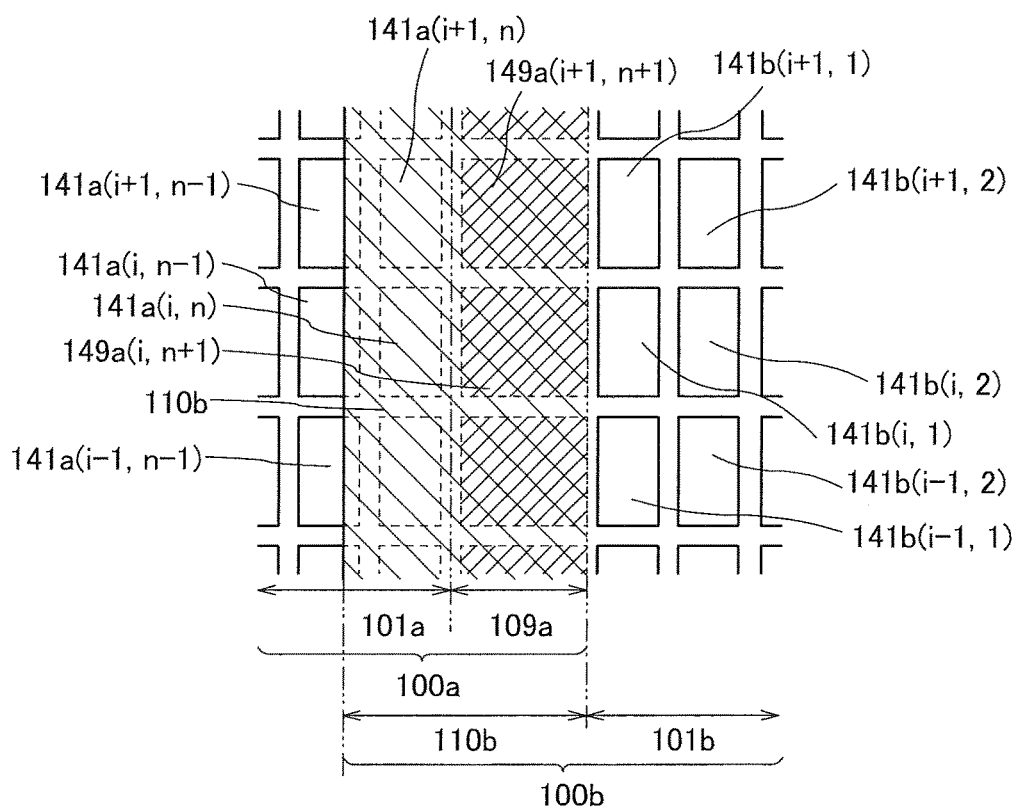

FIG. 5A illustrates a modification example of the enlarged view in FIG. 1B. FIG. 5B illustrates a modification example of the enlarged view in FIG. 3B.

In FIG. 5A, the area of the pixel 149 is larger than that of the pixel 141 in the n-th column. For example, the area of the pixel 149(i, n+1) is larger than that of the pixel 141(i, n).

In one embodiment of the present invention, the area of the display element included in the pixel 149 is made larger than that of the display element included in the pixel 141 in the n-th column. The area of the display element included in the pixel 149 is preferably larger because the acceptable range of misalignment in overlapping two display panels can be wider.

Here, in the case where the pixel includes a light-emitting element as the display element, the potential that is supplied to the gate of the driving transistor included in each of the pixels 149 is preferably higher than the potential supplied to the gate of the driving transistor included in each of the pixels 141 in the n-th column in FIG. 5A. Alternatively, in FIG. 5A, it is preferable that a higher current can flow in the driving transistor included in each of the pixels 149 than in the driving transistor included in each of the pixels 141 in the n-th column. In that case, a difference in brightness per unit area between the pixels 149 and the pixels 141 in the n-th column can be reduced.

As illustrated in FIG. 5B, the narrower the region where the two display panels overlap with each other, the larger the area where the pixel 149a of the display panel 100a overlaps with the region 110b that transmits visible light of the display panel 100b. Display performed in the display region 109a can prevent an image from appearing divided at the boundary between the display region 101a and the display region 101b because of misalignment of the display panels.

Structure Example D

Figure 6A:
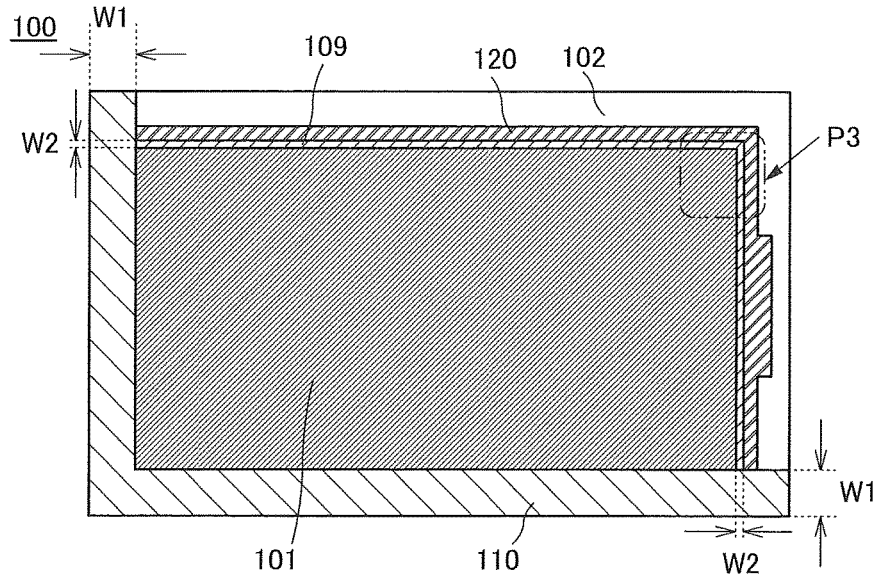
FIGS. 6A to 6C are top views illustrating examples of a display panel.

FIG. 6A is a top view illustrating the display panel 100 that is different from that in FIG. 1A. Note that the descriptions of the portions similar to those in FIG. 1A are omitted.

The display panel 100 illustrated in FIG. 6A includes the display region 101, the display region 109, and the region 102.

The region 102 includes the region 110 that transmits visible light and the region 120 that blocks visible light. The region 110 that transmits visible light is adjacent to the display region 101. The display region 109 is adjacent to and positioned between the display region 101 and the region 120 that blocks visible light.

In the display panel 100 illustrated in FIG. 6A, the display region 109 is provided along two sides of the display region 101. Although FIG. 6A illustrates an example in which the width $W_2$ of the display region 109 is not different between the two sides, the width $W_2$ may be different between the sides.

In the display panel 100 illustrated in FIG. 6A, the region 110 that transmits visible light is provided along two sides of the display region 101. Although FIG. 6A illustrates an example in which the width $W_1$ of the region 110 that transmits visible light is not different between the two sides, the width $W_1$ may be different between the sides.

In the display panel 100 illustrated in FIG. 6A, the region 120 that blocks visible light is provided along two sides of the display region 101.

Figure 6B:
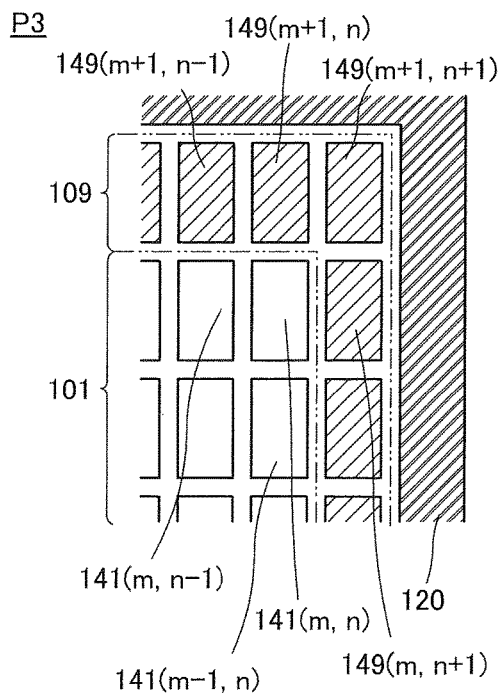
Figure 6C:
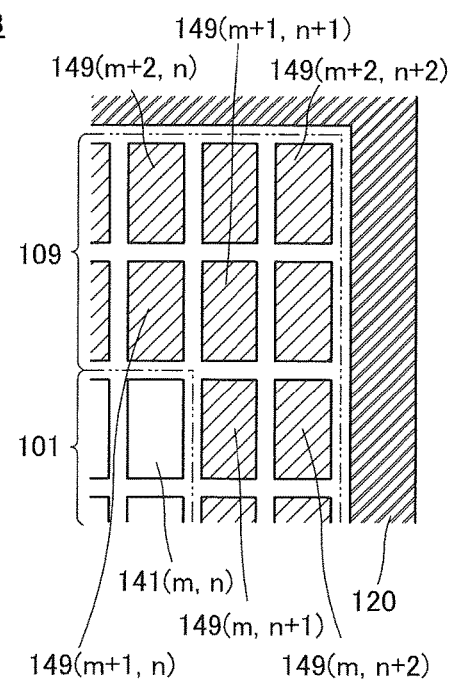

FIGS. 6B and 6C each show an example of an enlarged view of a region P3 in FIG. 6A.

In FIG. 6B, a row of pixels 149 are provided in the row direction to be adjacent to the pixels 141 in the m-th row and a row of pixels 149 are provided in the column direction to be adjacent to the pixels 141 in the n-th column. In FIG. 6B, the pixel 141(m, n−1) is located on the left of the pixel 141(m, n) and the pixel 149(m, n+1) is located on the right of the pixel 141(m, n). Furthermore, the pixel 149(m+1, n) is located above the pixel 141(m, n) and the pixel 141(m−1, n) is located below the pixel 141(m, n).

Furthermore, in FIG. 6B, the pixel 149(m+1, n+1) is provided in the upper right of the pixel 141(m, n). In other words, the display region 101 and the display region 109 include m+1 rows and n+1 columns of pixels in total.

In FIG. 6C, the display region 101 and the display region 109 include m+2 rows and n+2 columns of pixels in total. In FIG. 6C, the pixel 149(m, n+1) is located on the right of the pixel 141(m, n), and the pixel 149(m, n+2) is located on the right of the pixel 149(m, n+1). Furthermore, the pixel 149(m+1, n) is located above the pixel 141(m, n), and the pixel 149(m+2, n) is located above the pixel 149(m+1, n). In FIG. 6C, the pixel 149(m+1, n+1) is located in the upper right of the pixel 141(m, n), and the pixel 149(m+2, n+2) is located in the upper right of the pixel 149(m+1, n+1).

Note that the number of the pixels 149 arranged in the row direction and the number of the pixels 149 arranged in the column direction may be different from each other. In the case where the width is different between the pixels 141 arranged in the row direction and those arranged in the column direction, it is preferable that the number of the pixels 149 in the direction of the short side of the pixel 141 be larger than that of the pixels 149 in the direction of the long side of the pixel 141.

The pixel 149 in the i-th row (i is an integer of greater than or equal to 1 and less than or equal to m) has the same color as the pixel 141 in the i-th row and the n-th column. A gate signal and a source signal supplied to the pixel 149 in the i-th row are the same as those supplied to the pixel 141 in the i-th row and the n-th column. Accordingly, the pixel 149 in the i-th row and the pixel 141 in the i-th row and the n-th column output light of the same color at the same timing and at the same level of luminance.

The pixel 149 in the j-th column (j is an integer of greater than or equal to 1 and less than or equal to n) has the same color as the pixel 141 in the m-th row and the j-th column. A gate signal and a source signal supplied to the pixel 149 in the j-th column are the same as those supplied to the pixel 141 in the m-th row and the j-th column. Accordingly, the pixel 149 in the j-th column and the pixel 141 in the m-th row and the j-th column output light of the same color at the same timing and at the same level of luminance.

The pixels 149 in the m+1-th and subsequent rows and the n+1-th and subsequent columns have the same color as the pixel 141(m, n). A gate signal and a source signal supplied to the pixels 149 in the m+1-th and subsequent rows and the n+1-th and subsequent columns are the same as those supplied to the pixel 141(m, n). Accordingly, the pixels 149 in the m+1-th and subsequent rows and the n+1-th and subsequent columns and the pixel 141(m, n) output light of the same color at the same timing and at the same level of luminance.

As a result, even when the two display panels that overlap with each other in the row direction or the column direction are misaligned, an image can be prevented from appearing divided at the boundary between the two display panels.

For example, in FIG. 6B, the pixel 149(m+1, n−1) has the same color as the pixel 141(m, n−1). Furthermore, a gate signal and a source signal supplied to the pixel 149(m+1, n−1) are the same as those supplied to the pixel 141(m, n−1). In FIG. 6C, the pixel 149(m+1, n) and the pixel 149(m+2, n) have the same color as the pixel 141(m, n). A gate signal and a source signal supplied to the pixel 149(m+1, n) and the pixel 149(m+2, n) are the same as those supplied to the pixel 141(m, n).

Figure 7A:
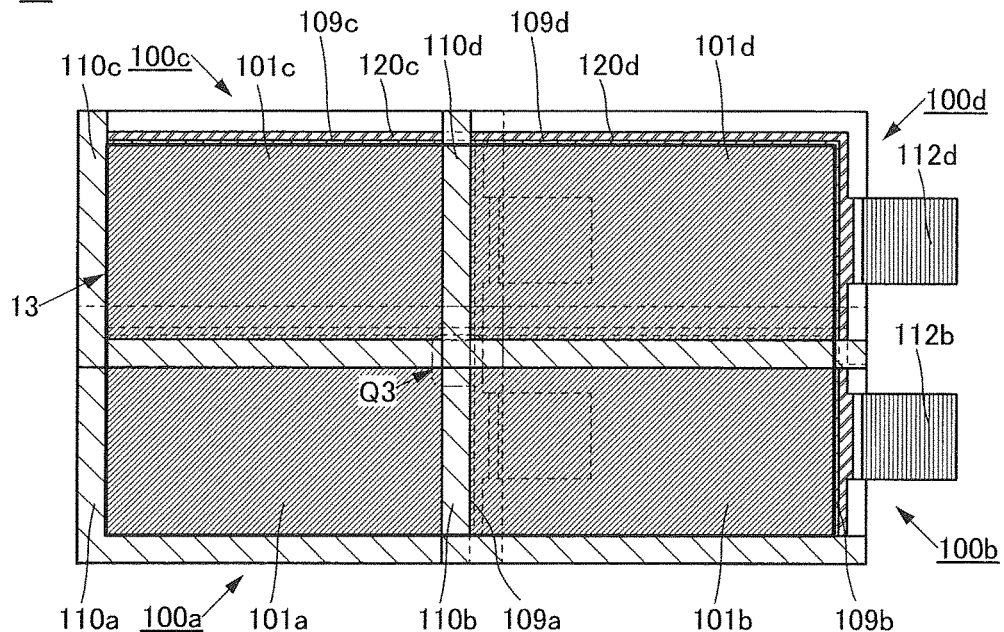
FIGS. 7A and 7B are top views illustrating an example of a display device.

FIG. 7A illustrates the display device 10 that includes four display panels 100 illustrated in FIG. 6A. Specifically, the display device 10 includes the display panel 100a, the display panel 100b, a display panel 100c, and a display panel 100d.

In FIG. 7A, short sides of the display panels 100a and 100b overlap with each other such that part of the display region 101a and part of the region 110b that transmits visible light overlap with each other. Furthermore, long sides of the display panels 100a and 100c overlap with each other such that part of the display region 101a and part of a region 110c that transmits visible light overlap with each other.

In FIG. 7A, part of the display region 101b overlaps with part of the region 110c that transmits visible light and part of a region 110d that transmits visible light. In addition, part of a display region 101c overlaps with part of the region 110d that transmits visible light.

Thus, as illustrated in FIG. 7A, a region where the display regions 101a to 101d are placed seamlessly can serve as the display region 13 of the display device 10.

Figure 7B:
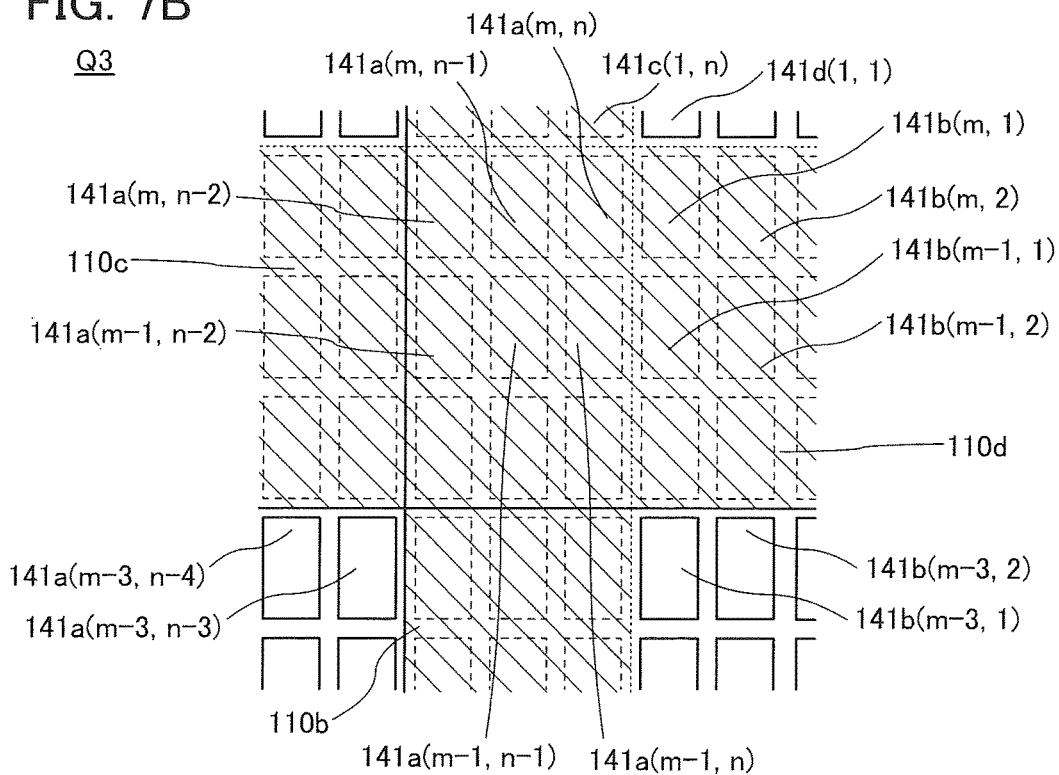

FIG. 7B shows an example of an enlarged view of a region Q3 in FIG. 7A.

FIG. 7B shows an example in which the regions 110b and 110d that transmit visible light overlap with the pixels 141a in the n−2-th column, the n−1-th column, and the n-th column of the display panel 100a, and the regions 110c and 110d that transmit visible light overlap with the pixels 141a in the m−2-th column, the m−1-th column, and the m-th column of the display panel 100a.

In FIG. 7B, the pixels 141a in the n-th column (the column closest to the display panel 100b) of the display panel 100a are adjacent to the pixels 141b in the first column (the column closest to the display panel 100a) of the display panel 100b. The pixels 141a in the m-th row (the row closest to the display panel 100c) of the display panel 100a are adjacent to pixels 141c in the first row (the row closest to the display panel 100a) of the display panel 100c. The pixels 141c in the n-th column (the column closest to the display panel 100d) of the display panel 100c are adjacent to pixels 141d in the first column (the column closest to the display panel 100c) of the display panel 100d. The pixels 141b in the m-th row (the row closest to the display panel 100d) of the display panel 100b are adjacent to the pixels 141d in the first row (the row closest to the display panel 100b) of the display panel 100d. In other words, FIG. 7B illustrates an ideal state where the four display panels 100 overlap with each other without misalignment.

When the four display panels overlap with each other as illustrated in FIGS. 7A and 7B, a user of the display device 10 does not see a region that blocks visible light in the vicinity of the boundary between the two display panels. Accordingly, a seam between the display panels is hardly recognized by the user.

Figure 8A:
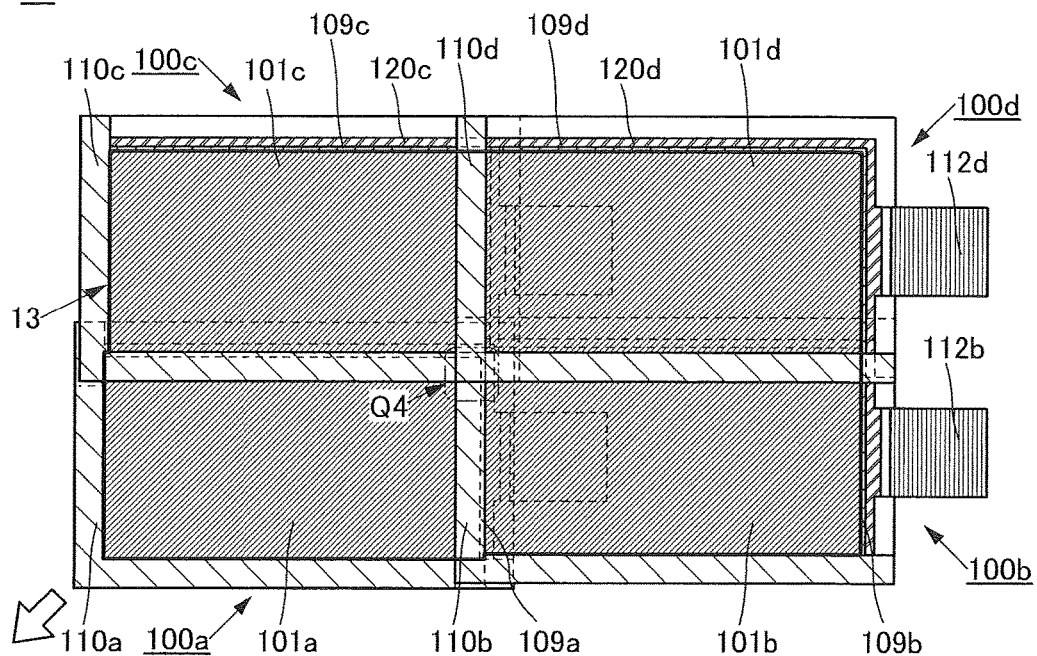
FIGS. 8A and 8B are top views illustrating an example of a display device.
Figure 8B:
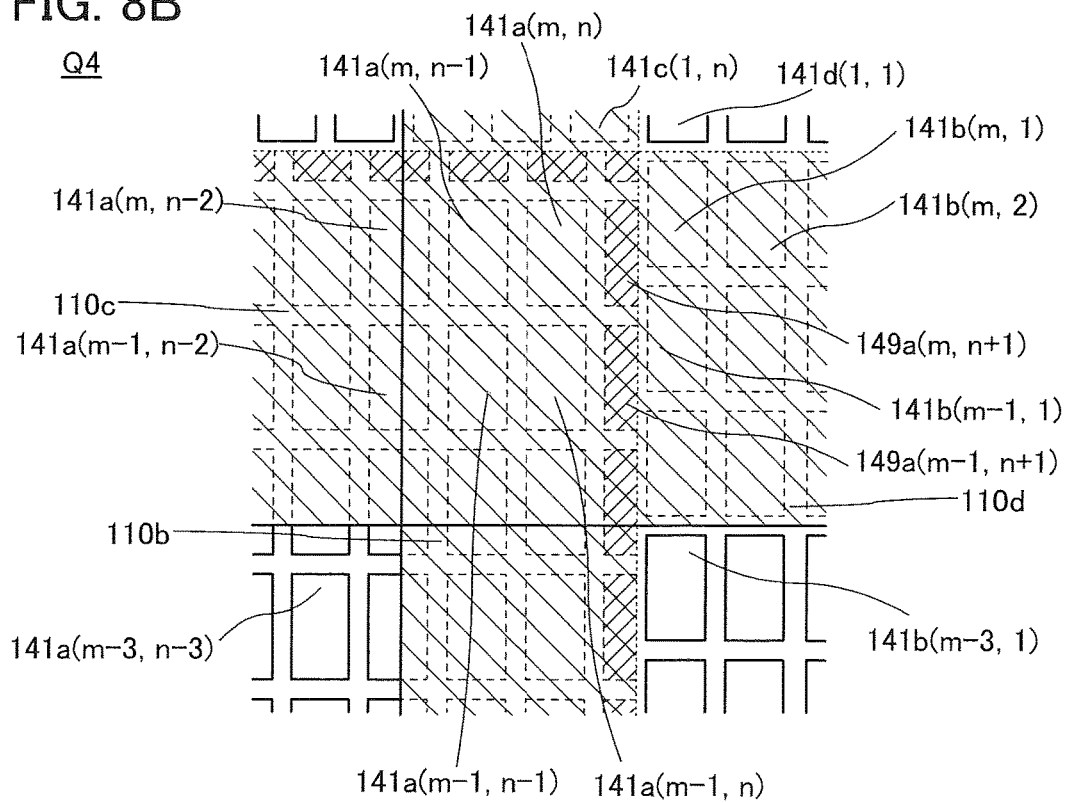

Next, FIG. 8A shows a top view of the display device 10 in the case where the display panel 100a in the state illustrated in FIG. 7A is shifted in a direction such that the display panel 100a is moved away from the display panels 100b to 100d. FIG. 8B shows an example of an enlarged view of a region Q4 in FIG. 8A.

In FIG. 8A, the regions 110b to 110d that transmit visible light of the display panel 100b overlap with the display region 101a and the display region 109a of the display panel 100a.

As described above, the display panel 100a includes the display region 109a between the display region 101a and the region 120a that blocks visible light. Accordingly, when the display panel 100a is shifted in a direction such that the display panel 100a is moved away from the display panels 100b to 100d, the regions 110b to 110d that transmit visible light can be prevented from overlapping with the region 120a that blocks visible light. In other words, a user is less likely to recognize the seam between the display panels.

In FIG. 8B, part of the pixel 149a of the display panel 100a is located between the pixel 141a in the n-th column of the display panel 100a and the pixel 141b in the first column of the display panel 100b, which are adjacent to each other in FIG. 7B. In a similar manner, part of the pixel 149a of the display panel 100a is located between the pixel 141a in the m-th row of the display panel 100a and the pixel 141c in the first row of the display panel 100c. Furthermore, in the upper right of the pixel 141a(m, n) of the display panel 100a and the lower left of the pixel 141d(1, 1) of the display panel 100d, part of the pixel 149a of the display panel 100a is located.

When the four display panels overlap with each other as illustrated in FIGS. 8A and 8B, a user of the display device 10 sees at least part of the display region 109a of the display panel 100a through the regions 110 that transmit visible light of the display panels 100b to 100d.

As described above, the pixel 149 in the i-th row has the same color as the pixel 141 in the i-th row and the n-th column, and the pixel 149 in the j-th column has the same color as the pixel 141 in the m-th row and the j-th column. A gate signal and a source signal supplied to the pixel 149 in the i-th row are the same as those supplied to the pixel 141 in the i-th row and the n-th column, and a gate signal and a source signal supplied to the pixel 149 in the j-th row are the same as those supplied to the pixel 141 in the m-th row and the j-th column. Furthermore, the pixels 149 in the m+1-th and subsequent rows and the n+1-th and subsequent columns have the same color as the pixel 141(m, n). A gate signal and a source signal supplied to the pixels 149 in the m+1-th and subsequent rows and the n+1-th and subsequent columns are the same as those supplied to the pixel 141(m, n). Accordingly, the pixel 149 and the pixel 141 adjacent to the pixel 149 output light of the same color at the same timing and at the same level of luminance. As a result, even when the two display panels that overlap with each other in the row direction or the column direction are misaligned, an image can be prevented from appearing divided at the boundary between the two display panels.

Structure Example E

Figure 9A:
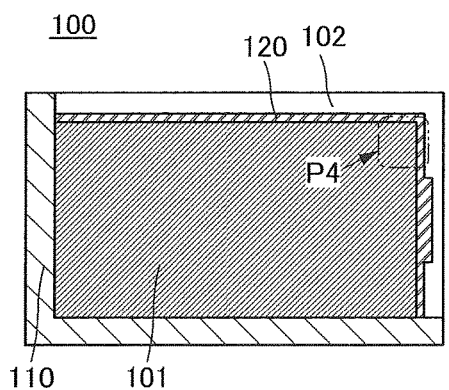
FIGS. 9A to 9C are top views illustrating an example of a display panel and a display device.

FIG. 9A is a top view illustrating the display panel 100 that is different from that in FIG. 6A. The display panel 100 in FIG. 9A is different from that in FIG. 6A in that it does not include the display region 109. Note that the descriptions of the portions similar to those in FIG. 6A are omitted.

The display panel 100 includes the display region 101 and the region 102.

The region 102 includes the region 110 that transmits visible light and the region 120 that blocks visible light. The region 110 that transmits visible light and the region 120 that blocks visible light are each adjacent to the display region 101.

Figure 9B:
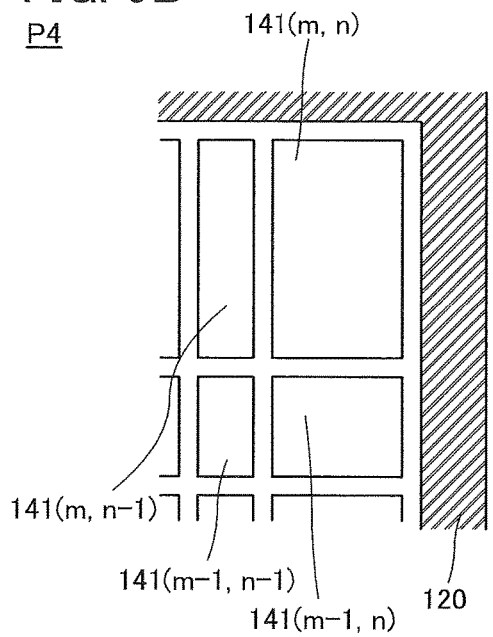

FIG. 9B shows an example of an enlarged view of a region P4 in FIG. 9A.

In FIG. 9B, the area of the pixel 141 in the n-th column is larger than that of the pixel 141 in the n−1-th column. For example, the area of the pixel 141(m−1, n) is larger than that of the pixel 141(m−1, n−1). In a similar manner, the area of the pixel 141 in the m-th row is larger than that of the pixel 141 in the m−1-th row. For example, the area of the pixel 141(m, n−1) is larger than that of the pixel 141(m−1, n−1). In addition, the area of the pixel 141(m, n) is larger than that of the pixel 141(m−1, n−1).

In one embodiment of the present invention, the area of the display element included in the pixel 141 in the n-th column is made larger than that of the display element included in the pixel 141 in the n−1-th column. In a similar manner, the area of the display element included in the pixel 141 in the m-th row is made larger than that of the display element included in the pixel 141 in the m−1-th row. In addition, the area of the display element included in the pixel 141(m, n) is made larger than that of the display element included in the pixel 141(m−1, n−1). Thus, the acceptable range of misalignment of the two display panels overlapping in the row direction or the column direction can be widened.

In the case where the pixel includes a light-emitting element as the display element, the potential that is supplied to the gate of the driving transistor included in each of the pixels 141 in the n-th column is preferably higher than the potential supplied to the gate of the driving transistor included in each of the pixels 141 in the n−1-th column in FIG. 9B. In a similar manner, the potential that is supplied to the gate of the driving transistor included in each of the pixels 141 in the m-th row is preferably higher than the potential supplied to the gate of the driving transistor included in each of the pixels 141 in the m−1-th row. Furthermore, the potential that is supplied to the gate of the driving transistor included in the pixel 141(m, n) is preferably higher than the potential supplied to the gate of the driving transistor included in the pixel 141(m−1, n−1).

Alternatively, in FIG. 9B, it is preferable that a higher current can flow in the driving transistor included in each of the pixels 141 in the n-th column than in the driving transistor included in each of the pixels 141 in the n−1-th column. In a similar manner, it is preferable that a higher current can flow in the driving transistor included in each of the pixels 141 in the m-th row than in the driving transistor included in each of the pixels 141 in the m−1-th row. In addition, it is preferable that a higher current can flow in the driving transistor included in the pixel 141(m, n) than in the driving transistor included in the pixel 141(m−1, n−1).

In the case where four display panels overlap with each other, the area where each of the pixels 141a of the undermost display panel 100a having a larger area than the other pixels 141a overlaps with the region 110b that transmits visible light of the display panel 100b on the upper side is preferably the same as the area of each of the other pixels 141a. At this time, part of each of the pixels 141a of the display panel 100a having a larger area than the other pixels 141a overlaps with the display regions 101b to 101d of the display panels 100b to 100d.

Figure 9C:
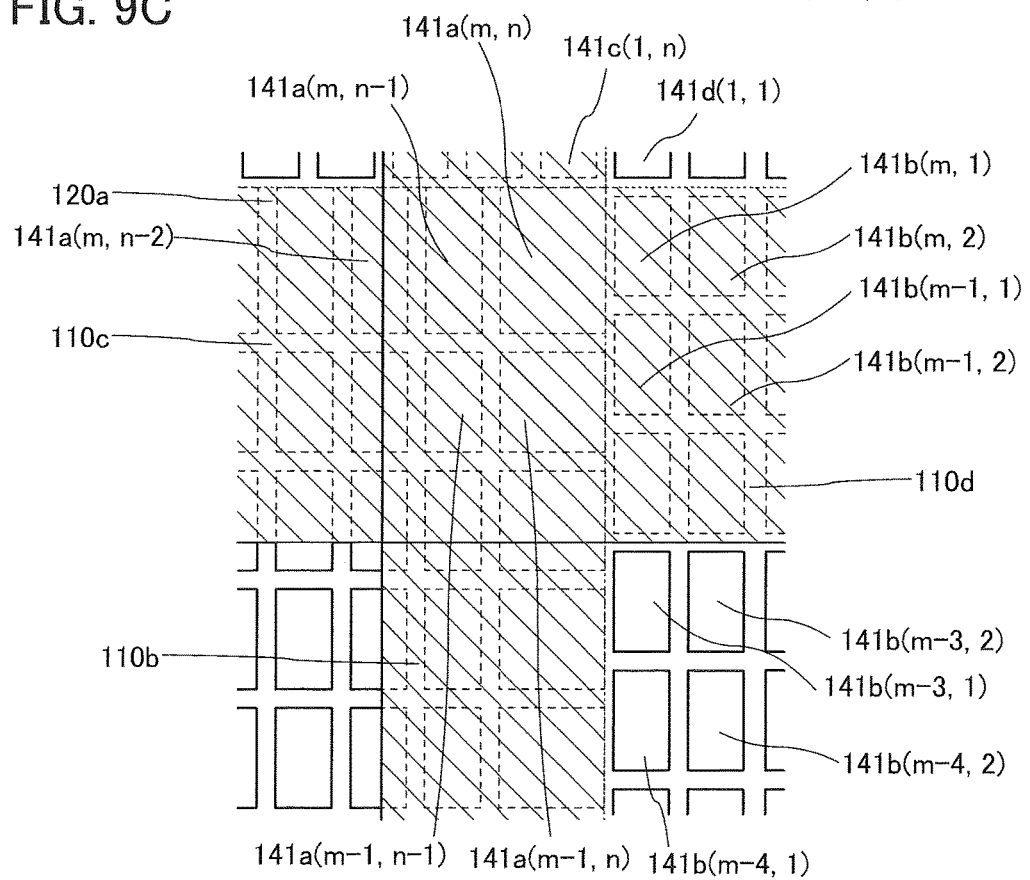

As illustrated in FIG. 9C, the more the display panel 100a is shifted in a direction such that it is moved away from the other display panels, the larger the area where the pixels 141a of the display panel 100a each having a larger area than the other pixels 141a overlap with the regions 110b to 110d that transmit visible light of the display panels 100b to 100d. The display region 101a can be prevented from being moved away from the display regions 101b to 101d even when the display panel 100a is shifted in a direction such that it is moved away from the other display panels. As a result, it is possible to prevent an image from appearing divided because of misalignment of the display panels.

Structure Example F

Figure 10A:
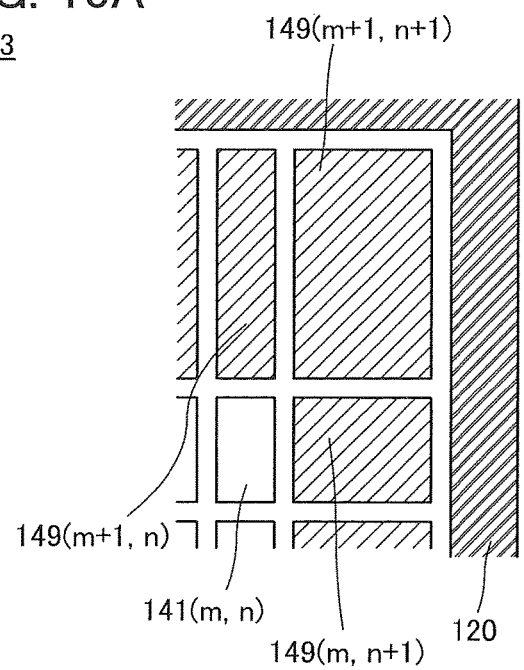
FIGS. 10A and 10B are top views illustrating an example of a display panel and a display device.
Figure 10B:
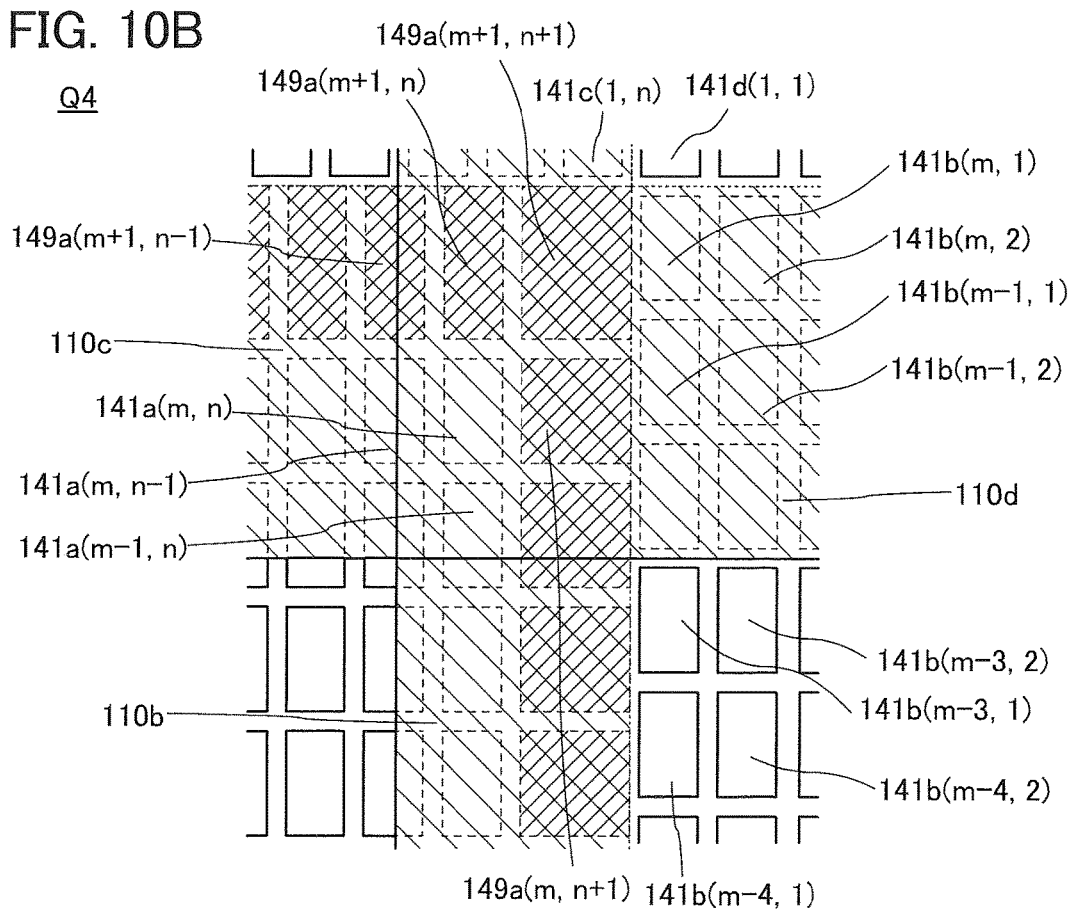

FIG. 10A illustrates a modification example of the enlarged view in FIG. 6B. FIG. 10B illustrates a modification example of the enlarged view in FIG. 7B.

In FIG. 10A, the area of each of the pixels 149 arranged in the column direction is larger than that of each of the pixels 141 in the n-th column. For example, the area of the pixel 149(m, n+1) is larger than that of the pixel 141(m, n). In a similar manner, the area of each of the pixels 149 arranged in the row direction is larger than that of each of the pixels 141 in the m-th row. For example, the area of the pixel 149(m+1, n) is larger than that of the pixel 141(m, n). Furthermore, the area of the pixel 149(m+1, n+1) is larger than that of the pixel 141(m, n).

In one embodiment of the present invention, the area of the display element included in each of the pixels 149 arranged in the column direction is made larger than that of the display element included in each of the pixels 141 in the n-th column. In a similar manner, the area of the display element included in each of the pixels 149 arranged in the row direction is made larger than that of the display element included in each of the pixels 141 in the m-th row. In addition, the area of the display element included in the pixel 149($m$+1, $n$+1) is made larger than that of the display element included in the pixel 141($m$, $n$). Thus, the acceptable range of misalignment of the two display panels overlapping in the row direction or the column direction can be widened.

In the case where the pixel includes a light-emitting element as the display element, the potential that is supplied to the gate of the driving transistor included in each of the pixels 149 arranged in the column direction is preferably higher than the potential supplied to the gate of the driving transistor included in each of the pixels 141 in the n-th column in FIG. 10A. In a similar manner, the potential that is supplied to the gate of the driving transistor included in each of the pixels 149 arranged in the row direction is preferably higher than the potential supplied to the gate of the driving transistor included in each of the pixels 141 in the m-th row. In addition, the potential that is supplied to the gate of the driving transistor included in the pixel 149($m$+1, $n$+1) is preferably higher than the potential supplied to the gate of the driving transistor included in the pixel 141($m$, $n$).

Alternatively, in FIG. 10A, it is preferable that a higher current can flow in the driving transistor included in each of the pixels 149 arranged in the column direction than in the driving transistor included in each of the pixels 141 in the n-th column. In a similar manner, it is preferable that a higher current can flow in the driving transistor included in each of the pixels 149 arranged in the row direction than in the driving transistor included in each of the pixels 141 in the m-th row. In addition, it is preferable that a higher current can flow in the driving transistor included in the pixel 149($m$+1, $n$+1) than in the driving transistor included in the pixel 141($m$, $n$).

As illustrated in FIG. 10B, the more the display panel 100$a$ is shifted in a direction such that it is moved away from the other display panels, the larger the area where the pixel 149$a$ of the display panel 100$a$ overlaps with the regions 110$b$ to 110$d$ that transmit visible light of the display panels 100$b$ to 100$d$. Display performed in the display region 109$a$ can prevent an image from appearing divided at the boundary between the two display regions because of misalignment of the display panels.

Circuit Diagram of Structure Example A

An example of a method for making the gate signal and the source signal supplied to the pixels 149 in the i-th row be the same as those supplied to the pixel in the i-th row and the n-th column in the structure example A is described.

Figure 11:
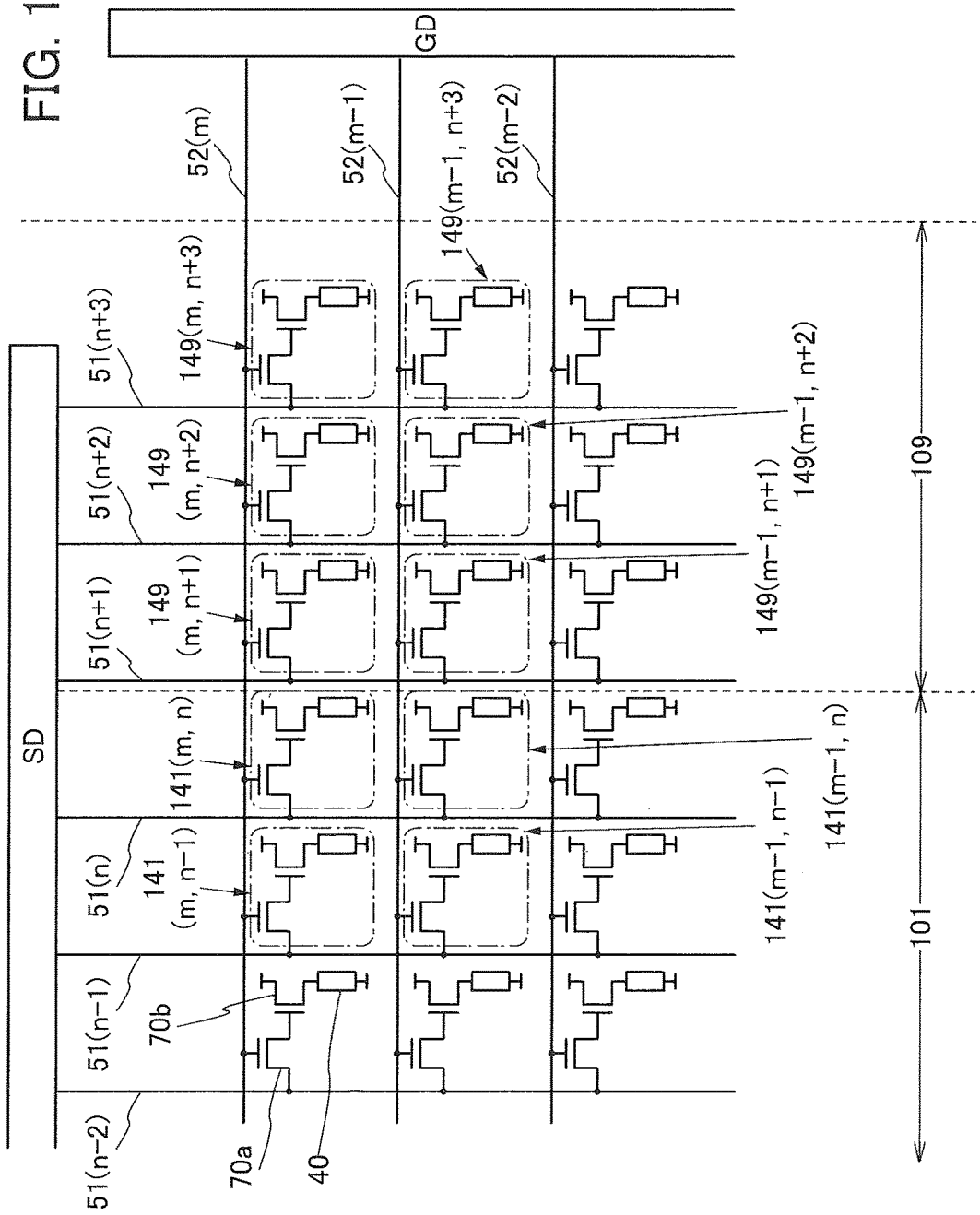
FIG. 11 is a circuit diagram illustrating an example of connection between pixels and driver circuits.

FIG. 11 is a circuit diagram illustrating connection between the display region 101, the display region 109, a scan line driver circuit GD, and a signal line driver circuit SD.

The display region 101 includes a plurality of pixels 141. The display region 109 includes a plurality of pixels 149. The pixels 141 and the pixels 149 each include a selection transistor 70$a$, a driving transistor 70$b$, and a light-emitting element 40.

To the pixel 141($i$, $j$) (i is an integer of greater than or equal to 1 and less than or equal to m, j is an integer of greater than or equal to 1 and less than or equal to n), one signal line 51($j$) and one scan line 52($i$) are electrically connected. The signal line 51($j$) is electrically connected to the signal line driver circuit SD. The scan line 52($i$) is electrically connected to the scan line driver circuit GD.

A gate of the selection transistor 70$a$ in the pixel 141($i$, $j$) is electrically connected to the scan line 52($i$), one of a source and a drain thereof is electrically connected to the signal line 51($j$), and the other of the source and the drain thereof is electrically connected to a gate of the driving transistor 70$b$. One of a source and a drain of the driving transistor 70$b$ is electrically connected to a pixel electrode of the light-emitting element 40, and a fixed potential is supplied to the other of the source and the drain of the driving transistor 70$b$.

To the pixel 149($i$, $q$) (q is n+1, n+2, or n+3), one signal line 51($q$) and one scan line 52($i$) are electrically connected. The signal line 51($q$) is electrically connected to the signal line driver circuit SD.

A gate of the selection transistor 70$a$ in the pixel 149($i$, $q$) is electrically connected to the scan line 52($i$), one of the source and the drain thereof is electrically connected to the signal line 51($q$), and the other of the source and the drain thereof is electrically connected to the gate of the driving transistor 70$b$. One of the source and the drain of the driving transistor 70$b$ is electrically connected to the pixel electrode of the light-emitting element 40, and a fixed potential is supplied to the other of the source and the drain of the driving transistor 70$b$.

In each of the pixels 141 in the i-th row and the pixels 149 in the i-th row, the gate of the selection transistor 70$a$ is electrically connected to the scan line 52($i$). In other words, the gate signal supplied to the pixels 141 in the i-th row is the same as the gate signal supplied to the pixels 149 in the i-th row.

One of the source and the drain of the selection transistor 70$a$ in the pixel 141($i$, $n$) is electrically connected to the signal line 51($n$). One of the source and the drain of the selection transistor 70$a$ in the pixel 149($i$, $q$) is electrically connected to the signal line 51($q$). The signal line driver circuit SD supplies the same source signal to the signal line 51($q$) and the signal line 51($n$), whereby the source signal supplied to the pixel 149 can be the same as the source signal supplied to the pixels 141 in the n-th column.

Figure 12:
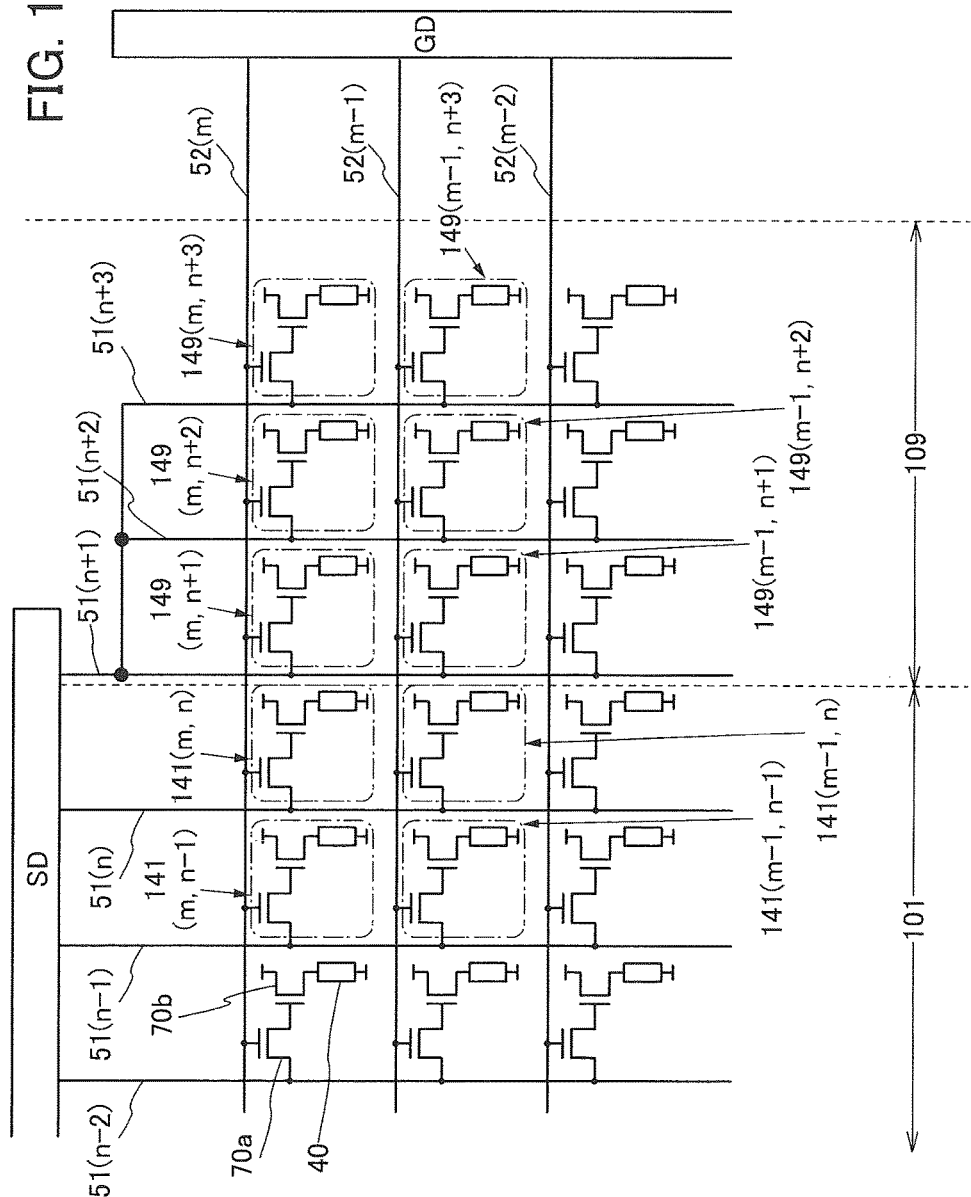
FIG. 12 is a circuit diagram illustrating an example of connection between pixels and driver circuits.
Figure 13:
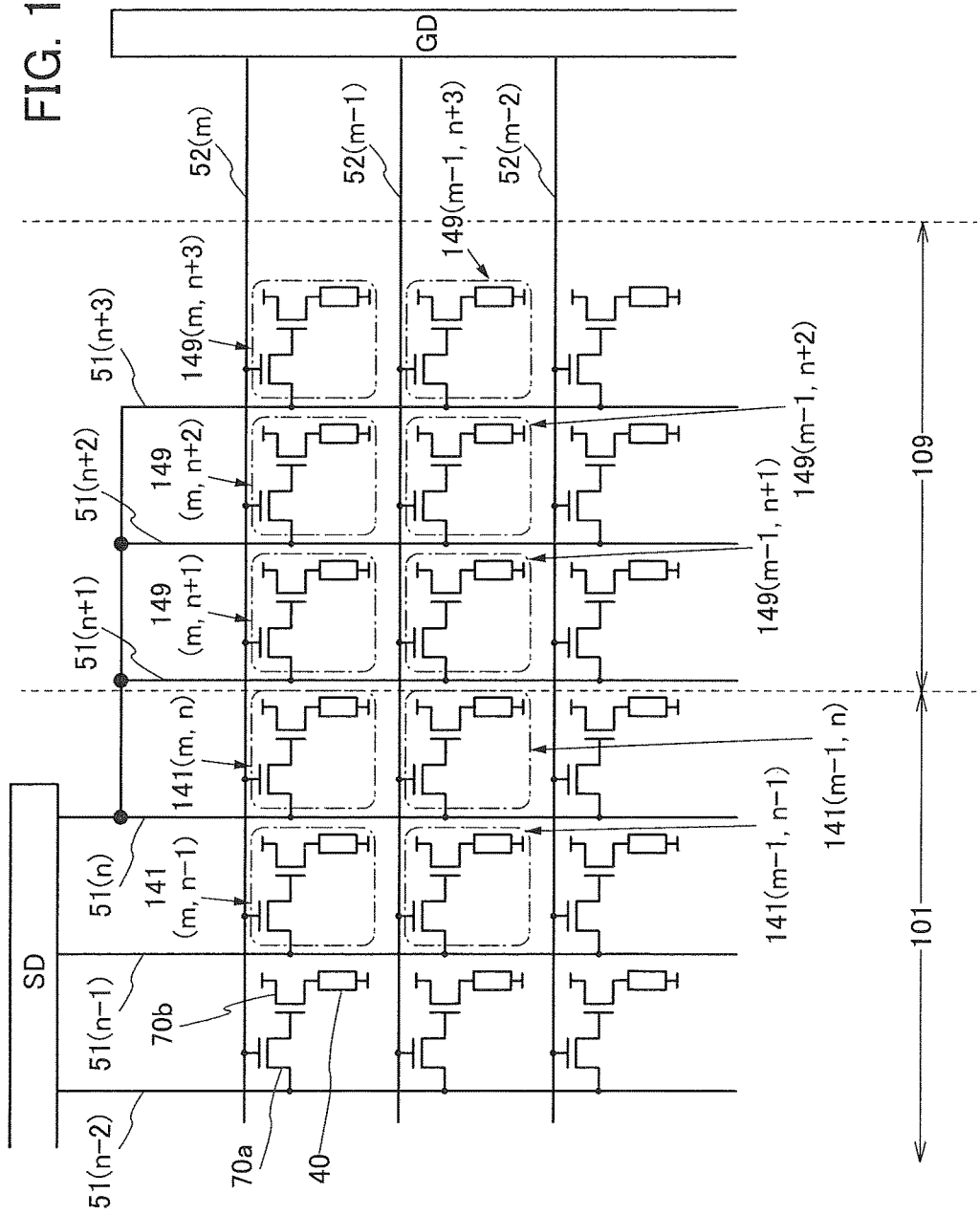
FIG. 13 is a circuit diagram illustrating an example of connection between pixels and driver circuits.

FIG. 12 and FIG. 13 each illustrate a modification example of the circuit diagram in FIG. 11. FIG. 12 is different from FIG. 11 in that the signal line 51($n$+2) and the signal line 51($n$+3) are connected to the signal line 51($n$+1). FIG. 13 is different from FIG. 11 in that the signal line 51($n$+1), the signal line 51($n$+2), and the signal line 51($n$+3) are connected to the signal line 51($n$).

In FIG. 11, the same source signal is supplied to all the pixels 149 included in the display region 109. Thus, one embodiment of the present invention is not limited to the structure in which the signal lines connected to the display region 109 are separately connected to the signal line driver circuit SD. For example, the structure can be employed in which only one signal line connected to the pixels 149 in the display region 109 is directly connected to the signal line driver circuit SD as illustrated in FIG. 12.

By a reduction in the number of the signal lines connected to the signal line driver circuit SD, the write time per signal line can be longer in the structure illustrated in FIG. 12 than in the structure illustrated in FIG. 11.

In FIG. 11, the source signal which is the same as that supplied to the pixels in the n-th column in the display region 101 is supplied to the pixels in the display region 109. Accordingly, a structure as illustrated in FIG. 13 in which the signal lines connected to the pixels 149 in the display region 109 are not connected directly to the signal line driver circuit SD may be employed.

The structure in FIG. 13 and a structure without the display region 109 are not different in the number of the signal lines connected to the signal line driver circuit SD. That is, at the time of application of a display panel including the display region 109 to a display device, a novel driver circuit does not need to be designed, a novel IC does not need to be fabricated, or a novel image data does not need to be formed; therefore, manufacturing cost can be reduced.

Figure 14:
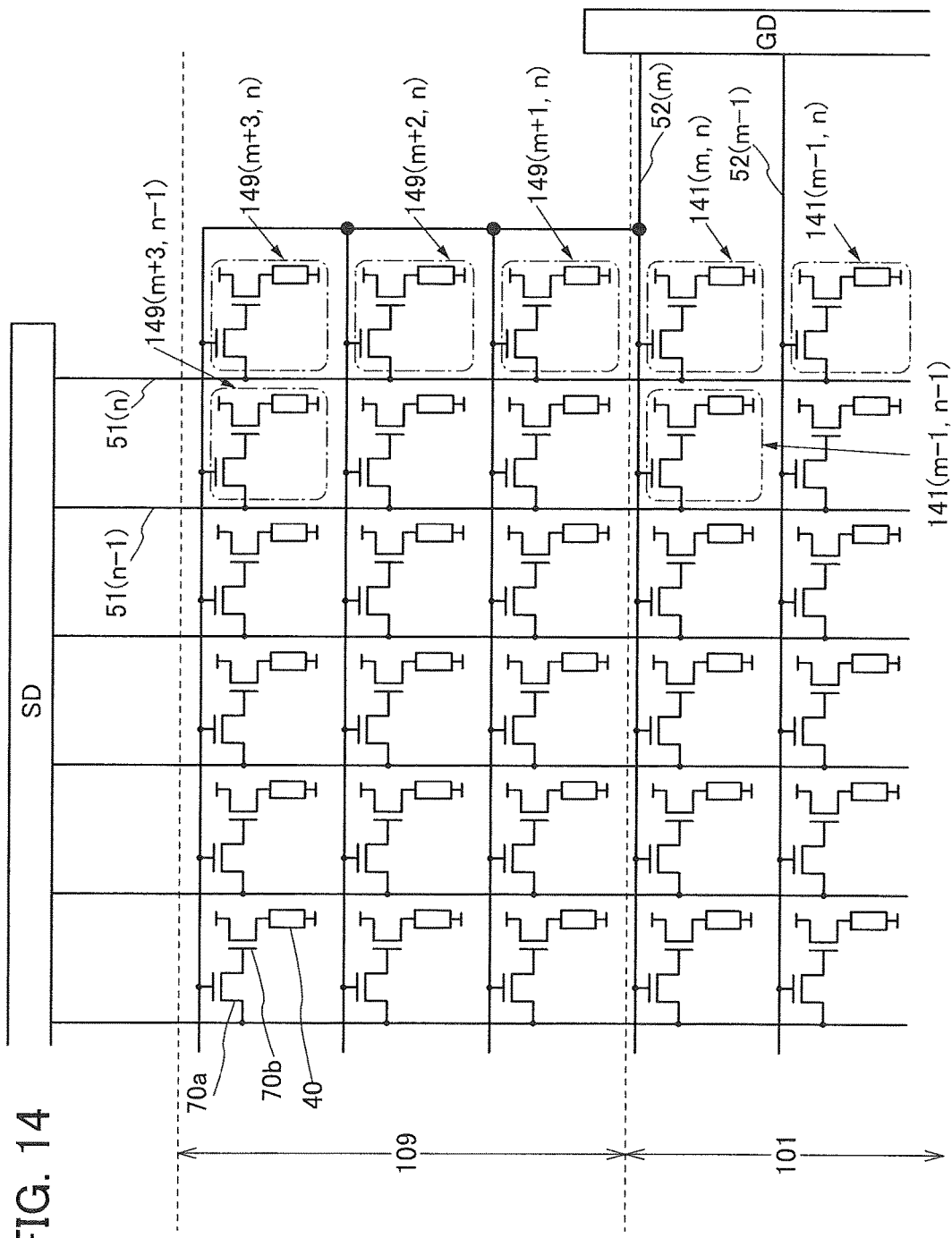
FIG. 14 is a circuit diagram illustrating an example of connection between pixels and driver circuits.

FIG. 14 illustrates an example of the case where the display region 109 is provided to be adjacent to the pixels in the m-th row of the display region 101.

The structure and connection relation of the pixel 141($i$, $j$) are similar to those in FIG. 11.

To the pixel 149($p$, $j$) ($p$ is m+1, m+2, or m+3), one signal line 51($j$) and one scan line 52($m$) are electrically connected.

The gate of the selection transistor 70$a$ in the pixel 149($p$, $j$) is electrically connected to the scan line 52($m$), one of the source and the drain thereof is electrically connected to the signal line 51($j$), and the other of the source and the drain thereof is electrically connected to the gate of the driving transistor 70$b$. One of the source and the drain of the driving transistor 70$b$ is electrically connected to the pixel electrode of the light-emitting element 40, and a fixed potential is supplied to the other of the source and the drain of the driving transistor 70$b$.

In each of the pixel 141($m$, $j$) and the pixel 149, the gate of the selection transistor 70$a$ is electrically connected to the scan line 52($m$). In each of the pixels 141 in the j-th column and the pixels 149 in the j-th column, one of the source and the drain of the selection transistor 70$a$ is electrically connected to the signal line 51($j$). In other words, the gate signal and the source signal supplied to the pixels 141 in the j-th column are the same as the gate signal and the source signal supplied to the pixels 149 in the j-th column.

In one embodiment of the present invention, the gate signal which is the same as that supplied to the pixels 141 in the m-th row in the display region 101 is supplied to the pixels 149 in the display region 109. Accordingly, a structure as illustrated in FIG. 14 in which the scan lines connected to the pixels 149 in the display region 109 are not connected directly to the scan line driver circuit GD may be employed.

The structure in FIG. 14 and a structure without the display region 109 are not different in the number of the scan lines connected to the scan line driver circuit GD. That is, at the time of application of a display panel including the display region 109 to a display device, a novel driver circuit does not need to be designed, a novel IC does not need to be fabricated, or a novel image data does not need to be formed; therefore, manufacturing cost can be reduced.

Figure 15:
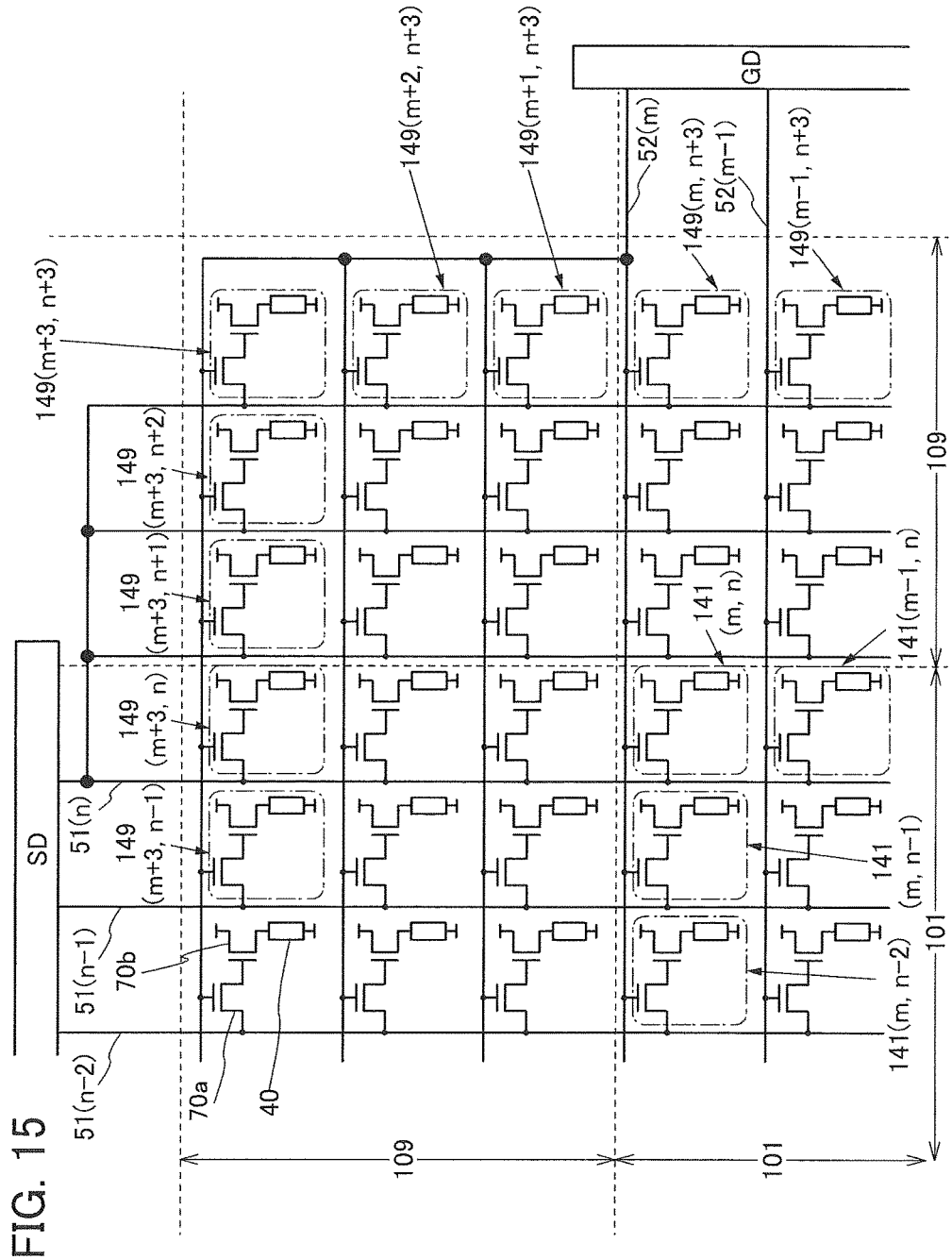
FIG. 15 is a circuit diagram illustrating an example of connection between pixels and driver circuits.

FIG. 15 is a circuit diagram illustrating connection between the display region 101, the display region 109, the scan line driver circuit GD, and the signal line driver circuit SD in the structure example D.

The structure and connection relation of the pixel 141($i$, $j$) are similar to those in FIG. 11.

To the pixel 149($i$, $q$) ($q$ is n+1, n+2, or n+3), one signal line 51($n$) and one scan line 52($i$) are electrically connected.

To the pixel 149($p$, $j$) ($p$ is m+1, m+2, or m+3), one signal line 51($j$) and one scan line 52($m$) are electrically connected.

To the pixel 149($p$, $q$) ($p$ is m+1, m+2, or m+3, $q$ is n+1, n+2, or n+3), one signal line 51($n$) and one scan line 52($m$) are electrically connected.

The gate of the selection transistor 70$a$ in the pixel 149($p$, $q$) is electrically connected to the scan line 52($m$), one of the source and the drain thereof is electrically connected to the signal line 51($n$), and the other of the source and the drain thereof is electrically connected to the gate of the driving transistor 70$b$. One of the source and the drain of the driving transistor 70$b$ is electrically connected to the pixel electrode of the light-emitting element 40, and a fixed potential is supplied to the other of the source and the drain of the driving transistor 70$b$.

In each of the pixel 141($m$, $n$) and the pixel 149($p$, $q$), the gate of the selection transistor 70$a$ is electrically connected to the scan line 52($m$). In other words, the gate signal supplied to the pixel 141($m$, $n$) is the same as the gate signal supplied to the pixel 149($p$, $q$).

In each of the pixel 141($m$, $n$) and the pixel 149($p$, $q$), one of the source and the drain of the selection transistor 70$a$ is electrically connected to the signal line 51($n$). In other words, the source signal supplied to the pixel 141($m$, $n$) is the same as the source signal supplied to the pixel 149($p$, $q$).

The structure in FIG. 15 and a structure without the display region 109 are not different in the number of the signal lines connected to the signal line driver circuit SD and the number of the scan lines connected to the scan line driver circuit GD. That is, at the time of application of a display panel including the display region 109 to a display device, a novel driver circuit does not need to be designed, a novel IC does not need to be fabricated, or a novel image data does not need to be formed; therefore, manufacturing cost can be reduced.

Although FIGS. 11 to 15 each show the example in which the pixel 141 and the pixel 149 have the same structure, one embodiment of the present invention is not limited thereto.

Figure 16:
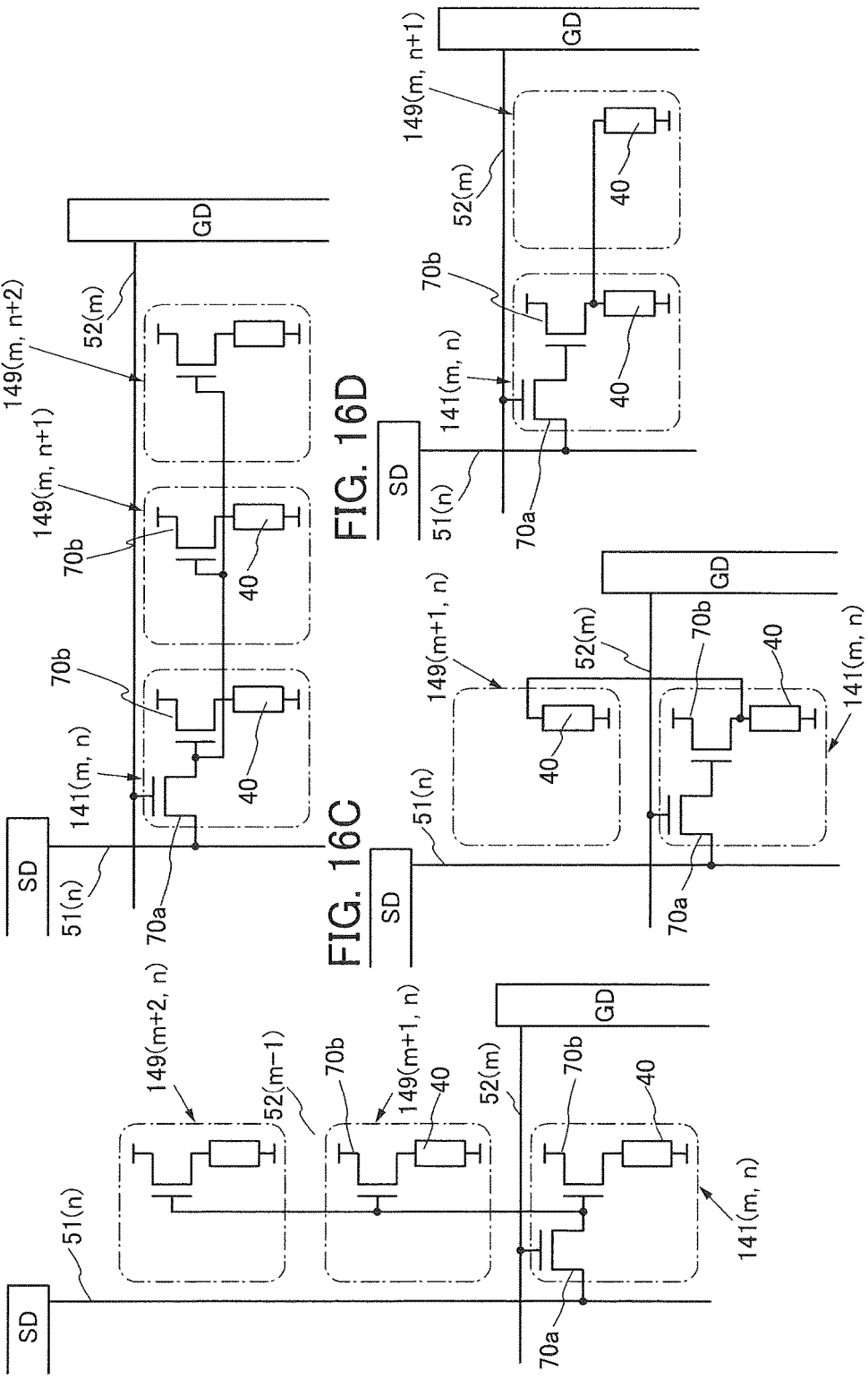
FIGS. 16A to 16D are circuit diagrams each illustrating an example of connection between pixels and driver circuits.

FIGS. 16A and 16B each illustrate an example in which the pixel 149 includes the driving transistor 70$b$ and the light-emitting element 40 but does not include the selection transistor 70$a$.

In FIG. 16A, the gate of each of the driving transistors 70$b$ in the pixel 149($m$+2, $n$) and the pixel 149($m$+1, $n$) is electrically connected to the gate of the driving transistor 70$b$ in the pixel 141($m$, $n$).

In FIG. 16B, the gate of each of the driving transistors 70$b$ in the pixel 149($m$, $n$+1) and the pixel 149($m$, $n$+2) is electrically connected to the gate of the driving transistor 70$b$ in the pixel 141($m$, $n$).

FIGS. 16C and 16D each illustrate an example in which the pixel 149 includes the light-emitting element 40 but does not include the selection transistor 70$a$ and the driving transistor 70$b$.

In FIG. 16C, the pixel electrode of the light-emitting element 40 in the pixel 149($m$+1, $n$) is electrically connected to the pixel electrode of the light-emitting element 40 in the pixel 141($m$, $n$).

In FIG. 16D, the pixel electrode of the light-emitting element 40 in the pixel 149($m$, $n$+1) is electrically connected to the pixel electrode of the light-emitting element 40 in the pixel 141($m$, $n$).

In FIGS. 16C and 16D, it is preferable that a higher current can flow in the driving transistor 70$b$ electrically connected to a plurality of light-emitting elements 40 than in the driving transistor electrically connected to one light-emitting element 40.

In this manner, by changing the structure of the pixel, the gate signal and the source signal supplied to the pixel 149 can be made to be the same as those supplied to the pixel 141 in the n-th column in the same row as the pixel 149 or those supplied to the pixel 141 in the m-th row in the same column as the pixel 149. Moreover, providing the display region 109 does not increase the number of the signal lines connected to the signal line driver circuit SD and the number of the scan lines connected to the scan line driver circuit GD.

Circuit Diagram of Structure Example B

An example of a method for making a higher current flow in the driving transistors included in the pixels 141 in the n-th column than in the driving transistors included in the pixels 141 in the n−1-th column in the structure example B is described.

Figure 17:
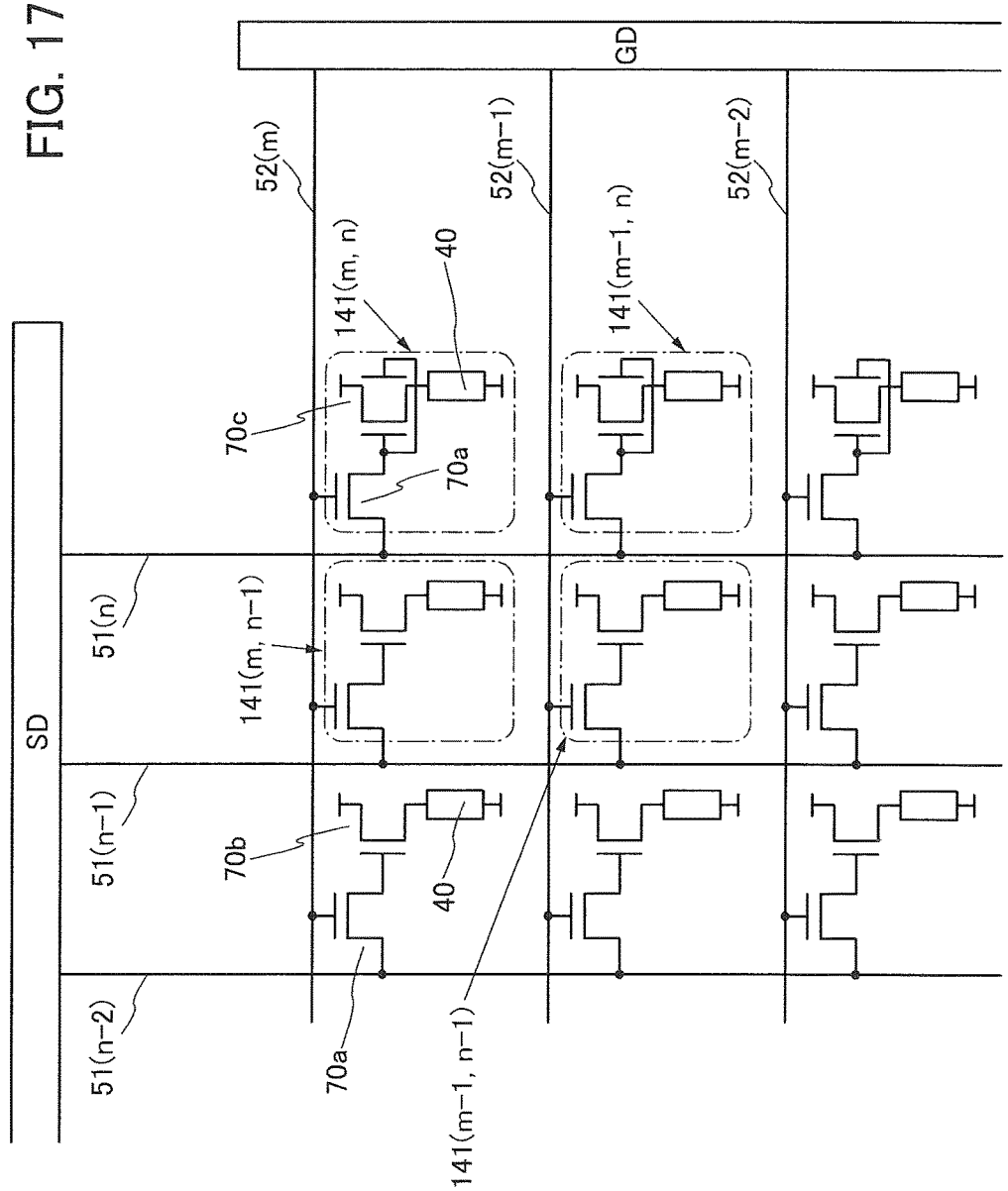
FIG. 17 is a circuit diagram illustrating an example of connection between pixels and driver circuits.

FIG. 17 is a circuit diagram illustrating connection between the pixel 141, the scan line driver circuit GD, and the signal line driver circuit SD.

The pixels 141 provided in the first to n−1-th columns each include the selection transistor 70a, the driving transistor 70b, and the light-emitting element 40. The pixels 141 provided in the n-th column each include the selection transistor 70a, a driving transistor 70c, and the light-emitting element 40.

To the pixel 141(i, j) (i is an integer of greater than or equal to 1 and less than or equal to m, j is an integer of greater than or equal to 1 and less than or equal to n), one signal line 51(j) and one scan line 52(i) are electrically connected. The signal line 51(j) is electrically connected to the signal line driver circuit SD. The scan line 52(i) is electrically connected to the scan line driver circuit GD.

The gate of the selection transistor 70a in the pixel 141(i, j) is electrically connected to the scan line 52(i), one of the source and the drain thereof is electrically connected to the signal line 51(j), and the other of the source and the drain thereof is electrically connected to the gate of the driving transistor 70b (a gate of the driving transistor 70c if j=n). One of the source and the drain of the driving transistor 70b (one of a source and a drain of the driving transistor 70c if j=n) is electrically connected to the light-emitting element 40, and a fixed potential is supplied to the other of the source and the drain.

The driving transistor 70c includes a back gate. The back gate is electrically connected to the gate of the driving transistor 70c. A higher current can flow in a dual-gate transistor than in a single-gate transistor. Accordingly, when the driving transistors 70c of the pixels 141 in the n-th column are dual-gate transistors and the driving transistors 70b of the pixels 141 in the n−1-th column are single-gate transistors, a higher current can flow in the driving transistors of the pixels 141 in the n-th column than in the driving transistors of the pixels 141 in the n−1-th column.

The structure example C can employ a similar approach to make a higher current flow in the driving transistors included in the pixels 149 than in the driving transistors included in the pixels 141 in the n-th column.

FIG. 18 illustrates an example in which the pixel 149 includes the dual-gate driving transistor 70c and the pixel 141 includes the single-gate driving transistor 70b.

Note that in FIG. 18, the signal line connected to the pixels 141 in the n−1-th column is different from that connected to the pixels 141 in the n-th column. Thus, the potential supplied to the pixels 141 in the n-th column can be higher than that supplied to the pixels 141 in the n−1-th column. As a result, the potential that is supplied to the gate of the driving transistor included in each of the pixels 141 in the n-th column can be higher than the potential supplied to the gate of the driving transistor included in each of the pixels 141 in the n−1-th column. In this case, the pixels 141 in the n−1-th column can have the same structure as the pixels 141 in the n-th column. For example, both the pixels 141 in the n−1-th column and the pixels 141 in the n-th column can include the selection transistor 70a, the driving transistor 70b, and the light-emitting element 40. Alternatively, for example, both the pixels 141 in the n−1-th column and the pixels 141 in the n-th column can include the selection transistor 70a, the driving transistor 70c, and the light-emitting element 40.

Pixel Layout Diagram for Structure Example C

Another example of a method for making a higher current flow in the driving transistors included in the pixels 149 than in the driving transistors included in the pixels 141 in the n-th column in the structure example C is described. Note that the structure examples B, E, and F can employ a similar approach.

FIGS. 19A to 19D each illustrate an example of a circuit diagram of a pixel. FIGS. 20A and 20B and FIGS. 21A and 21B each illustrate an example of a layout of pixels. In each layout diagram, some components, including an insulating layer, are not shown. FIG. 20B and FIG. 21B are diagrams formed by adding pixel electrodes 36 to FIG. 20A and FIG. 21A.

Figure 19A:
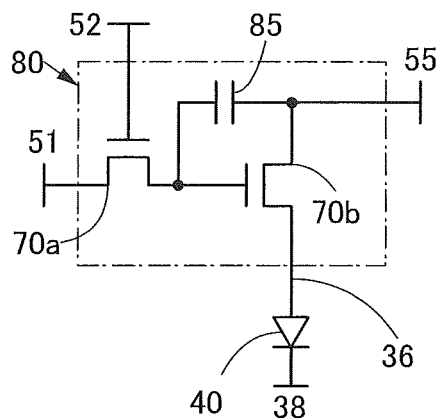
FIGS. 19A to 19D are circuit diagrams each illustrating an example of a pixel.

A pixel circuit 80 in FIG. 19A includes the selection transistor 70a, the driving transistor 70b, and a capacitor 85. The pixel circuit 80 is connected to the signal line 51, the scan line 52, and a power supply line 55. The light-emitting element 40 includes the pixel electrode 36 and a common electrode 38. The power supply line 55 supplies a predetermined potential or signal to the capacitor 85 and one of the source and the drain of the driving transistor 70b.

Figure 19B:
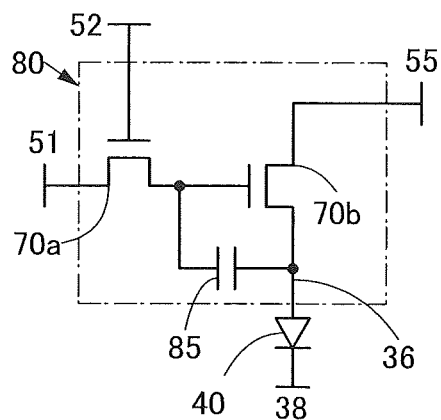
Figure 19C:
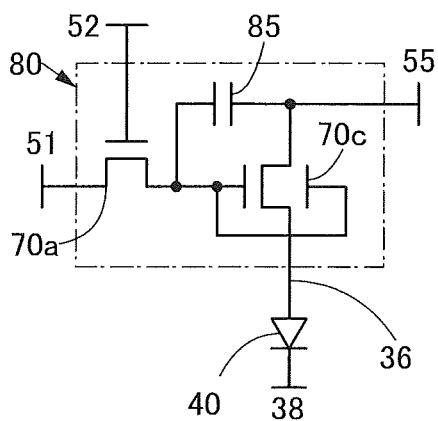
Figure 19D:
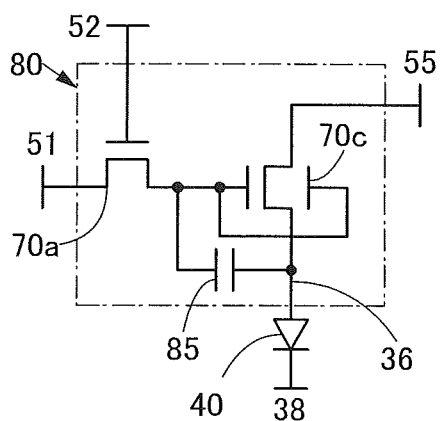

The pixel circuit 80 in FIG. 19B is different from that in FIG. 19A in the connection of the capacitor 85. The pixel circuit 80 in FIGS. 19C and 19D is different from that in FIGS. 19A and 19B in not including the single-gate driving transistor 70b but including the dual-gate driving transistor 70c.

The pixel layouts in FIGS. 20A and 20B and FIGS. 21A and 21B can be employed for the display panel 100 in FIG. 5A or FIG. 10A, for example. The above pixel layouts can also be employed for the display panel in which the area of the display region of the display element is different between pixels as shown in FIG. 4A or FIG. 9A, for example.

The pixels 141 in FIGS. 20A and 20B and FIGS. 21A and 21B include the pixel circuit 80 illustrated in FIG. 19A. The pixels 149 in FIGS. 20A and 20B also include the pixel circuit 80 illustrated in FIG. 19A. The pixels 149 in FIGS. 21A and 21B include the pixel circuit 80 illustrated in FIG. 19C.

Connection in each pixel is described. A portion of the scan line 52 functions as the gate of the selection transistor 70a. A portion of the signal line 51 functions as one of the source and the drain of the selection transistor 70a. A semiconductor layer 72a is provided to overlap with a portion of the scan line 52, and the signal line 51 is provided to overlap with a portion of the semiconductor layer 72a. A conductive layer 74b functioning as the other of the source and the drain of the selection transistor 70a is provided on a side opposite to the signal line 51 of the semiconductor layer 72a. The conductive layer 74b is electrically connected to a conductive layer 76. A portion of the conductive layer 76 functions as a gate electrode of the driving transistor 70b, 70b1, 70b2, or 70c. Another portion of the conductive layer 76 functions as one electrode of the capacitor 85. A portion of the power supply line 55 functions as the other electrode of the capacitor 85 and another portion of the power supply line 55 functions as one of a source and a drain of the driving transistor 70b, 70b1, 70b2, or 70c. The other of the source and the drain of the driving transistor 70b, 70b1, 70b2, or 70c is electrically connected to the pixel electrode 36, 36a, or 36b.

In FIG. 20B and FIG. 21B, a light-emitting region 83b is wider than a light-emitting region 83a.

Figure 20A:
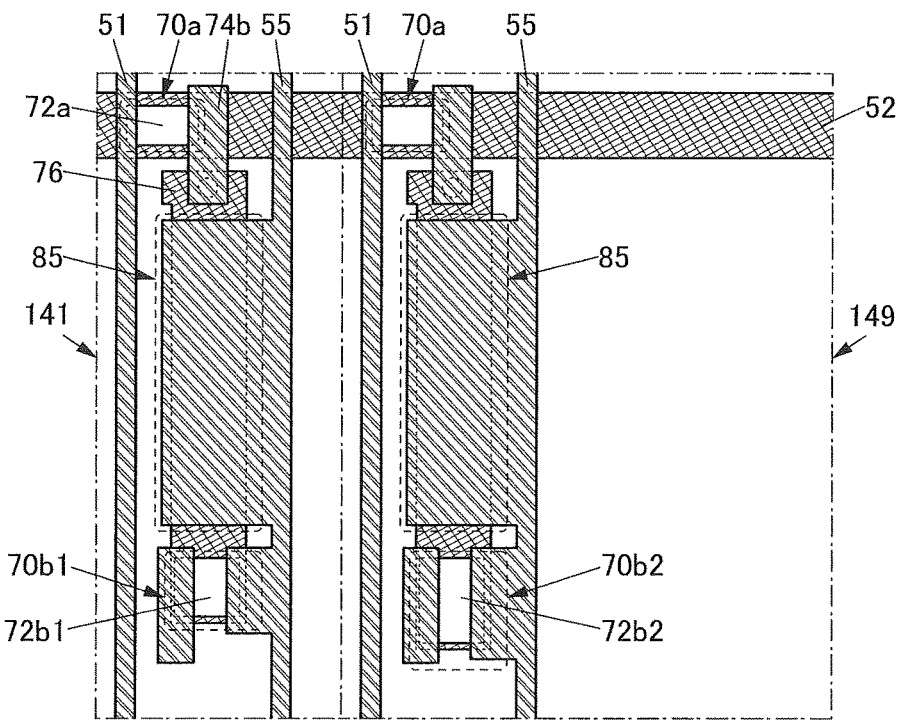
FIGS. 20A and 20B are top views illustrating an example of a pixel.
Figure 20B:
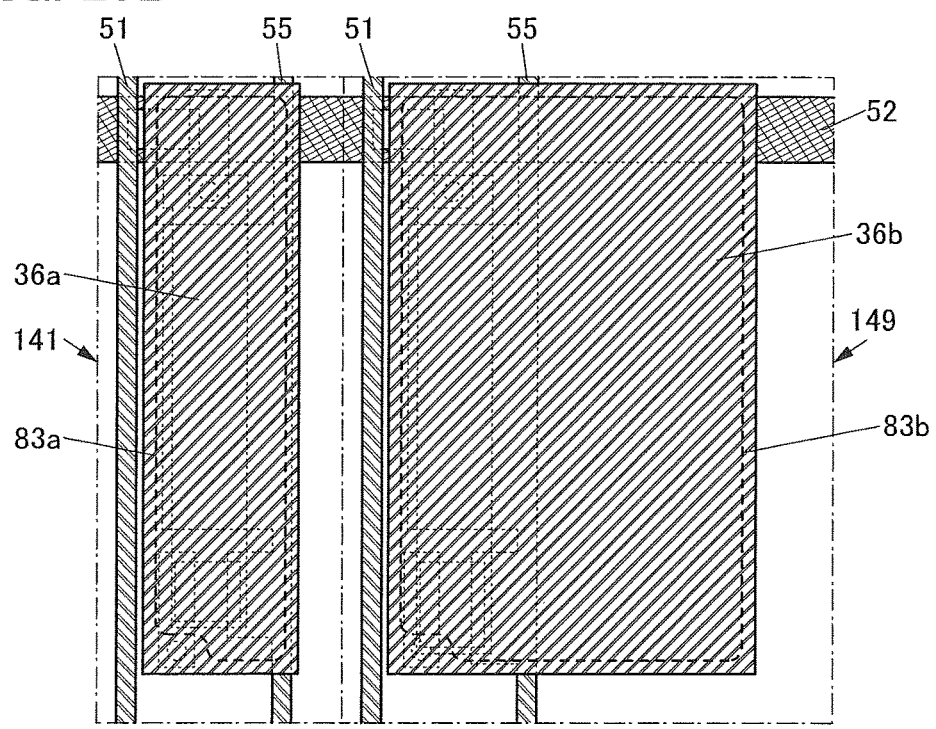

In FIGS. 20A and 20B, the W/L ratio of the driving transistor 70b2 of the pixel 149 is larger than that of the driving transistor 70b1 of the pixel 141. A larger W/L ratio of a driving transistor enables a higher current to flow. Accordingly, even when the light-emitting region 83b is wider than the light-emitting region 83a, the luminance of the light-emitting region 83b can be prevented from being lower than that of the light-emitting region 83a.

Although FIGS. 20A and 20B show an example in which the semiconductor layer 72b2 is longer than the semiconductor layer 72b1 in the channel width direction, one embodiment of the present invention is not limited thereto. The driving transistor 70b1 and the driving transistor 70b2 can be different in at least one of the channel length L and the channel width W.

Figure 21A:
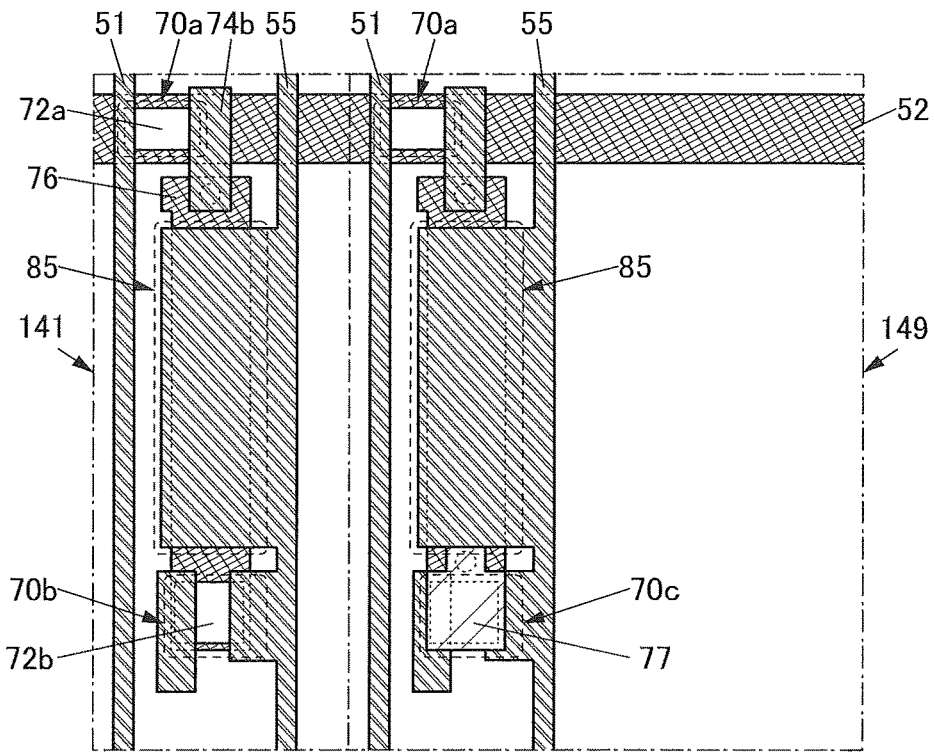
FIGS. 21A and 21B are top views illustrating an example of a pixel.
Figure 21B:
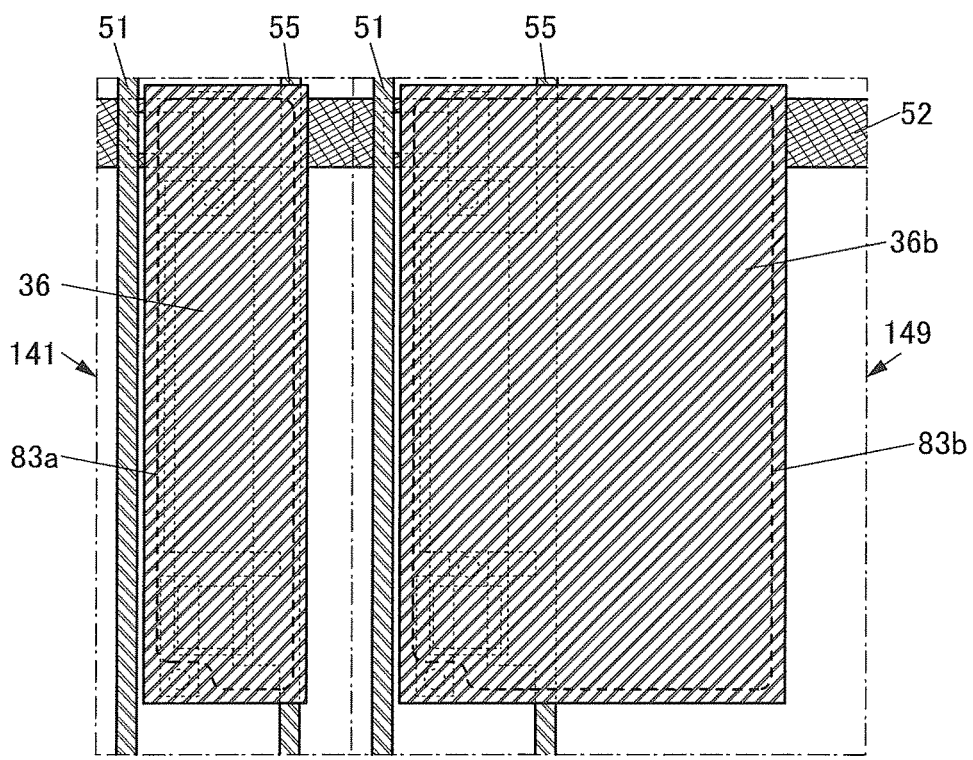

In FIGS. 21A and 21B, the driving transistor 70b of the pixel 149 is a dual-gate transistor and the driving transistor 70c of the pixel 141 is a single-gate transistor. As already described above, a higher current can flow in a dual-gate transistor than in a single-gate transistor. Accordingly, even when the light-emitting region 83b is wider than the light-emitting region 83a, the luminance of the light-emitting region 83b can be prevented from being lower than that of the light-emitting region 83a.

The driving transistor 70c has the structure of the driving transistor 70b to which a gate 77 is added. Although FIGS. 21A and 21B show an example in which two gates of the driving transistor 70c are connected to each other, one embodiment of the present invention is not limited thereto. The two gates of the driving transistor 70c are not necessarily connected to each other. In that case, different potentials can be supplied to the two gates. For example, when an n-channel transistor is used as the driving transistor 70c, by supplying a potential that shifts the threshold voltage in the negative direction to one of the gates, a current flowing when a predetermined potential is supplied to the other gate can be large.

Note that when the display region of the display element has the same area in all the pixels as in FIG. 1A or the like, the driving transistors in all the pixels can have the same structure and all the pixels can have the same layout. For example, the layout of the pixel 141 and the pixel 149 shown in FIGS. 20A and 20B or FIGS. 21A and 21B can be applied.

<Display Region of Display Element>

A layout of the display region of the display element is described below.

FIG. 22A illustrates an arrangement example of pixels in four rows and four columns that are included in a display panel. FIGS. 22B to 22E each show a layout example of the display regions of the display elements of the pixels illustrated in FIG. 22A. FIGS. 22B to 22E each show a display region 41 of the display element included in the pixel 141 and a display region 49 of the display element included in the pixel 149. The colors of the pixels corresponding to the display regions are represented by letters (R: red, G: green, B: blue, and W: white).

The order in which the colors are arranged is not particularly limited. The kind and number of colors are not limited, either. The area of the display region of the display element can be made different between colors. Alternatively, the area of the display region of the display element can be the same for all the colors.

FIG. 22B illustrates an example of a layout of the display regions of the display elements included in the pixels of three colors, R, G, and B. The display regions 41 in the n−2-th column correspond to the pixels 141 of red (R). The display regions 41 in the n−1-th column correspond to the pixels 141 of green (G). The display regions 41 in the n-th column correspond to the pixels 141 of blue (B). The display regions 49 in the n+1-th column each correspond to the pixel 149 of blue (B). The display region 49 in the m+1-th row and the j-th column and the display region 41 in the m-th row and the j-th column correspond to the pixels 149 and 141 of the same color. The display regions 41 of all the display elements have the same area. The display region 41 and the display region 49 have the same area.

FIG. 22C illustrates an example of a layout of the display regions of the display elements included in the pixels of four colors, R, G, B, and W. The pixel of red (R) and the pixel of blue (B) are located in the same row. The pixel of green (G) and the pixel of white (W) are located in the same row. The pixel of red (R) and the pixel of green (G) are located in the same column. The pixel of blue (B) and the pixel of white (W) are located in the same column. The pixel 149 in the m+1-th row and the j-th column has the same color as the pixel 141 in the m-th row and the j-th column. The pixel 149 in the i-th row and the n+1-th column has the same color as the pixel 141 in the i-th row and the n-th column. Both the pixel 141(m, n) and the pixel 149(m+1, n+1) are blue.

FIG. 22D illustrates an example of a layout of the display regions of the display elements included in the pixels of three colors, R, G, and B. The pixel of red (R) and the pixel of blue (B) are located in the same row. The pixel of green (G) and the pixel of blue (B) are located in the same row. The pixel of red (R) and the pixel of green (G) are not located in the same row. The pixel of red (R) and the pixel of green (G) are located in the same column. In the column in which the pixel of blue (B) is located, pixels of the other colors are not located. In FIG. 22D, the display regions 41 and 49 of the display elements included in the pixels of blue are narrower than the display regions 41 and 49 of the display elements included in the pixels of the other colors.

FIG. 22E illustrates an example of a layout of the display regions of the display elements included in the pixels of three colors, R, G, and B. The display regions of the display elements included in a plurality of pixels located in one row are not necessarily located in one row. In the example illustrated in FIG. 22E, the display regions 41 and 49 of the display elements included in the pixels in one row are distributed between two rows. The display region 41 or 49 of the display element included in the pixel of blue is below the display regions of the display elements included in the pixels of the other colors. Such a layout is favorable when a light-emitting element is formed by a separate coloring method, for example.

The pixels are not necessarily arranged in m rows and n columns. For example, as illustrated in FIGS. 23A and 23C, the display panel 100 can have a structure in which a pixel is not provided in some coordinates in the m rows and n columns.

FIG. 23B shows a layout example of the display regions of the display elements of the pixels illustrated in FIG. 23A. FIG. 23D shows a layout example of the display regions of the display elements of the pixels illustrated in FIG. 23C. In FIGS. 23A and 23C, a column in which in pixels are arranged and a column in which m/2 pixels are arranged are alternately provided. In FIGS. 23A to 23D, in is an even number. FIG. 23A illustrates an example in which in pixels are provided in the n-th column (the endmost column in the display region 101). FIG. 23C illustrates an example in which m/2 pixels are provided in the n-th column (the endmost column in the display region 101).

In FIG. 23B, the display regions 41 and 49 of the display elements included in the pixels of blue are wider than the display regions 41 and 49 of the display elements included in the pixels of the other colors. The display regions 41 and

49 of the display elements included in the pixels of blue extend to a region where no pixel of any color is provided, so do the display regions 41 of the display elements included in the pixels of blue and the display regions 41 of the display elements included in the pixels of the other colors in FIG. 23D. Note that the area of the display region 49 of the display element included in the pixel of blue in FIG. 23D can be substantially the same as the area of the display region 49 of the display element included in each of the pixels of the other colors.

As described above, in one embodiment of the present invention, the positions of the pixels (pixel circuits) do not necessarily coincide with the positions of the display regions of the display elements, and any of a variety of layouts can be employed.

<Another Structure Example of Display Device>

Figure 24A:
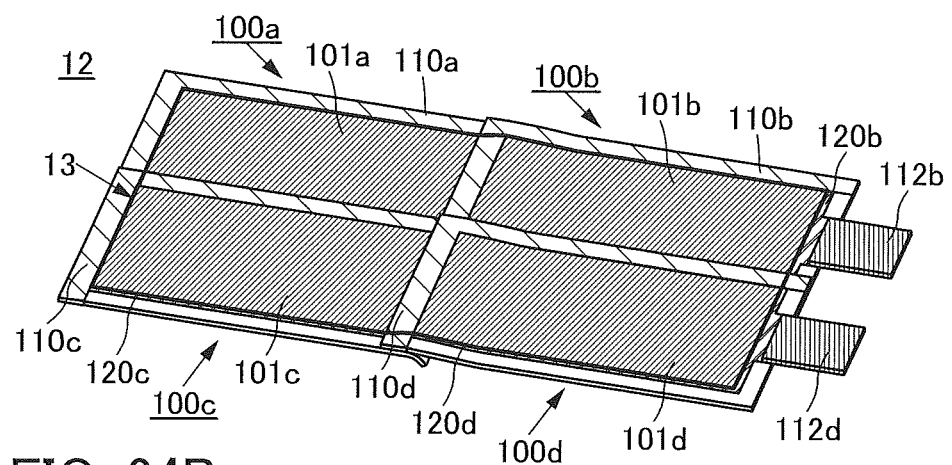
FIGS. 24A and 24B are perspective views illustrating an example of a display device.
Figure 24B:
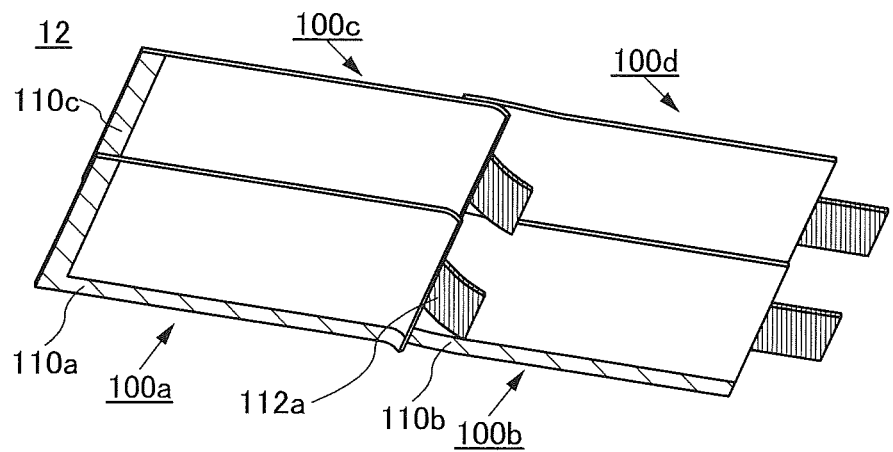

FIG. 24A is a perspective view of a display surface side of a display device 12. FIG. 24B is a perspective view of the side of the display device 12 opposite to the display surface side. The display device 12 in FIGS. 24A and 24B includes four display panels 100 arranged in a 2×2 matrix (two display panels in the longitudinal direction and the lateral direction). FIGS. 24A and 24B illustrate an example where each of the display panels is electrically connected to an FPC.

For the display device 12, any of a variety of display panels described in this embodiment can be used. Although the display panel not including the display region 109 (which correspond to that in FIG. 9A or the like) is used in the example illustrated in FIGS. 24A and 24B, the display panel including the display region 109 (which correspond to that in FIG. 6A or the like) can also be used.

At least part of the display device 12 is flexible. At least part of the display panel 100 is flexible. As the display element in the flexible display panel 100, an organic EL element can be favorably used.

When the flexible display panel 100 is used, as illustrated in FIGS. 24A and 24B, a region near an FPC 112a of the display panel 100a can be bent so that part of the display panel 100a and part of the FPC 112a can be placed under the display region 101b of the display panel 100b adjacent to the FPC 112a. As a result, the FPC 112a can be placed without physical interference with the rear surface of the display panel 100b. Furthermore, when the display panel 100a and the display panel 100b overlap with each other and are fixed, it is not necessary to consider the thickness of the FPC 112a; thus, the top surface of the region 110b that transmits visible light and the top surface of the display panel 100a can be substantially leveled. This can make an end portion of the display panel 100b over the display region 101a less noticeable.

Moreover, each display panel 100 is made flexible, in which case the display panel 100b can be curved gently so that the top surface of the display region 101b of the display panel 100b and the top surface of the display region 101a of the display panel 100a are leveled. Thus, the display regions can be leveled except the vicinity of a region where the display panel 100a and the display panel 100b overlap with each other, so that the display quality of an image displayed on the display region 13 of the display device 12 can be improved.

Although the relation between the display panel 100a and the display panel 100b is taken as an example in the above description, the same can apply to the relation between any other two adjacent display panels.

To reduce the step between two adjacent display panels 100, the thickness of the display panel 100 is preferably small. For example, the thickness of the display panel 100 is preferably less than or equal to 1 mm, further preferably less than or equal to 300 µm, and still further preferably less than or equal to 100 µm. The display panel is preferably thin because the thickness or weight of the whole display device can also be reduced.

Figure 25A:
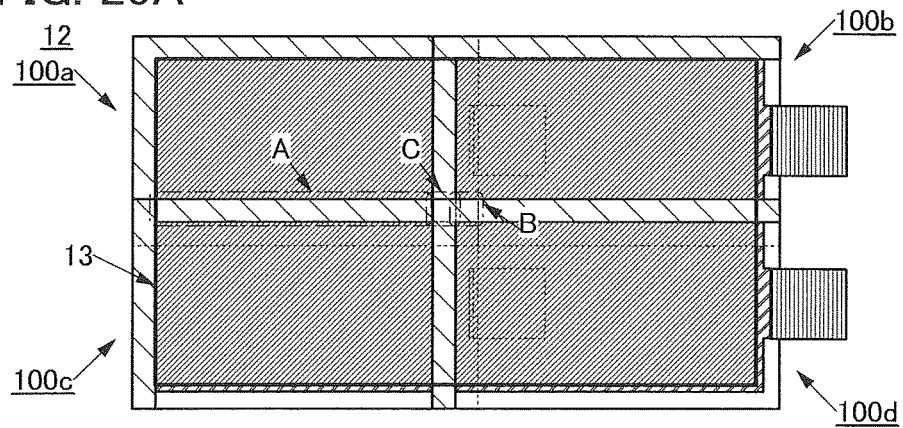
FIGS. 25A to 25C are top views each illustrating an example of a display device.

FIG. 25A is a top view of the display device 12 in FIGS. 24A and 24B seen from the display surface side.

Here, the region 110 that transmits visible light of the display panel 100 considerably reflects or absorbs visible light. Thus, the luminance (brightness) of a display on the display panel 100 on the lower side might be different between a portion seen through the region 110 that transmits visible light and a portion seen not through the region. In addition, depending on the number of the display panels 100 overlapping with the display region 101, the luminance (brightness) of a displayed image decreases.

For example, in a region A in FIG. 25A, one display panel 100c overlaps with the display region 101a of the display panel 100a. In a region B, two display panels 100 (the display panels 100c and 100d) overlap with the display region 101b of the display panel 100b. In a region C, three display panels 100 (the display panels 100b, 100c, and 100d) overlap with the display region 101a of the display panel 100a.

In this case, it is preferable that image data to be displayed be corrected so that the gray scale of the pixels is locally increased depending on the number of display panels 100 overlapping with the display region 101. In this manner, a decrease in the display quality of the image displayed on the display region 13 of the display device 12 can be suppressed. Alternatively, the luminance of the pixels can be controlled by adjusting data voltage supplied from the driver circuit.

Alternatively, the position of an end portion of the display panel 100 placed on the upper side may be shifted from the position of an end portion of another display panel 100, whereby the number of display panels 100 overlapping with the display region 101 of the lower display panel 100 can be reduced.

Figure 25B:
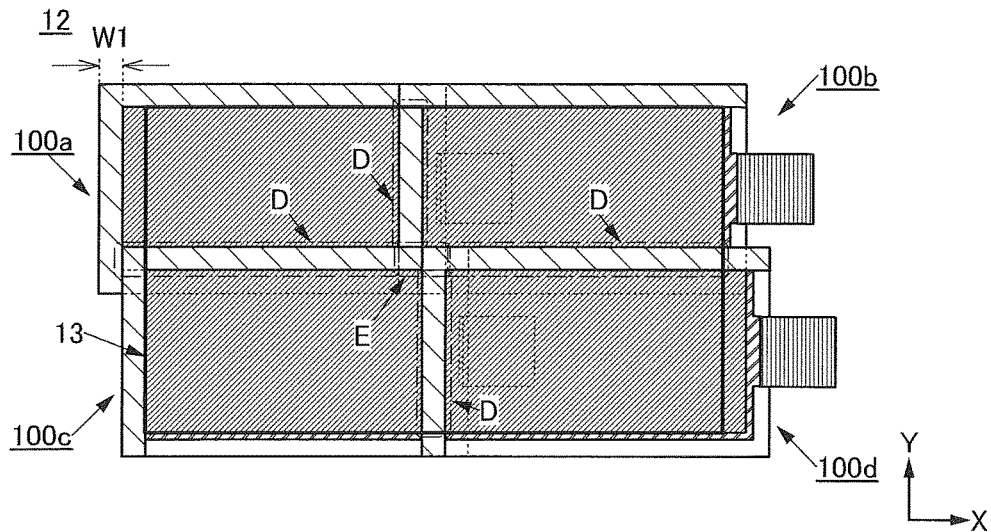

In FIG. 25B, the display panels 100c and 100d over the display panels 100a and 100b are shifted in one direction. Specifically, the display panels 100c and 100d are relatively shifted from the display panels 100a and 100b in the positive X direction by the width $W_1$ of the region 110 that transmits visible light. At this time, there are two regions: a region D in which one display panel 100 overlaps with the display region 101, and a region E in which two display panels 100 overlap with the display region 101.

Figure 25C:
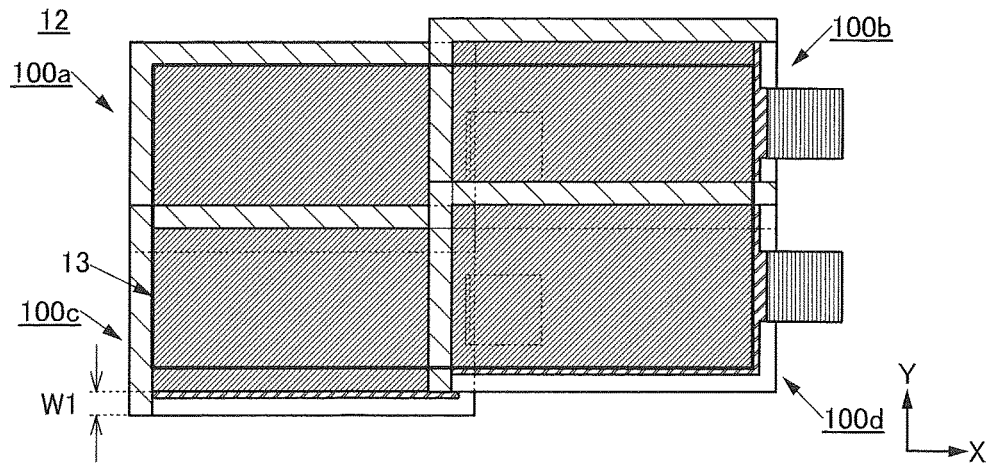

The display panel may be shifted in a direction perpendicular to the X direction (Y direction). In FIG. 25C, the display panels 100b and 100d are shifted from the display panels 100a and 100c in the positive Y direction by the width $W_1$ of the region 110 that transmits visible light.

In the case where the display panel 100 placed on the upper side is shifted from the display panel 100 placed on the lower side, the shape of the contour of a region in which the display regions 101 of the display panels 100 are combined is different from a rectangular shape. Thus, to make the shape of the display region 13 of the display device 12 rectangular as illustrated in FIG. 25B or 25C, the display device 12 is preferably driven so that no image is displayed on regions, which are placed outside the display region 13, in the display regions 101 of the display panels 100. Considering the number of pixels in the region not displaying an image, the display region 101 of each display panel 100 preferably includes more pixels than the number obtained by dividing the number of all the pixels in the display region 13 by the number of the display panels 100.

Although the distance of a relative shift of the display panels 100 is set to an integral multiple of the width $W_1$ of the region 110 that transmits visible light in the above description, the distance is not limited thereto and can be set as appropriate in consideration of the shapes of the display panels 100, the shape of the display region 13 of the display device 12, in which the display panels 100 are combined, or the like.

FIGS. 26A to 26E and FIGS. 27A to 27D are examples of cross-sectional views of the two display panels attached to each other. In the following examples, the display panel shown in FIG. 4A is used.

In FIGS. 26A to 26E, a lower display panel includes the display region 101a, the region 110a that transmits visible light, and the region 120a that blocks visible light. The lower display panel is electrically connected to the FPC 112a. An upper display panel (display panel on the display surface side) includes the display region 101b, the region 110b that transmits visible light, and the region 120b that blocks visible light. The upper display panel is electrically connected to an FPC 112b. Note that in the case where the display panel in FIG. 1A is used, the display region 109a is positioned between the display region 101a and the region 120a that blocks visible light.

Figure 26A:
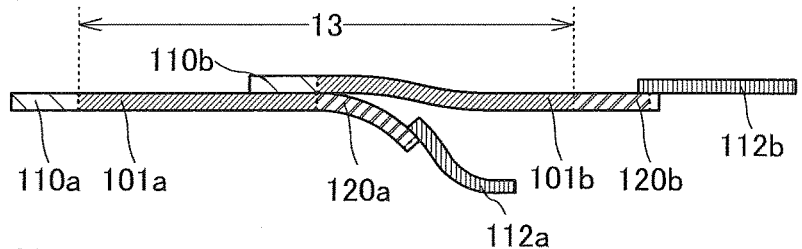
FIGS. 26A to 26E are cross-sectional views each illustrating an example of a display device.

In FIG. 26A, the FPC 112a and the FPC 112b are connected to the display surface side (front surface side) of the lower display panel and the display surface side of the upper display panel, respectively.

When air exists between the region that transmits visible light of the upper display panel and the display region of the lower display panel, part of light extracted from the display region is reflected at the interface between the display region and air and the interface between air and the region that transmits visible light, which may result in a decrease in luminance of the display. As a result, the light extraction efficiency of a region in which a plurality of display panels overlap with each other might be decreased. In addition, a difference in luminance of the display region of the lower display panel might occur between a portion overlapping with the region that transmits visible light of the upper display panel and a portion not overlapping with the region that transmits visible light of the upper display panel, so that a joint between the display panels is easily recognized by a user in some cases.

Figure 26B:
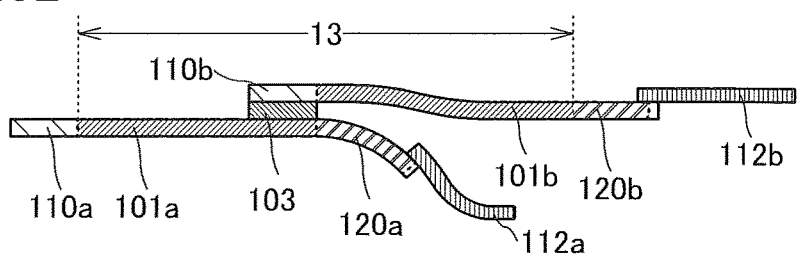

In view of the above, as illustrated in FIG. 26B, the display device preferably includes a light-transmitting layer 103 having a refractive index higher than that of air and transmitting visible light between the display region and the region that transmits visible light. Thus, air can be prevented from entering between the display region and the region that transmits visible light, so that the interface reflection due to a difference in refractive index can be suppressed. In addition, display unevenness or luminance unevenness of the display device can be reduced.

Note that the transmittance of the light-transmitting layer with respect to visible light is preferably as high as possible because the light extraction efficiency of the display device can be increased. The light-transmitting layer preferably has a light transmittance of higher than or equal to 80% and further preferably higher than or equal to 90% on average at a wavelength longer than or equal to 450 nm and shorter than or equal to 700 nm.

The difference in refractive index between the light-transmitting layer and a layer in contact with the light-transmitting layer is preferably as small as possible because the light reflection can be suppressed. For example, the refractive index of the light-transmitting layer is higher than that of air, and preferably higher than or equal to 1.3 and lower than or equal to 1.8. The difference in the refractive index between the light-transmitting layer and the layer in contact with the light-transmitting layer (e.g., a substrate included in the display panel) is preferably lower than or equal to 0.30, further preferably lower than or equal to 0.20, and still further preferably lower than or equal to 0.15.

It is preferred that the light-transmitting layer be detachably in contact with at least one of the lower display panel and the upper display panel. In the case where the display panels included in the display device are individually detachable, when malfunction occurs in one of the display panels, for example, only the defective display panel can be easily replaced with a new display panel. The continuous use of the other display panel enables the display device to be used longer and at lower cost.

When there is no need to attach and detach the display panels, the display panels can be fixed to each other with the light-transmitting layer including a material having an adhesive property (adhesive or the like).

Either of an inorganic material and an organic material can be used for the light-transmitting layer. A liquid substance, a gelatinous substance, or a solid substance can be used for the light-transmitting layer.

For the light-transmitting layer, a liquid substance such as water, a solution, a fluorine-based inactive liquid, a refractive liquid, or silicone oil can be used, for example.

In the case where the display device is inclined to the horizontal plane (a plane perpendicular to a direction in which gravity acts) or in the case where the display device is placed so as to be perpendicular to the horizontal plane, the viscosity of a liquid substance is preferably 1 mPa·s or more, further preferably 1 Pa·s or more, still further preferably 10 Pa·s or more, and yet still further preferably 100 Pa·s or more. In the case where the display device is placed so as to be parallel to the horizontal plane, for example, the viscosity of the liquid substance is not limited thereto.

The light-transmitting layer is preferably inactive because another layer included in the display device can be prevented from being damaged, for example.

A material contained in the light-transmitting layer is preferably nonvolatile. Accordingly, entry of air into the interface due to volatilization of a material used for the light-transmitting layer can be prevented.

For the light-transmitting layer, a high molecular material can be used. For example, a resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin can be used. Alternatively, a two-component-mixture-type resin can be used. For example, an adhesive sheet or any of a variety of curable adhesives such as a reactive curable adhesive, a thermosetting adhesive, an anaerobic adhesive, and a photocurable adhesive such as an ultraviolet curable adhesive containing at least one of these resins can be used. The adhesive does not need to be cured in the case where, for example, the display panels are not fixed to each other.

The light-transmitting layer preferably has high self-attachability to an object. In addition, the light-transmitting layer preferably has high separability against an object. After the light-transmitting layer attached to the display panel is separated from the display panel, it is preferred that the light-transmitting layer be able to be attached to the display panel again.

In addition, it is preferred that the light-transmitting layer have no adhesiveness or low adhesiveness. In that case, attachment and separation of the light-transmitting layer to and from an object can be repeated without damaging or contaminating a surface of the object.

As the light-transmitting layer, a film having attachability or a film having adhesiveness can be used, for example. One or both surfaces of the film can have attachability or adhesiveness. In the case where an attachment film having a stacked-layer structure of an attachment layer or an adhesive layer and a base material is used, the attachment layer or the adhesive layer can function as the light-transmitting layer of the display device, and the base material can function as a substrate included in the display panel. Alternatively, the display device may have a substrate in addition to the base material in the attachment film. The attachment film may include an anchor layer between the attachment layer or the adhesive layer and the base material. The anchor layer has a function of enhancing the adhesiveness between the attachment layer or the adhesive layer and the base material. In addition, the anchor layer has a function of smoothing a surface of the base material coated with the attachment layer or the adhesive layer. In this manner, bubbles are not easily generated between the object and the light-transmitting layer.

A film in which a silicone resin layer and a polyester film are stacked can be preferably used in the display device, for example. In that case, the silicone resin layer has attachability and functions as a light-transmitting layer, whereas the polyester film serves as a light-transmitting layer or a substrate that is included in the display panel. A silicone resin is provided on one or both surfaces of the polyester film.

The thickness of the light-transmitting layer is not particularly limited and can be greater than or equal to 1 μm and less than or equal to 50 μm, for example. The thickness of the light-transmitting layer can be greater than 50 μm; however, in the case of manufacturing a flexible display device, the thickness of the display device is preferably set such that the flexibility of the display device is not reduced. For example, the thickness of the light-transmitting layer is preferably greater than or equal to 10 μm and less than or equal to 30 μm. The thickness of the light-transmitting layer can be less than 1 μm.

The display region 101a overlaps with the region 110b that transmits visible light with the light-transmitting layer 103 provided therebetween. Thus, air can be prevented from entering between the display region 101a and the region 110b that transmits visible light, so that interface reflection due to a difference in refractive index can be reduced.

Accordingly, a difference in luminance of the display region 101a between a portion overlapping with the region 110b that transmits visible light and a portion not overlapping with the region 110b that transmits visible light can be suppressed, so that a joint between the display panels of the display device can hardly be recognized by a user of the display device. In addition, display unevenness or luminance unevenness of the display device can be suppressed.

The region 120a that blocks visible light and the FPC 112a each overlap with the display region 101b. Thus, a sufficient area of a non-display region can be secured and a seamless display region can be increased in size, so that a highly reliable large display device can be fabricated.

Figure 26C:
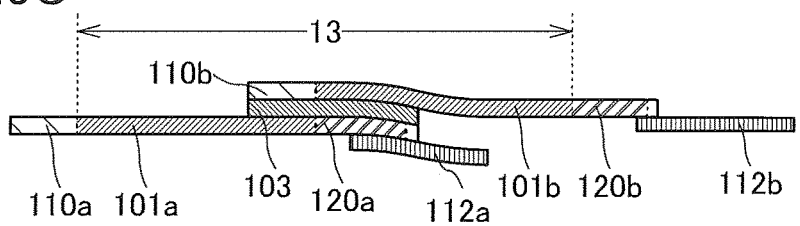

In FIG. 26C, the FPC 112a and the FPC 112b are connected to the side (rear surface side) opposite to the display surface of the lower display panel and the side (rear surface side) opposite to the display surface of the upper display panel, respectively.

In FIG. 26C, the light-transmitting layer 103 is provided between the region 120a that blocks visible light of the lower display panel and the display region 101b of the upper display panel.

When an FPC is connected to the rear surface side of a lower display panel, an end portion of the display panel can be attached to the rear surface of an upper display panel; thus, the attachment area can be increased and the mechanical strength of the attached portion can be increased.

Figure 26D:
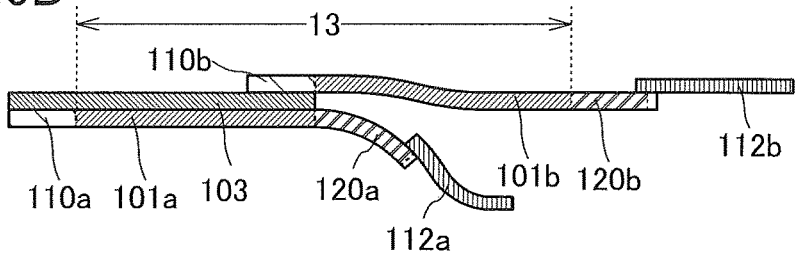

In FIG. 26D, the light-transmitting layer 103 overlaps with a region of the display region 101a not overlapping with the upper display panel. Furthermore, the region 110a that transmits visible light and the light-transmitting layer 103 overlap with each other.

Fine dirt such as dust in the air might be attached depending on a material of the light-transmitting layer. In such a case, it is preferable that the region of the display region 101a not overlapping with the upper display panel do not overlap with the light-transmitting layer 103. This makes it possible to prevent unclear display of the display device due to dirt or the like attached to the light-transmitting layer 103.

Figure 26E:
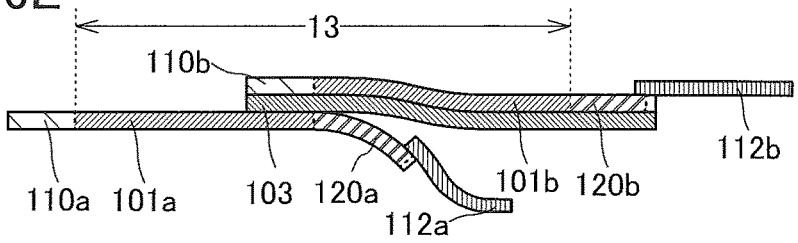

In FIG. 26E, the light-transmitting layer 103 overlaps with a region of the upper display panel not overlapping with the display region 101a.

In the structure illustrated in FIG. 26E, the light-transmitting layer is not provided on the outermost surface of the display surface of the display device; thus, unclear display of the display device due to dirt or the like attached to the light-transmitting layer 103 can be prevented. In addition, when a light-transmitting layer having attachability is provided on the rear surface of the display device, the display device can be detachably attached to a desired portion with the use of a surface of the light-transmitting layer which is not in contact with the display panel.

Figure 27A:
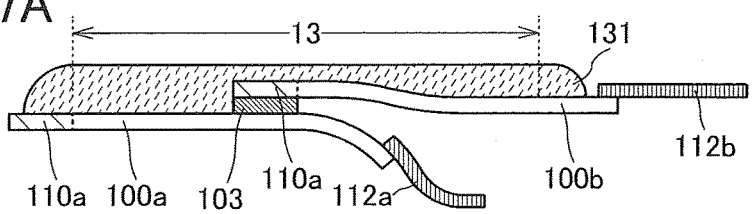
FIGS. 27A to 27D are cross-sectional views each illustrating an example of a display device.

In FIG. 27A, a resin layer 131 covers front surfaces of the display panel 100a and the display panel 100b. The resin layer 131 is preferably provided to cover the display regions of the display panels 100a and 100b and a region where the display panel 100a overlaps with the display panel 100b.

Providing the resin layer 131 over the plurality of display panels 100 can increase the mechanical strength of the display device 12. In addition, the resin layer 131 is formed to have a flat surface, whereby the display quality of an image displayed on the display region 13 can be increased. For example, when a coating apparatus such as a slit coater, a curtain coater, a gravure coater, a roll coater, or a spin coater is used, the resin layer 131 with high flatness can be formed.

The refractive index of the resin layer 131 is preferably 0.8 to 1.2 times, further preferably 0.9 to 1.1 times, and still further preferably 0.95 to 1.15 times as high as the refractive index of the substrate on the display surface side of the display panel 100. Light can be extracted outside more efficiently as the difference in refractive index between the display panel 100 and the resin layer 131 becomes smaller. In addition, the resin layer 131 with such a refractive index is provided to cover a step portion between the display panel 100a and the display panel 100b, whereby the step portion is not easily recognized visually, and the display quality of an image displayed on the display region 13 can be increased.

The resin layer 131 transmits visible light. For the resin layer 131, for example, an organic resin such as an epoxy resin, an aramid resin, an acrylic resin, a polyimide resin, a polyamide resin, or a polyamide-imide resin can be used.

Figure 27B:
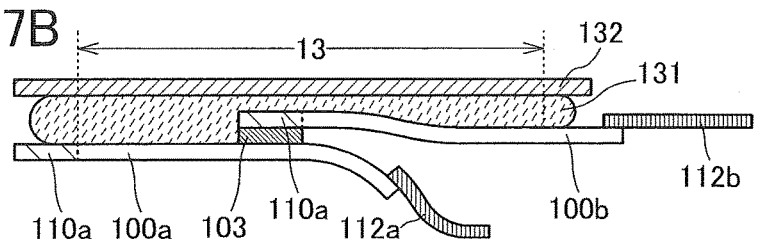

Alternatively, as illustrated in FIG. 27B, a protective substrate 132 is preferably provided over the display device 12 with the resin layer 131 provided therebetween. In that case, the resin layer 131 may serve as a bonding layer for bonding the protective substrate 132 to the display device 12. With the protective substrate 132, the surface of the display device 12 can be protected, and moreover, the mechanical strength of the display device 12 can be increased. For the protective substrate 132, a light-transmitting material is used at least in a region overlapping with the display region 13. Furthermore, the protective substrate 132 may have a light-blocking property in a region other than the region overlapping with the display region 13 so as not to be visually recognized.

The protective substrate 132 may function as a touch panel. In the case where the display panel 100 is flexible and capable of being bent, the protective substrate 132 is also preferably flexible.

Furthermore, a difference in refractive index between the protective substrate 132 and the substrate on the display surface side of the display panel 100 or the resin layer 131 is preferably less than or equal to 20%, further preferably less than or equal to 10%, and still further preferably less than or equal to 5%.

As the protective substrate 132, a plastic substrate that is formed as a film can be used. For the plastic substrate, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon or aramid), a polycycloolefin resin, a polystyrene resin, a polyamide imide resin, a polyvinyl chloride resin, a polyetheretherketone (PEEK) resin, a polysulfone (PSF) resin, a polyetherimide (PEI) resin, a polyarylate (PAR) resin, a polybutylene terephthalate (PBT) resin, a polytetrafluoroethylene (PTFE) resin, a silicone resin, or the like can be used. Alternatively, a substrate in which a fibrous body is impregnated with a resin (also referred to as prepreg) or a substrate whose coefficient of linear expansion is reduced by mixing an organic resin with an inorganic filler can be used. The protective substrate 132 is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used. Note that the display device or the display panel of one embodiment of the present invention may be attached to an acrylic plate, a glass plate, a wooden plate, a metal plate, or the like. The display surface of the display device or that of the display panel or the surface opposite to the display surface thereof may be attached to these plates (in the case where the display surface is attached to any of these plates, a plate transmitting visible light is used). It is preferable that the display device or the display panel be detachably attached to any of these plates.

As the protective substrate 132, at least one of a polarizing plate, a circular polarizing plate, a retardation plate, an optical film, and the like may be used.

Figure 27C:
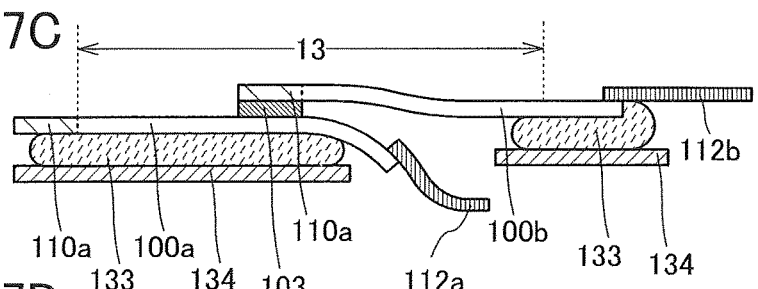

As illustrated in FIG. 27C, a resin layer 133 and a protective substrate 134 can be provided on surfaces opposite to the display surfaces of the display panels 100a and 100b. Providing a substrate supporting the display panels on the rear surfaces of the display panels can suppress unintended warping or bending of the display panels, whereby the display surfaces can be kept smooth. Thus, the display quality of an image displayed on the display region 13 can be improved.

Note that the resin layer 133 and the protective substrate 134, which are provided on the sides opposite to the display surfaces, do not necessarily have light transmittance, and a material which absorbs or reflects visible light may be used.

Figure 27D:
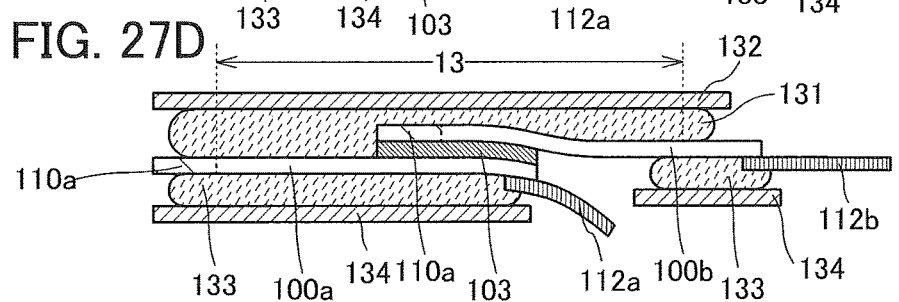

As illustrated in FIG. 27D, the resin layer 131 and the protective substrate 132 can be provided on the front surfaces of the display panels, and the resin layer 133 and the protective substrate 134 may be provided on the rear surfaces thereof. In this manner, the display panels 100a and 100b are sandwiched between the two protective substrates, whereby the mechanical strength of the display device 12 can be further increased.

It is preferable that the total thickness of the resin layer 131 and the protective substrate 132 be approximately the same as that of the resin layer 133 and the protective substrate 134. For example, it is preferable that the thicknesses of the resin layers 131 and 133 be made substantially equal to each other, and materials having the same thickness be used for the protective substrates 132 and 134. In that case, the plurality of display panels 100 can be located at the center of the stack in the thickness direction. For example, when the stack including the display panels 100 at the center in the thickness direction is bent, stress in the lateral direction applied to the display panels 100 by bending can be relieved, which prevents the display panels 100 from being damaged.

In the case where the thicknesses of the resin layer and the protective substrate differ between an end portion and a center portion of the display device, for example, the total thickness of the resin layer 131 and the protective substrate 132 and that of the resin layer 133 and the protective substrate 134 are preferably compared under the same condition which is appropriately selected from conditions such as the average thickness, the largest thickness, the smallest thickness, and the like.

In FIG. 27D, the same material is preferably used for the resin layers 131 and 133 because the manufacturing cost can be reduced. Similarly, the same material is preferably used for the protective substrates 132 and 134 because the manufacturing cost can be reduced.

As illustrated in FIGS. 27C and 27D, an opening for leading the FPC 112a is preferably provided in the resin layer 133 and the protective substrate 134, which are located on the rear surface sides of the display panels 100a and 100b. In particular, when the resin layer 133 is provided to cover part of the FPC 112a as illustrated in FIG. 27D, the mechanical strength at a connection portion between the display panel 100a and the FPC 112a can be increased, and defects such as separation of the FPC 112a can be suppressed. Similarly, the resin layer 133 is preferably provided to cover part of the FPC 112b.

The display device of one embodiment of the present invention preferably has high resolution such as FHD (1920×1080), 4K2K (e.g., 3840×2048 or 4096×2160), or 8K4K (e.g., 7680×4320 or 8192×4320).

<Structure Example of Display Panel>

As described above, in the display panel 100, the region 110 that transmits visible light and the display region 101 are adjacent to each other. The display region 109 is adjacent to and positioned between the display region 101 and the region 120 that blocks visible light. The structure near the boundaries between these components is described below.

Figure 28A:
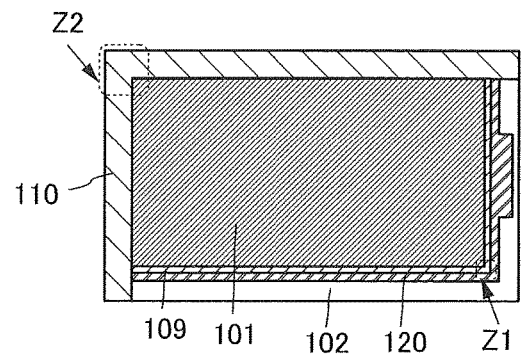
FIGS. 28A to 28D are top views and a cross-sectional view illustrating an example of a display panel.

FIG. 28A is a top view of the display panel 100. The display panel 100 illustrated in FIG. 28A includes the display region 101, the display region 109, and the region 102. The region 102 includes the region 110 that transmits visible light and the region 120 that blocks visible light. The region 110 that transmits visible light is adjacent to the display region 101. The display region 109 is adjacent to and positioned between the display region 101 and the region 120 that blocks visible light.

In the display panel 100 illustrated in FIG. 28A, the region 110 that transmits visible light is provided along two sides of the display region 101. The display region 109 is provided along two sides of the display region 101. The region 110 that transmits visible light is provided along one of the two opposite sides of the display region 101, while the display region 109 is provided along the other. The region 120 that blocks visible light is provided along the display region 109.

Figure 28B:
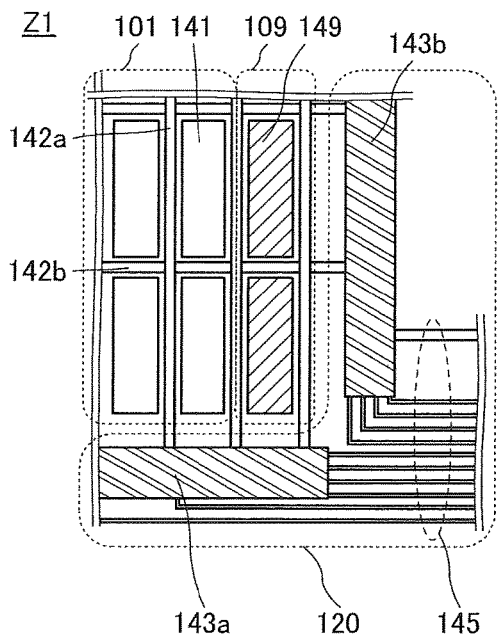

FIG. 28B is an enlarged view of a region Z1 illustrated in FIG. 28A. The region Z1 is in the vicinity of the boundary between the region 120 that blocks visible light and the display region 109.

Figure 28C:
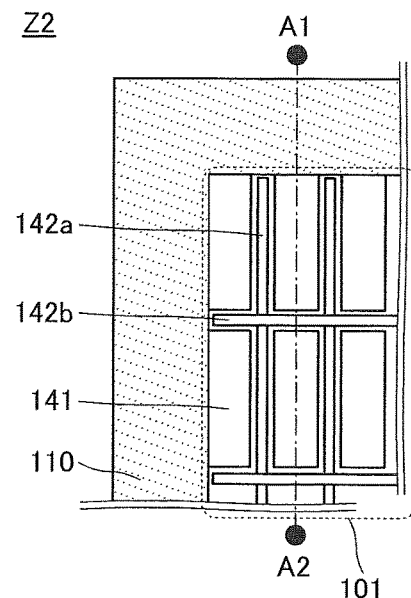

FIG. 28C is an enlarged view of a region Z2 illustrated in FIG. 28A. The region Z2 is in the vicinity of the boundary between the region 110 that transmits visible light and the display region 101.

A wiring 142a and a wiring 142b are electrically connected to each pixel 141. The wiring 142a and the wiring 142b are electrically connected to each pixel 149. Each of the plurality of wirings 142a intersects with the wiring 142b, and is electrically connected to a circuit 143a. The plurality of wirings 142b are electrically connected to a circuit 143b. One of the circuits 143a and 143b is a scan line driver circuit, and the other is a signal line driver circuit. One or both of the circuits 143a and 143b are not necessarily provided.

In FIG. 28B, a plurality of wirings 145 electrically connected to the circuit 143a or the circuit 143b are provided. The wiring 145 is electrically connected to an FPC in an unillustrated region and supplies a signal from the outside to the circuits 143a and 143b.

In FIG. 28B, a region including the circuit 143a, the circuit 143b, the plurality of wirings 145, and the like corresponds to the region 120 that blocks visible light.

In FIG. 28A, a region outside the pixel 141 provided closest to the end corresponds to the region 110 that transmits visible light. The region 110 that transmits visible light does not include members that blocks visible light, such as the pixel 141, the wiring 142a, and the wiring 142b. Note that in the case where part of the pixel 141, the wiring 142a, or the wiring 142b transmits visible light, the part of the pixel 141, the wiring 142a, or the wiring 142b may be provided to extend to the region 110 that transmits visible light.

Figure 28D:
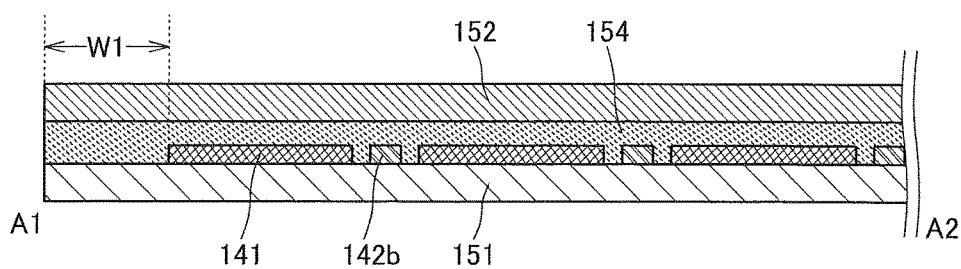

FIG. 28D is a cross-sectional view taken along line A1-A2 in FIG. 28C. The display panel 100 includes a pair of substrates (a substrate 151 and a substrate 152) that transmits visible light. The substrate 151 and the substrate 152 are bonded to each other with a bonding layer 154. Here, the substrate on which the pixel 141, the wiring 142b, and the like are formed is referred to as the substrate 151.

As illustrated in FIGS. 28C and 28D, in the case where the pixel 141 is positioned closest to the end of the display region 101, the width $W_1$ of the region 110 that transmits visible light is the distance between an end portion of the substrate 151 or the substrate 152 and an end portion of the pixel 141.

Note that the end portion of the pixel 141 refers to an end portion of a member that is positioned closest to the end and blocks visible light in the pixel 141. Alternatively, in the case where a light-emitting element including a layer containing a light-emitting material between a pair of electrodes is used as the pixel 141, the end portion of the pixel 141 may be any of an end portion of a lower electrode, an end portion of the layer containing a light-emitting material, and an end portion of an upper electrode.

Figure 29A:
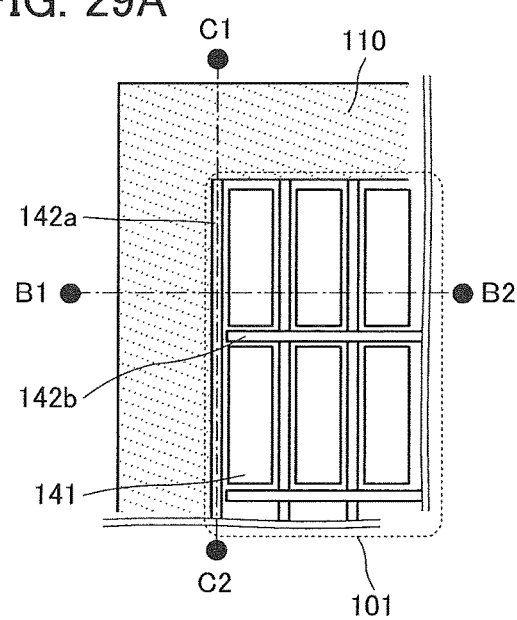
FIGS. 29A to 29C are a top view and cross-sectional views illustrating an example of a display panel.
Figure 29B:
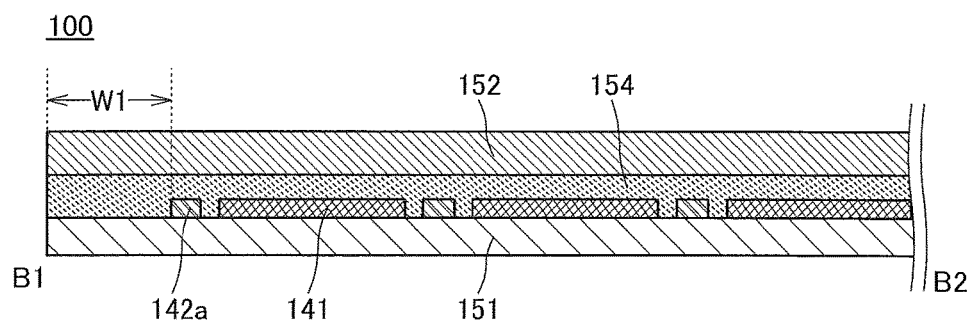

FIG. 29A is an example of a top view in which the region Z2 is enlarged; the position of the wiring 142a is different from that in FIG. 28C. FIG. 29B is a cross-sectional view taken along dashed-dotted line B1-B2 in FIG. 29A, and FIG. 29C is a cross-sectional view taken along dashed-dotted line C1-C2 in FIG. 29A.

Figure 29C:
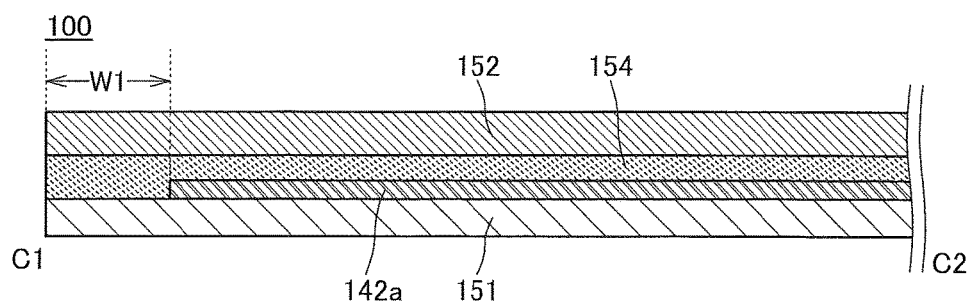

As illustrated in FIGS. 29A to 29C, in the case where the wiring 142a is positioned closest to the end of the display region 101, the width $W_1$ of the region 110 that transmits visible light is the distance between the end portion of the substrate 151 or the substrate 152 and the end portion of the wiring 142a. In the case where the wiring 142a transmits visible light, the region 110 that transmits visible light may include a region where the wiring 142a is provided.

As described above, the display device of one embodiment of the present invention includes overlapping two display panels. A display region of the display panel on the lower side overlaps with, on a display surface side, the region that transmits visible light of the display panel on the upper side. In the display panel, the area of the display element included in the pixel that is closest to the region that blocks visible light is larger than the area of the display element included in each of the other pixels. Alternatively, in the display panel, a display region including a dummy pixel is provided between the region that blocks visible light and the display region. The dummy pixel has the same color as the pixel that is the closest to the dummy pixel in the display region. The gate signal and the source signal supplied to the dummy pixel are the same as the gate signal and the source signal supplied to the pixel that is the closest to the dummy pixel in the display region. Accordingly, when the positions of the display panels are shifted in a direction such that the two display panels are moved away from each other, an image can be prevented from appearing divided near the boundary between the two display panels. Thus, a user is less likely to recognize the seam between the display panels.

This embodiment can be combined with any other embodiment as appropriate.

Embodiment 2

In this embodiment, a display panel that can be used for the display device of one embodiment of the present invention will be described with reference to the drawings.

In this embodiment, a display panel that uses an EL element as a display element is described as an example.

The display panel can have a structure in which sub-pixels of three colors of red (R), green (G), and blue (B) express one color, a structure in which sub-pixels of four colors of R, G, B, and white (W) express one color, a structure in which sub-pixels of four colors of R, G, B, and yellow (Y) express one color, or the like. There is no particular limitation on the color element and colors other than R, G, B, W, and Y (e.g., cyan or magenta) may be used.

Structure Example 1

FIGS. 30A and 30B show top views of a display panel 370.

The display panels 370 illustrated in FIGS. 30A and 30B each include the region 110 that transmits visible light, a display portion 381, and a driver circuit portion 382. In the example illustrated in FIG. 30A, the region 110 that transmits visible light is adjacent to the display portion 381 and provided along two sides of the display portion 381. In the example illustrated in FIG. 30B, the region 110 that transmits visible light is adjacent to the display portion 381 and provided along three sides of the display portion 381.

FIG. 30C is a cross-sectional view of the display panel 370 employing a color filter method and having a top-emission structure. FIG. 30C corresponds to cross-sectional views along dashed-dotted lines A1-A2 and A3-A4 in each of FIGS. 30A and 30B.

The display panel 370 includes a flexible substrate 371, a bonding layer 377, an insulating layer 378, a plurality of transistors, a capacitor 305, a conductive layer 307, an insulating layer 312, an insulating layer 313, an insulating layer 314, an insulating layer 315, a light-emitting element 304, a conductive layer 355, a spacer 316, a bonding layer 317, a coloring layer 325, a light-blocking layer 326, a flexible substrate 372, a bonding layer 375, and an insulating layer 376. The layers included in the region 110 that transmits visible light transmit visible light.

The driver circuit portion 382 includes a transistor 301. The display portion 381 includes a transistor 302 and a transistor 303.

Each transistor includes a gate, a gate insulating layer 311, a semiconductor layer, a source, and a drain. The gate and the semiconductor layer overlap with each other with the gate insulating layer 311 provided therebetween. Part of the gate insulating layer 311 functions as a dielectric of the capacitor 305. The conductive layer functioning as the source or the drain of the transistor 302 serves as one electrode of the capacitor 305.

In FIG. 30C, a bottom-gate transistor is illustrated. The structure of the transistor may be different between the driver circuit portion 382 and the display portion 381. The driver circuit portion 382 and the display portion 381 may each include a plurality of kinds of transistors.

The capacitor 305 includes a pair of electrodes and the dielectric therebetween. The capacitor 305 includes a conductive layer that is formed using the same material and the same step as the gate of the transistor and a conductive layer that is formed using the same material and the same step as the source and the drain of the transistor.

The insulating layer 312, the insulating layer 313, and the insulating layer 314 are each provided to cover the transistors and the like. The number of the insulating layers covering the transistors and the like is not particularly limited. The insulating layer 314 functions as a planarization layer. It is preferable that at least one of the insulating layer 312, the insulating layer 313, and the insulating layer 314 be formed using a material inhibiting diffusion of impurities such as water and hydrogen. Diffusion of impurities from the outside into the transistors can be effectively inhibited, leading to improved reliability of the display panel.

In the case where the insulating layer 314 is formed using an organic material, impurities such as moisture might enter the light-emitting element 304 and the like from the outside of the display panel through the insulating layer 314 exposed at an end portion of the display panel. Deterioration of the light-emitting element 304 due to the entry of an impurity leads to deterioration of the display panel. Thus, as illustrated in FIG. 30C, it is preferable that an opening which reaches an inorganic film (here, the insulating layer 313) be formed in the insulating layer 314 so that an impurity such as moisture entering from the outside of the display panel does not easily reach the light-emitting element 304.

FIG. 34A is a cross-sectional view illustrating the case where the opening is not provided in the insulating layer 314. The insulating layer 314 is preferably provided in the entire area of the display panel as illustrated in FIG. 34A, in which case the yield of the separation step described below can be increased.

FIG. 34B is a cross-sectional view illustrating the case where the insulating layer 314 is not positioned at the end portion of the display panel. Since an insulating layer formed using an organic material is not positioned at the end portion of the display panel in the structure of FIG. 34B, entry of impurities into the light-emitting element 304 can be inhibited.

The light-emitting element 304 includes an electrode 321, an EL layer 322, and an electrode 323. The light-emitting element 304 may include an optical adjustment layer 324. The light-emitting element 304 emits light to the coloring layer 325 side.

The transistor, the capacitor, the wiring, and the like are provided to overlap with a light-emitting region of the light-emitting element 304, whereby an aperture ratio of the display portion 381 can be increased.

One of the electrode 321 and the electrode 323 functions as an anode and the other functions as a cathode. When a voltage higher than the threshold voltage of the light-emitting element 304 is applied between the electrode 321 and the electrode 323, holes are injected to the EL layer 322 from the anode side and electrons are injected to the EL layer 322 from the cathode side. The injected electrons and holes are recombined in the EL layer 322 and a light-emitting substance contained in the EL layer 322 emits light.

The electrode 321 is electrically connected to the source or the drain of the transistor 303, directly or through another conductive layer. The electrode 321 functions as a pixel electrode and is provided for each light-emitting element 304. Two adjacent electrodes 321 are electrically insulated from each other by the insulating layer 315.

The EL layer 322 is a layer containing a light-emitting material. As the light-emitting element 304, an organic EL element including an organic compound as a light-emitting material can be favorably used.

The EL layer 322 includes at least one light-emitting layer. The EL layer 322 may include a plurality of light-emitting layers. In addition to the light-emitting layer, the EL layer 322 can further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 322, either a low molecular compound or a high molecular compound can be used, and an inorganic compound may also be used. Each of the layers included in the EL layer 322 can be formed by any of the following methods: an evaporation method (including a vacuum evaporation method), a transfer method, a printing method, an inkjet method, a coating method, and the like.

The light-emitting element 304 may contain two or more kinds of light-emitting substances. Thus, for example, a light-emitting element that emits white light can be achieved. For example, light-emitting substances are selected so that two or more kinds of light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 31 preferably has two or more peaks in the wavelength range in a visible region (e.g., greater than or equal to 350 nm and less than or equal to 750 nm or greater than or equal to 400 nm and less than or equal to 800 nm).

Moreover, the light-emitting element 304 may be a single element including one EL layer or a tandem element in which EL layers are stacked with a charge generation layer provided therebetween.

As a light-emitting material, an inorganic compound such as a quantum dot can be used. A quantum dot is a semiconductor nanocrystal with a size of several nanometers and contains approximately $1 \times 10^3$ to $1 \times 10^6$ atoms. Since energy shift of quantum dots depends on their size, quantum dots made of the same substance emit light with different wavelengths depending on their size; thus, emission wavelengths can be easily adjusted by changing the size of quantum dots.

A quantum dot has an emission spectrum with a narrow peak, leading to emission with high color purity. In addition, a quantum dot is said to have a theoretical internal quantum efficiency of approximately 100%, and a quantum dot can be used as a light-emitting material to obtain a light-emitting element having high light emission efficiency. Furthermore, since a quantum dot which is an inorganic compound has high inherent stability, a light-emitting element which is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

As examples of a material included in a quantum dot, cadmium selenide, cadmium sulfide, cadmium telluride, zinc sulfide, indium phosphide, lead selenide, lead sulfide, a compound of selenium, zinc, and cadmium, a compound of cadmium, selenium, and sulfur, and the like can be given. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. It is preferable to use a core-shell or core-multishell quantum dot because the quantum efficiency of light emission can be significantly improved. Examples of the material of a shell include zinc sulfide and zinc oxide.

Examples of quantum dot materials include a colloidal quantum dot material, an alloyed quantum dot material, a core-shell quantum dot material, a core quantum dot material, and the like. A quantum dot material may contain an element such as cadmium (Cd), selenium (Se), zinc (Zn), sulfur (S), phosphorus (P), indium (In), tellurium (Te), lead (Pb), gallium (Ga), arsenic (As), or aluminum (Al), for example.

Quantum dots have a high proportion of surface atoms and thus have high reactivity and easily cohere together. For this reason, it is preferable that a protective agent be attached to, or a protective group be provided at the surfaces of quantum dots. In this manner, cohesion of quantum dots can be prevented and solubility in a solvent can be increased. It can also reduce reactivity and improve electrical stability.

The range of size (diameter) of quantum dots which is usually used is greater than or equal to 0.5 nm and less than or equal to 20 nm, preferably greater than or equal to 1 nm and less than or equal to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like.

Even when a light-emitting layer is composed of quantum dots and made without a host material, the quantum dots enable light emission efficiency to be ensured; thus, a light-emitting element which is favorable in terms of a lifetime can be obtained. In the case where the light-emitting layer is composed of quantum dots, the quantum dots preferably have core-shell structures (including core-multishell structures).

The electrode 323 functions as a common electrode and is provided for a plurality of light-emitting elements 304. A fixed potential is supplied to the electrode 323.

The light-emitting element 304 overlaps with the coloring layer 325 with the bonding layer 317 provided therebetween. The spacer 316 overlaps with the light-blocking layer 326 with the bonding layer 317 provided therebetween. Although FIG. 30C illustrates the case where a space is provided between the light-emitting element 304 and the light-blocking layer 326, the light-emitting element 304 and the light-blocking layer 326 may be in contact with each other. Although the spacer 316 is provided on the flexible substrate 371 side in the structure illustrated in FIG. 30C, the spacer 316 may be provided on the flexible substrate 372 side (e.g., in a position closer to the flexible substrate 371 than that of the light-blocking layer 326).

Owing to the combination of a color filter (the coloring layer 325) and a microcavity structure (the optical adjustment layer 324), light with high color purity can be extracted from the display panel. The thickness of the optical adjustment layer 324 is varied depending on the color of the pixel.

The coloring layer is a colored layer that transmits light in a specific wavelength range. For example, a color filter that transmits light in a specific wavelength range, such as red, green, blue, or yellow light, can be used. Examples of materials that can be used for the coloring layer include a metal material, a resin material, and a resin material containing a pigment or dye.

Note that one embodiment of the present invention is not limited to a color filter method, and a separate coloring method, a color conversion method, a quantum dot method, and the like may be employed.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using a metal material or a resin material containing pigment or dye. Note that it is preferable to provide the light-blocking layer in a region other than the pixel, such as the driver circuit unit, in which case undesired leakage of guided light or the like can be suppressed.

As illustrated in FIG. 34A, a display panel preferably includes an overcoat 329. The overcoat 329 can prevent impurities and the like contained in the coloring layer 325 from being diffused into the light-emitting element 304. The overcoat 329 is formed using a material that transmits light emitted from the light-emitting element 304. For example, it is possible to use an inorganic insulating film such as a silicon nitride film or a silicon oxide film, an organic insulating film such as an acrylic film or a polyimide film, or a stacked layer of an organic insulating film and an inorganic insulating film.

In the case where upper surfaces of the coloring layer 325 and the light-blocking layer 326 are coated with a material of the bonding layer 317, a material which has high wettability with respect to the material of the bonding layer 317 is preferably used as the material of the overcoat 329. For example, an oxide conductive film such as an indium tin oxide (ITO) film or a metal film such as an Ag film which is thin enough to transmit light is preferably used as the overcoat 329.

When the overcoat 329 is formed using a material that has high wettability with respect to the material for the bonding layer 317, the material for the bonding layer 317 can be uniformly applied. Thus, entry of bubbles in the step of attaching the pair of substrates to each other can be prevented, and thus defective display can be inhibited.

The insulating layer 378 and the flexible substrate 371 are attached to each other with the bonding layer 377. The insulating layer 376 and the flexible substrate 372 are attached to each other with the bonding layer 375. The insulating layer 376 and the insulating layer 378 are preferably highly resistant to moisture. The light-emitting element 304, the transistors, and the like are preferably provided between a pair of insulating layers which are highly resistant to moisture, in which case impurities such as moisture can be prevented from entering these elements, leading to higher reliability of the display panel.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

A connection portion 306 includes the conductive layer 307 and the conductive layer 355. The conductive layer 307 and the conductive layer 355 are electrically connected to each other. The conductive layer 307 can be formed using the same material and the same step as those of the source and the drain of the transistor. The conductive layer 355 is electrically connected to an external input terminal through which a signal or a potential from the outside is transmitted to the driver circuit portion 382. Here, an example in which an FPC 373 is provided as an external input terminal is shown. The FPC 373 and the conductive layer 355 are electrically connected to each other through a connector 319.

As the connector 319, any of various anisotropic conductive films (ACF), anisotropic conductive pastes (ACP), and the like can be used.

For each of the flexible substrates 371 and 372, a material such as glass, quartz, a resin, a metal, an alloy, or a semiconductor thin enough to have flexibility can be used. The substrate through which light is extracted from the light-emitting element is formed using a material which transmits the light. For example, the thickness of the flexible substrate is preferably greater than or equal to 1 μm and less than or equal to 200 μm, further preferably greater than or equal to 1 μm and less than or equal to 100 μm, still further preferably greater than or equal to 10 μm and less than or equal to 50 μm, and particularly preferably greater than or equal to 10 μm and less than or equal to 25 μm. The thickness and hardness of the flexible substrate are set in the range where mechanical strength and flexibility can be balanced against each other. The flexible substrate may have a single-layer structure or a stacked-layer structure.

A resin, which has a specific gravity smaller than that of glass, is preferably used for the flexible substrate, in which case the display panel can be lightweight as compared with the case where glass is used.

The substrate is preferably formed using a material with high toughness. In that case, a display panel with high impact resistance that is less likely to be broken can be provided. For example, when a resin substrate or a thin metal or alloy substrate is used, the display panel can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the display panel. The thickness of a substrate using a metal material or an alloy material is preferably greater than or equal to 10 μm and less than or equal to 200 μm, further preferably greater than or equal to 20 μm and less than or equal to 50 μm.

There is no particular limitation on a material of the metal substrate or the alloy substrate, but it is preferable to use, for example, aluminum, copper, nickel, or a metal alloy such as an aluminum alloy or stainless steel. Examples of a material for a semiconductor substrate include silicon and the like.

Furthermore, when a material with high thermal emissivity is used for the substrate, the surface temperature of the display panel can be prevented from rising, leading to inhibition of breakage or a decrease in reliability of the display panel. For example, the substrate may have a stacked-layer structure of a metal substrate and a layer with high thermal emissivity (the layer can be formed using a metal oxide or a ceramic material, for example).

Examples of materials having flexibility and a light-transmitting property include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin. In particular, a material with a low coefficient of linear expansion is preferred, and for example, a polyamide imide resin, a polyimide resin, a polyamide resin, or PET can be suitably used. A substrate in which a fibrous body is impregnated with a resin, a substrate whose linear thermal expansion coefficient is reduced by mixing an inorganic filler with a resin, or the like can also be used.

The flexible substrate may have a stacked-layer structure in which at least one of a hard coat layer (e.g., a silicon nitride layer) by which a surface of the device is protected from damage, a layer for dispersing pressure (e.g., an aramid resin layer), and the like is stacked over a layer of any of the above-mentioned materials.

When a glass layer is used for the flexible substrate, a barrier property against water and oxygen can be improved and thus a highly reliable display panel can be provided.

For example, a flexible substrate in which a glass layer, a bonding layer, and a resin layer are stacked from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and high flexibility. The thickness of the resin layer is greater than or equal to 10 µm and less than or equal to 200 µm, preferably greater than or equal to 20 µm and less than or equal to 50 µm. By providing such a resin layer, occurrence of a crack and a break in the glass layer can be inhibited and mechanical strength can be improved. With the substrate that includes such a composite material of a glass material and a resin, a highly reliable flexible display panel can be provided.

For the bonding layer, various curable adhesives such as a photocurable adhesive (e.g., an ultraviolet curable adhesive), a reactive curable adhesive, a thermosetting adhesive, and an anaerobic adhesive can be used. Alternatively, an adhesive sheet or the like may be used.

Furthermore, the bonding layer may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because it can prevent impurities such as moisture from entering the functional element, thereby improving the reliability of the display panel.

When a filler with a high refractive index or a light scattering member is contained in the bonding layer, the efficiency of light extraction from the light-emitting element can be improved. For example, titanium oxide, barium oxide, zeolite, or zirconium can be used.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used. Any of a variety of display elements can be used in the display panel of one embodiment of the present invention. For example, a liquid crystal element, an electrophoretic element, a display element using MEMS, or the like may be used.

The light-emitting element may be a top-emission, or bottom-emission light-emitting element. A conductive film that transmits visible light is used as the electrode through which light is extracted. A conductive film that reflects visible light is preferably used as the electrode through which light is not extracted.

The conductive film that transmits visible light can be formed using, for example, indium oxide, ITO, indium zinc oxide, zinc oxide (ZnO), or ZnO to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used. An alloy containing silver and copper is preferable because of its high heat resistance. Further, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

The structure of the transistors in the display panel is not particularly limited. For example, a planar transistor, a forward staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

A semiconductor material used for the semiconductor layer of the transistor is not particularly limited, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). Further preferably, the oxide semiconductor contains an oxide represented by an In-M-Zn oxide (M is a metal such as Al, Ti, Ga, Ge, Y, Zr, Sn, La, Ce, Hf, or Nd).

A c-axis aligned crystalline oxide semiconductor (CAAC-OS) is preferably used as a semiconductor material for the transistors. Unlike an amorphous semiconductor, the CAAC-OS has few defect states, so that the reliability of the transistor can be improved. Moreover, since no grain boundary is observed in the CAAC-OS, a stable and uniform film can be formed over a large area, and stress that is caused by bending a flexible display device does not easily make a crack in a CAAC-OS film.

The CAAC-OS is a crystalline oxide semiconductor in which c-axes of crystals are oriented in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

The CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

An organic insulating material or an inorganic insulating material can be used for the insulating layers included in the display panel. Examples of resins include an acrylic resin, an epoxy resin, a polyimide resin, a polyamide resin, a polyimide-amide resin, a siloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The conductive layers included in the display panel can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, ITO, indium oxide containing tungsten, indium zinc oxide containing tungsten, indium oxide containing titanium, ITO containing titanium, indium zinc oxide, ZnO, ZnO to which gallium is added, or indium tin oxide containing silicon may be used. Alternatively, a semiconductor such as an oxide semiconductor or polycrystalline silicon whose resistance is lowered by containing an impurity element or the like, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Figure 31:
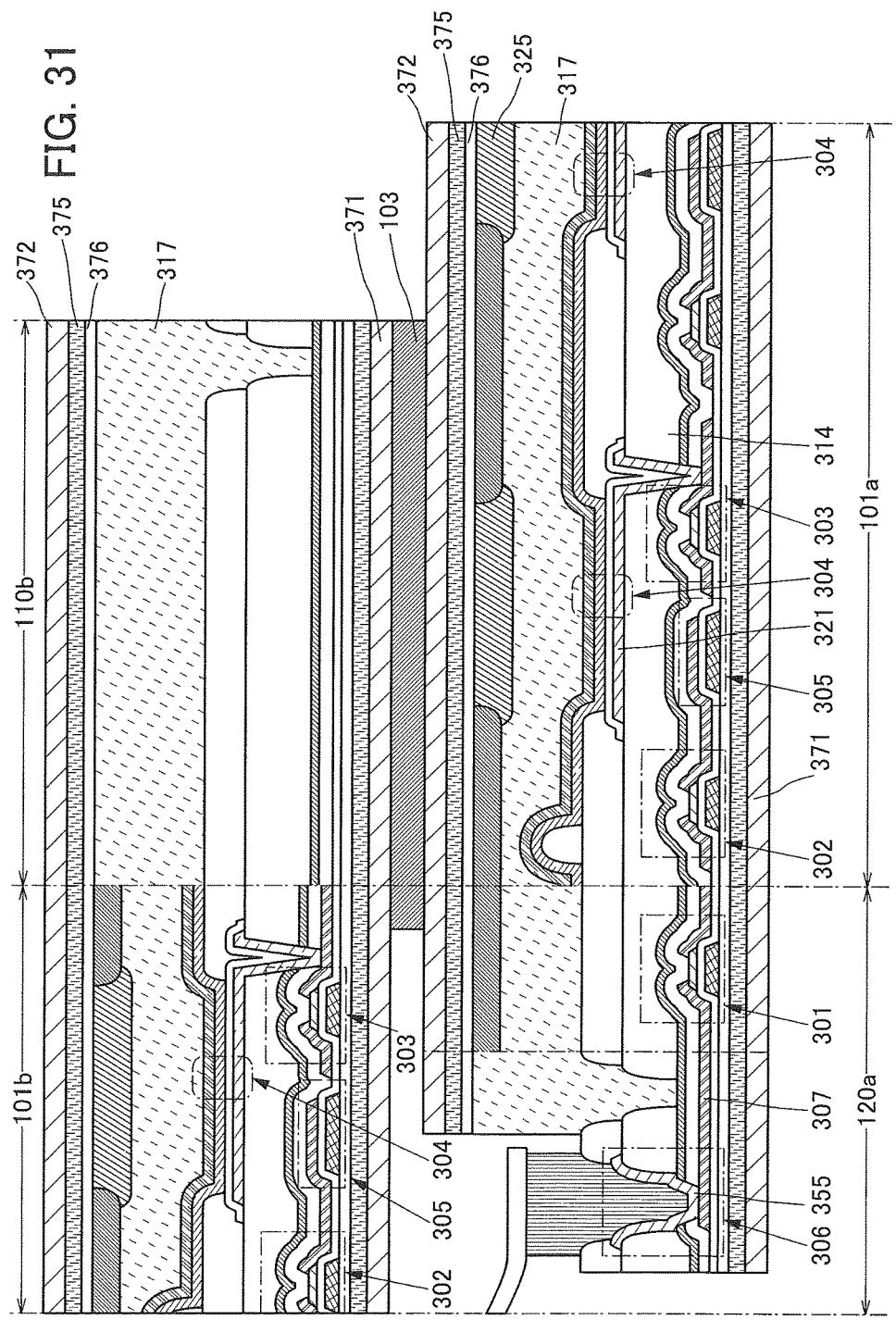
FIG. 31 is a cross-sectional view illustrating an example of a display device.

FIG. 31 is an example of a cross-sectional view of a display device including two display panels 370 illustrated in FIG. 30C that overlap with each other.

FIG. 31 illustrates the display region 101a (corresponding to the display portion 381 in FIG. 30C) and the region 120a that blocks visible light (corresponding to the driver circuit portion 382 and the like in FIG. 30C) of a lower display panel, and the display region 101b (corresponding to the display portion 381 in FIG. 30C) and the region 110b that transmits visible light (corresponding to the region 110 that transmits visible light in FIG. 30C) of an upper display panel.

In the display device illustrated in FIG. 31, the display panel positioned on the display surface side (upper side) includes the region 110b that transmits visible light adjacent to the display region 101b. The display region 101a of the lower display panel and the region 110b that transmits visible light of the upper display panel overlap with each other. Thus, a non-display region that appears between the display regions of the two display panels overlapping with each other can be reduced or even removed. Accordingly, a large display device in which a joint between display panels is hardly recognized by a user can be obtained.

The display device illustrated in FIG. 31 includes the light-transmitting layer 103 having a refractive index higher than that of air and transmitting visible light between the display region 101a and the region 110b that transmits visible light. In that case, air can be prevented from entering between the display region 101a and the region 110b that transmits visible light, so that the interface reflection due to a difference in refractive index can be reduced. In addition, display unevenness or luminance unevenness of the display device can be suppressed.

The light-transmitting layer 103 may overlap with the entire surface of the flexible substrate 372 of the lower display panel or that of the flexible substrate 371 of the upper display panel, or may overlap with only the display region 101a and the region 110b that transmits visible light. In addition, the light-transmitting layer 103 may overlap with the region 120a that blocks visible light.

For example, an attachment film in which attachment layers are provided on both surfaces of a base material can be used as the light-transmitting layer 103.

<Example of Manufacturing Method of Structure Example 1>

An example of a method for manufacturing the display panel 370 in the structure example 1 is described with reference to FIGS. 32A to 32C and FIGS. 33A and 33B. FIGS. 32A to 32C and FIGS. 33A and 33B are cross-sectional views illustrating a method for manufacturing the display portion 381 of the display panel 370.

Figure 32A:
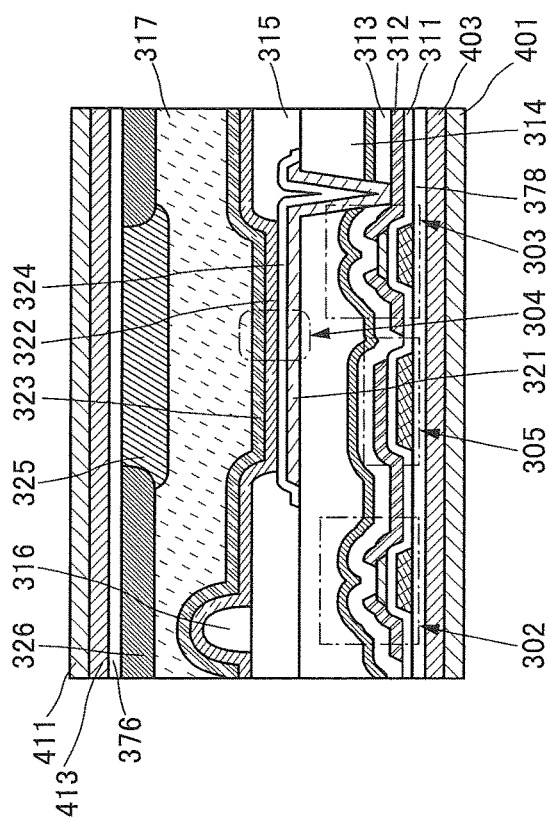
FIGS. 32A to 32C are cross-sectional views illustrating an example of a method for manufacturing a display panel.

As shown in FIG. 32A, a separation layer 403 is formed over a formation substrate 401. Next, a layer to be separated is formed over the separation layer 403. Here, the layer to be separated that is formed over the separation layer 403 corresponds to the layers from the insulating layer 378 to the light-emitting element 304 in FIGS. 30A to 30C.

As the formation substrate 401, a substrate having at least heat resistance high enough to withstand process temperature in a manufacturing process is used. As the formation substrate 401, for example, a glass substrate, a quartz substrate, a sapphire substrate, a semiconductor substrate, a ceramic substrate, a metal substrate, a resin substrate, or a plastic substrate can be used.

Note that it is preferable to use a large-sized glass substrate as the formation substrate 401 in terms of productivity. For example, a glass substrate having a size greater than or equal to the 3rd generation (550 mm×650 mm) and less than or equal to the 10th generation (2950 mm×3400 mm) or a glass substrate having a larger size than the 10th generation is preferably used.

In the case where a glass substrate is used as the formation substrate 401, as a base film, an insulating film such as a silicon oxide film, a silicon oxynitride film, a silicon nitride film, or a silicon nitride oxide film is preferably formed between the formation substrate 401 and the separation layer 403, in which case contamination from the glass substrate can be prevented.

The separation layer 403 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, titanium dioxide, indium oxide, ITO, indium zinc oxide, or an In—Ga—Zn oxide can be used. The separation layer 403 is preferably formed using a high-melting-point metal material such as tungsten, titanium, or molybdenum, in which case the degree of freedom of the process for forming the layer to be separated can be increased.

The separation layer 403 can be formed by, for example, a sputtering method, a plasma CVD method, a coating method (including a spin coating method, a droplet discharging method, a dispensing method, and the like), a printing method, or the like. The thickness of the separation layer 403 is, for example, greater than or equal to 1 nm and less than or equal to 200 nm, preferably greater than or equal to 10 nm and less than or equal to 100 nm.

In the case where the separation layer 403 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is an alloy of tungsten and molybdenum, for example.

In the case where the separation layer 403 is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment can be performed in an atmosphere of oxygen, nitrogen, or nitrous oxide alone, or a mixed gas of any of these gasses and another gas. Surface condition of the separation layer 403 is changed by the plasma treatment or heat treatment, whereby adhesion between the separation layer 403 and the insulating film formed later can be controlled.

Note that the separation layer is not necessary in the case where separation at the interface between the formation substrate and the layer to be separated is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is improved by laser light irradiation or heat treatment. Then, an insulating film, a transistor, and the like are formed over the organic resin. After that, separation at the interface between the formation substrate and the organic resin can be performed by performing laser light irradiation with energy density higher than that of the above laser light irradiation or performing heat treatment at a temperature higher than that of the above heat treatment. Moreover, the interface between the formation substrate and the organic resin may be filled with a liquid to perform separation.

The organic resin may be used for a substrate of the device. Alternatively, the organic resin may be removed and another substrate may be attached to an exposed surface of the layer to be separated with the use of an adhesive.

Alternatively, separation at the interface between a metal layer and the organic resin may be performed in the following manner: the metal layer is provided between the formation substrate and the organic resin and current is made to flow in the metal layer so that the metal layer is heated.

The insulating layer 378 preferably has a single-layer structure or a stacked-layer structure including any of a silicon nitride film, a silicon oxynitride film, a silicon oxide film, a silicon nitride oxide film, and the like.

The insulating layer 378 can be formed by a sputtering method, a plasma CVD method, a coating method, a printing method, or the like. For example, the insulating layer 378 is formed at a temperature higher than or equal to 250° C. and lower than or equal to 400° C. by a plasma CVD method, whereby the insulating layer 378 can be a dense film having an excellent moisture-resistant property. Note that the thickness of the insulating layer 378 is preferably greater than or equal to 10 nm and less than or equal to 3000 nm, or further preferably greater than or equal to 200 nm and less than or equal to 1500 nm.

Figure 32B:
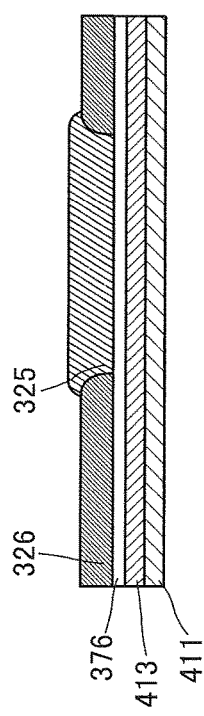

As shown in FIG. 32B, a separation layer 413 is formed over a formation substrate 411. Next, a layer to be separated is formed over the separation layer 413. Here, the layer to be separated that is formed over the separation layer 413 corresponds to the insulating layer 376, the light-blocking layer 326, and the coloring layer 325 in FIGS. 30A to 30C.

The formation substrate 411, the separation layer 413, and the insulating layer 376 can be formed using the materials that can be used for the formation substrate 401, the separation layer 403, and the insulating layer 378, respectively.

Figure 32C:
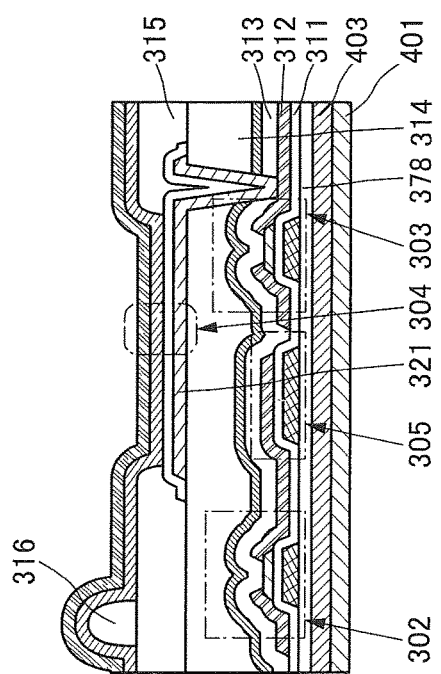

Then, as illustrated in FIG. 32C, the formation substrate 401 and the formation substrate 411 are attached to each other with the bonding layer 317.

Then, as illustrated in FIG. 33A, the formation substrate 401 and the insulating layer 378 are separated from each other. Note that either of the formation substrate 401 and the formation substrate 411 may be separated first.

Before the separation of the formation substrate 401 and the insulating layer 378, a separation starting point is preferably formed using laser light, a sharp knife, or the like. The insulating layer 378 is partly cracked (or broken), whereby the separation starting point can be formed. For example, laser light irradiation enables part of the insulating layer 378 to be melted, evaporated, or thermally broken.

Then, the insulating layer 378 and the formation substrate 401 are separated from the fainted separation starting point by physical force (e.g., a separation process with a human hand or a jig, or a separation process by rotation of a roller adhered to the substrate). In the lower part of FIG. 33A, the separation layer 403 and the formation substrate 401 that are separated from the insulating layer 378 are illustrated. After that, as illustrated in FIG. 33A, the exposed insulating layer 378 and the flexible substrate 371 are attached to each other with the bonding layer 377.

Then, as illustrated in FIG. 33B, the formation substrate 411 and the insulating layer 376 are separated from each other. In the upper part of FIG. 33B, the separation layer 413 and the formation substrate 411 that are separated from the insulating layer 376 are illustrated. Next, the exposed insulating layer 376 and the flexible substrate 372 are attached to each other with the bonding layer 375.

As described above, in one embodiment of the present invention, each of the functional elements and the like included in the display panel is formed over the formation substrate; thus, even in the case where a high-resolution display panel is manufactured, high alignment accuracy of the flexible substrate is not required. It is thus easy to attach the flexible substrate. In addition, since the functional element and the like can be fabricated with high temperatures, a highly reliable display panel can be obtained.

Structure Example 2

Figure 35A:
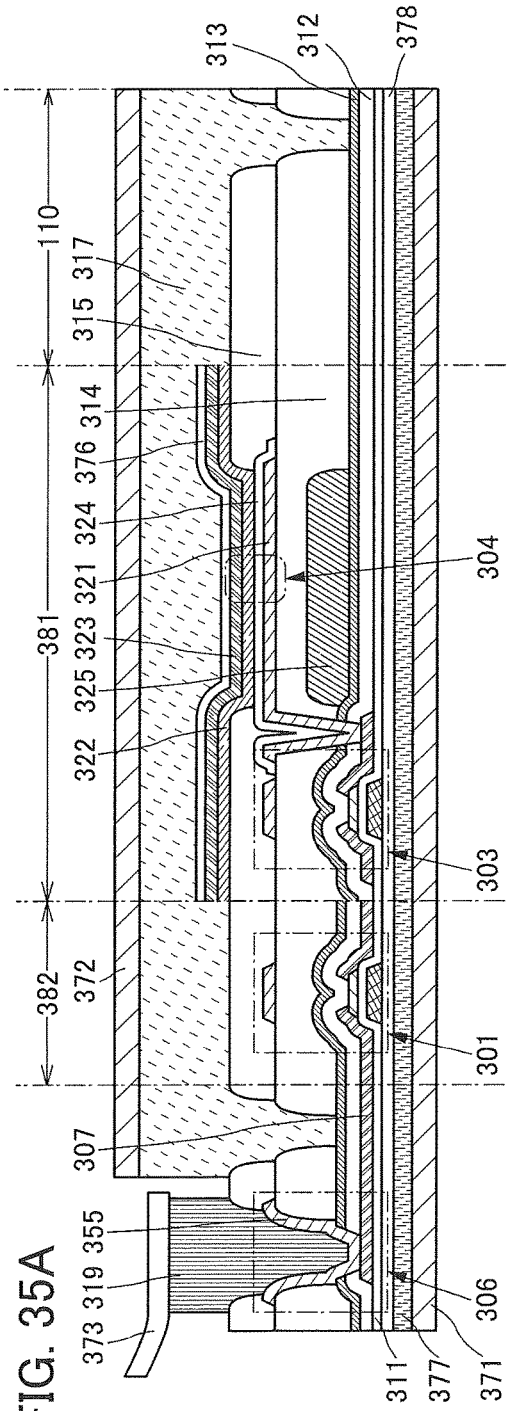
FIGS. 35A and 35B are cross-sectional views each illustrating an example of a display panel.

FIG. 35A shows a cross-sectional view of a display panel employing a color filter method. Note that in the following structure examples, components similar to those in the above structure example will not be described in detail.

The display panel in FIG. 35A includes the flexible substrate 371, the bonding layer 377, the insulating layer 378, a plurality of transistors, the conductive layer 307, the insulating layer 312, the insulating layer 313, the insulating layer 314, the insulating layer 315, the light-emitting element 304, the conductive layer 355, the bonding layer 317, the coloring layer 325, the flexible substrate 372, and the insulating layer 376.

The driver circuit portion 382 includes the transistor 301. The display portion 381 includes the transistor 303.

Each transistor includes two gates, the gate insulating layer 311, a semiconductor layer, a source, and a drain. The two gates each overlap with the semiconductor layer with the insulating layer provided therebetween. FIG. 35A illustrates an example where each transistor has a structure in which the semiconductor layer is sandwiched between the two gates. Such transistors can have higher field-effect mobility and thus have higher on-state current than other transistors. Consequently, a circuit capable of high-speed operation can be obtained. Furthermore, the area occupied by a circuit can be reduced. The use of the transistor having high on-state current can reduce signal delay in wirings and can reduce display luminance variation even in a display panel in which the number of wirings is increased because of an increase in size or resolution. FIG. 35A illustrates an example in which one of the gates is formed using the same material and the same step as the electrode 321.

The light-emitting element 304 emits light to the coloring layer 325 side. The light-emitting element 304 overlaps with the coloring layer 325 with the insulating layer 314 provided therebetween. The coloring layer 325 is provided between the light-emitting element 304 and the flexible substrate 371. FIG. 35A illustrates an example in which the coloring layer 325 is provided over the insulating layer 313. In the example illustrated in FIG. 35A, a light-blocking layer and a spacer are not provided.

Structure Example 3

Figure 35B:
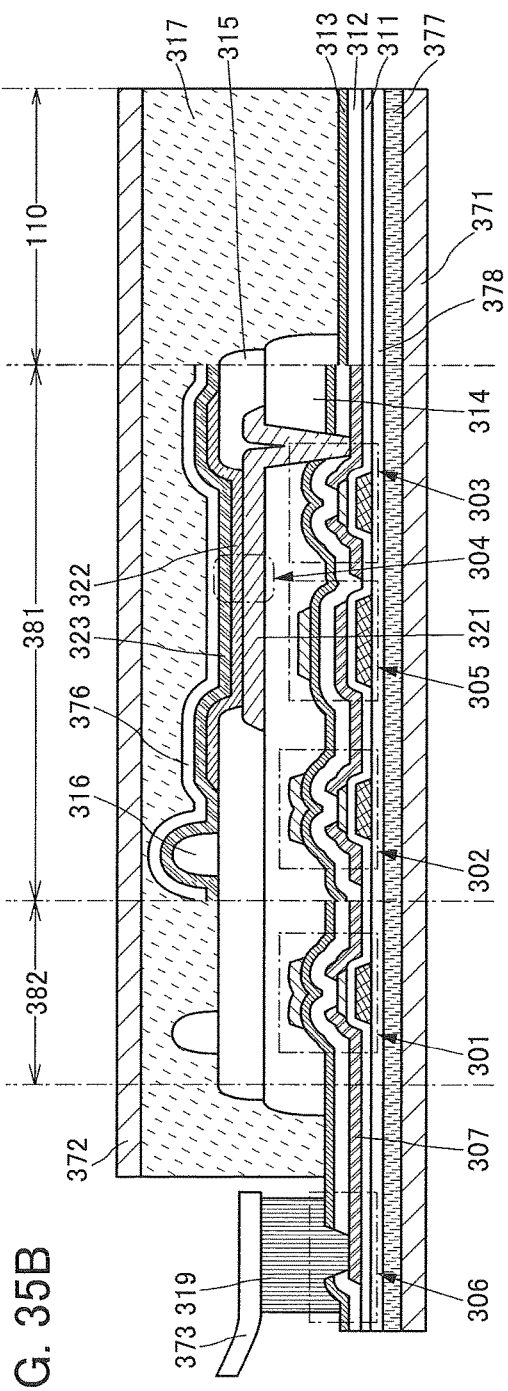

FIG. 35B shows a cross-sectional view of a display panel employing a separate coloring method.

The display panel in FIG. 35B includes the flexible substrate 371, the bonding layer 377, the insulating layer 378, a plurality of transistors, the conductive layer 307, the insulating layer 312, the insulating layer 313, the insulating layer 314, the insulating layer 315, the spacer 316, the light-emitting element 304, the bonding layer 317, the flexible substrate 372, and the insulating layer 376.

The driver circuit portion 382 includes a transistor 301. The display portion 381 includes the transistor 302, the transistor 303, and the capacitor 305.

Each transistor includes two gates, the gate insulating layer 311, a semiconductor layer, a source, and a drain. The two gates each overlap with the semiconductor layer with the insulating layer provided therebetween. FIG. 35B illustrates an example where each transistor has a structure in which the semiconductor layer is sandwiched between the two gates. In the example illustrated in FIG. 35B, one of the gates is formed between the insulating layer 313 and the insulating layer 314.

The light-emitting element 304 emits light to the flexible substrate 372 side. In the example illustrated in FIG. 35B, the light-emitting element 304 does not include an optical adjustment layer. The insulating layer 376 serves as a sealing layer for the light-emitting element 304.

The connection portion 306 includes the conductive layer 307. The conductive layer 307 is electrically connected to the FPC 373 through the connector 319.

Application Example

In one embodiment of the present invention, a display device provided with a touch sensor (also referred to as an input/output unit or a touch panel) can be manufactured.

There is no particular limitation on a sensor element included in the touch panel of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display panel and a sensor element that are separately formed are attached to each other and a structure in which an electrode and the like included in a sensor element are provided on one or both of a substrate supporting a display element and a counter substrate.

Structure Example 4

Figure 36A:
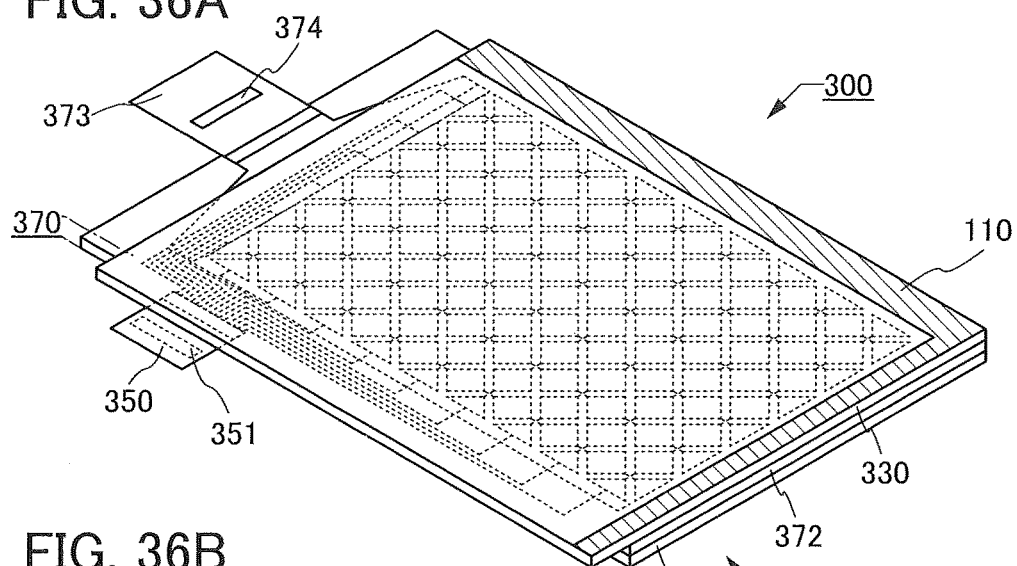
FIGS. 36A and 36B are perspective views illustrating an example of a touch panel.
Figure 36B:
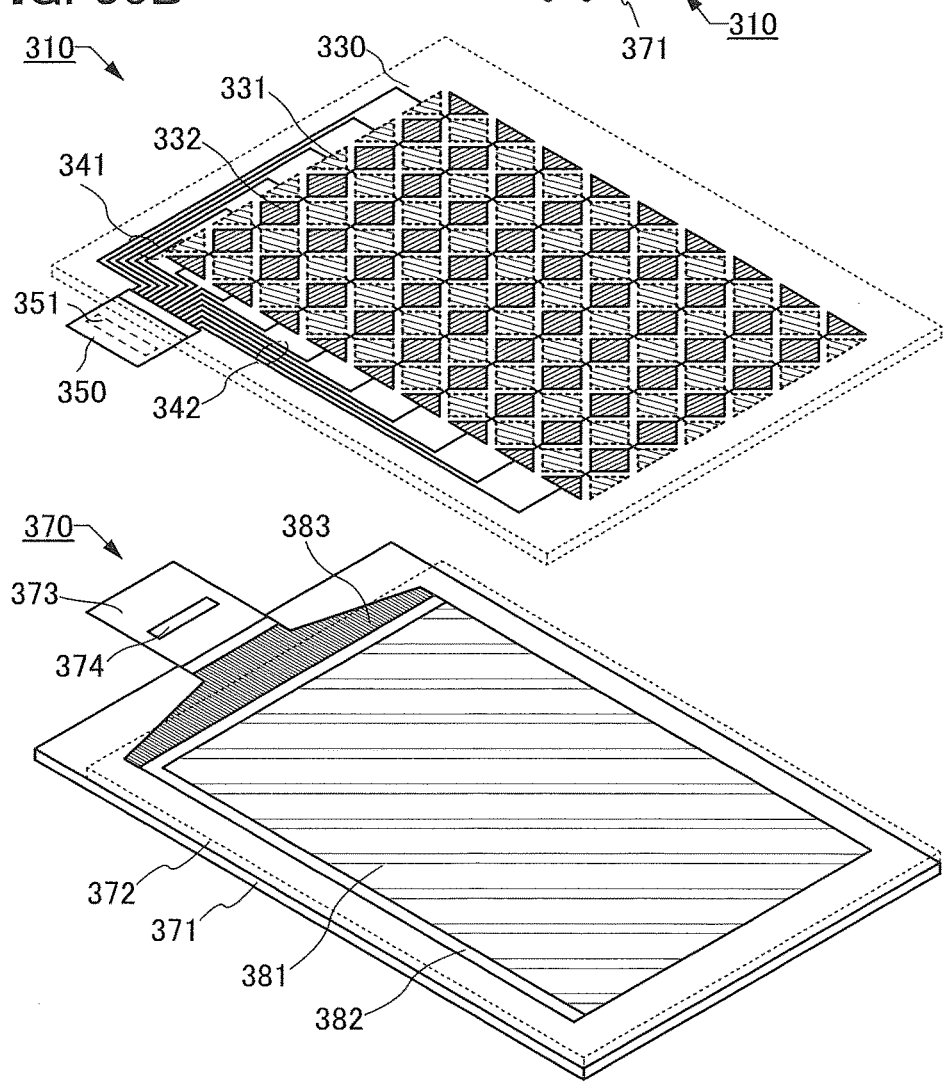

FIG. 36A is a schematic perspective view of a touch panel 300. FIG. 36B is a developed view of the schematic perspective view of FIG. 36A. Note that only typical components are illustrated for simplicity. In FIG. 36B, some components (such as the flexible substrate 330 and the flexible substrate 372) are illustrated only in dashed outline.

The touch panel 300 includes an input device 310 and the display panel 370, which are provided to overlap with each other. The touch panel 300 includes the region 110 that transmits visible light. The region 110 that transmits visible light is adjacent to the display portion 381 and provided along two sides of the display portion 381.

The input device 310 includes the flexible substrate 330, an electrode 331, an electrode 332, a plurality of wirings 341, and a plurality of wirings 342. An FPC 350 is electrically connected to each of the plurality of wirings 341 and the plurality of wirings 342. The FPC 350 is provided with an IC 351.

The display panel 370 includes the flexible substrate 371 and the flexible substrate 372 which are provided so as to face each other. The display panel 370 includes the display portion 381 and the driver circuit portion 382. A wiring 383 and the like are provided over the flexible substrate 371. The FPC 373 is electrically connected to the wiring 383. The FPC 373 is provided with an IC 374.

The wiring 383 has a function of supplying a signal and power to the display portion 381 and the driver circuit portion 382. The signal and power are each input to the wiring 383 from the outside or the IC 374 through the FPC 373.

Figure 37:
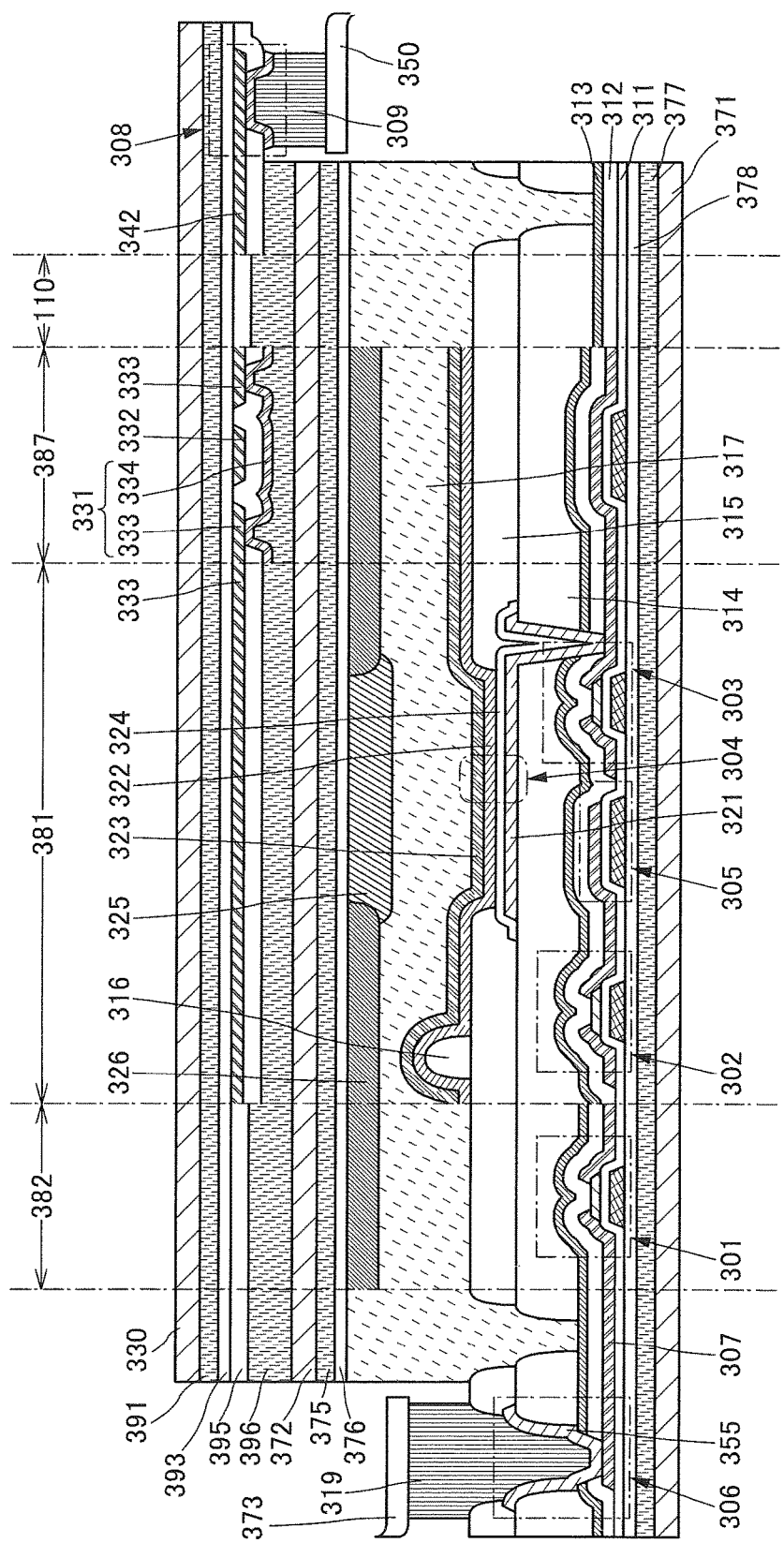
FIG. 37 is a cross-sectional view illustrating an example of a touch panel.

FIG. 37 illustrates an example of a cross-sectional view of the touch panel 300. FIG. 37 shows cross-sectional structures of the display portion 381, the driver circuit portion 382, the region 110 that transmits visible light, the region including the FPC 373, the region including the FPC 350, and the like. Furthermore, FIG. 37 illustrates a cross-sectional structure of a crossing portion 387 where a wiring formed by processing a conductive layer used for forming the gate of the transistor and a wiring formed by processing a conductive layer used for forming the source and the drain of the transistor cross each other.

The flexible substrate 371 and the flexible substrate 372 are attached to each other with the bonding layer 317. The flexible substrate 372 and the flexible substrate 330 are attached to each other with a bonding layer 396. Here, the layers from the flexible substrate 371 to the flexible substrate 372 correspond to the display panel 370. Furthermore, the layers from the flexible substrate 330 to the electrode 334 correspond to the input device 310. In other words, the bonding layer 396 attaches the display panel 370 and the input device 310 to each other. Alternatively, the layers from the flexible substrate 371 to the insulating layer 376 correspond to the display panel 370. Furthermore, the layers from the flexible substrate 330 to the flexible substrate 372 correspond to the input device 310. In other words, the bonding layer 375 attaches the display panel 370 and the input device 310 to each other.

The structure of the display panel 370 shown in FIG. 37 is similar to that of the display panel shown in FIGS. 30A to 30C and is thus not described in detail.

<Input Device 310>

On the flexible substrate 372 side of the flexible substrate 330, the electrode 331 and the electrode 332 are provided. An example where the electrode 331 includes an electrode 333 and the electrode 334 is described here. As illustrated in the crossing portion 387 in FIG. 37, the electrodes 332 and 333 are formed on the same plane. An insulating layer 395 is provided to cover the electrode 332 and the electrode 333. The electrode 334 electrically connects two electrodes 333, between which the electrode 332 is provided, through openings formed in the insulating layer 395.

In a region near the end portion of the flexible substrate 330, a connection portion 308 is provided. The connection portion 308 has a stack of a wiring 342 and a conductive layer formed by processing a conductive layer used for forming the electrode 334. The connection portion 308 is electrically connected to the FPC 350 through a connector 309.

The flexible substrate 330 is attached to the insulating layer 393 with the bonding layer 391. As in the manufacturing method for the structure example 1, the input device 310 can also be manufactured by forming elements over a formation substrate, separating the formation substrate, and then transferring the elements over the flexible substrate 330. Alternatively, the insulating layer 393, the elements, and the like may be directly formed on the flexible substrate 330 (see FIG. 38A).

Structure Example 5

Figure 38:
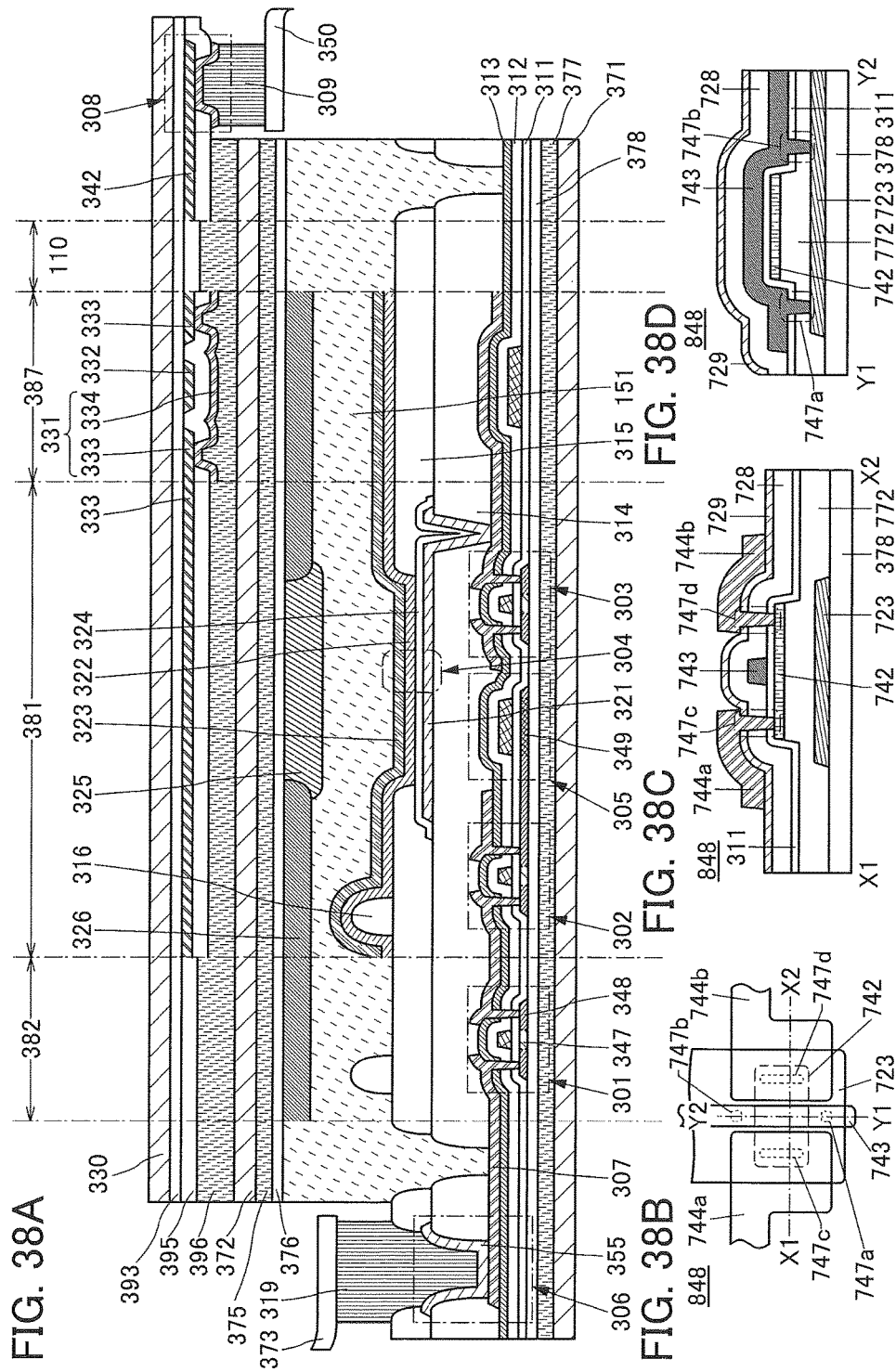
FIG. 38A is a cross-sectional view illustrating an example of a touch panel and FIGS. 38B to 38D are a top view and cross-sectional views of a transistor.

The touch panel shown in FIG. 38A is different from the touch panel in FIG. 37 in the structures of the transistors 301, 302, and 303 and the capacitor 305 and in not including the bonding layer 391.

FIG. 38A illustrates an example of using a top-gate transistor in the touch panel.

Each transistor includes a gate, the gate insulating layer 311, a semiconductor layer, a source, and a drain. The gate and the semiconductor layer overlap with each other with the gate insulating layer 311 provided therebetween. The semiconductor layer may include low-resistance regions 348. The low-resistance regions 348 function as the source and drain of the transistor.

The conductive layer over the insulating layer 313 functions as a lead wiring. The conductive layer is electrically connected to the region 348 through an opening provided in the insulating layer 313, the insulating layer 312, and the gate insulating layer 311.

In FIG. 38A, the capacitor 305 has a stacked-layer structure that includes a layer formed by processing a semiconductor layer used for forming the above-described semiconductor layer, the gate insulating layer 311, and a layer formed by processing a conductive layer used for forming the gate. Here, part of the semiconductor layer of the capacitor 305 preferably has a region 349 having a higher conductivity than a region 347 where the channel of the transistor is formed.

The region 348 and the region 349 each can be a region containing more impurities than the region 347 where the channel of the transistor is formed, a region with a high carrier concentration, a region with low crystallinity, or the like.

A transistor 848 illustrated in FIGS. 38B to 38D can be used in the display device of one embodiment of the present invention.

FIG. 38B is a top view of the transistor 848. FIG. 38C is a cross-sectional view in the channel length direction of the transistor 848 in the display device of one embodiment of the present invention. The cross section of the transistor 848 illustrated in FIG. 38C is taken along the dashed-dotted line X1-X2 in FIG. 38B. FIG. 38D is a cross-sectional view in the channel width direction of the transistor 848 in the display device of one embodiment of the present invention. The cross section of the transistor 848 illustrated in FIG. 38D is taken along the dashed-dotted line Y1-Y2 in FIG. 38B.

The transistor 848 is a type of top-gate transistor including a back gate.

In the transistor 848, a semiconductor layer 742 is formed over a projection of an insulating layer 772. When the semiconductor layer 742 is provided over the projection of the insulating layer 772, the side surface of the semiconductor layer 742 can also be covered with a gate 743. Thus, the transistor 848 has a structure in which the semiconductor layer 742 can be electrically surrounded by an electric field of the gate 743. Such a structure of a transistor in which a semiconductor film in which a channel is formed is electrically surrounded by an electric field of a conductive film is called a surrounded channel (s-channel) structure. A transistor with an s-channel structure is referred to as an s-channel transistor.

In the s-channel structure, a channel can be formed in the whole (bulk) of the semiconductor layer 742. In the s-channel structure, the drain current of the transistor can be increased, so that a larger amount of on-state current can be obtained. Furthermore, the entire channel formation region of the semiconductor layer 742 can be depleted by the electric field of the gate 743. Accordingly, the off-state current of the transistor with the s-channel structure can further be reduced.

A back gate 723 is provided over the insulating layer 378.

A conductive layer 744*a* provided over an insulating layer 729 is electrically connected to the semiconductor layer 742 through an opening 747*c* formed in the gate insulating layer 311, an insulating layer 728, and the insulating layer 729. A conductive layer 744*b* provided over the insulating layer 729 is electrically connected to the semiconductor layer 742 through an opening 747*d* formed in the gate insulating layer 311 and the insulating layers 728 and 729.

The gate 743 provided over the gate insulating layer 311 is electrically connected to the back gate 723 through an opening 747*a* and an opening 747*b* formed in the gate insulating layer 311 and the insulating layer 772. Accordingly, the same potential is supplied to the gate 743 and the back gate 723. Furthermore, either or both of the openings 747*a* and 747*b* may be omitted. In the case where both the openings 747*a* and 747*b* are omitted, different potentials can be supplied to the back gate 723 and the gate 743.

As a semiconductor in the transistor having the s-channel structure, an oxide semiconductor, silicon such as polycrystalline silicon or single crystal silicon that is transferred from a single crystal silicon substrate, or the like is used.

Structure Example 6

Figure 39:
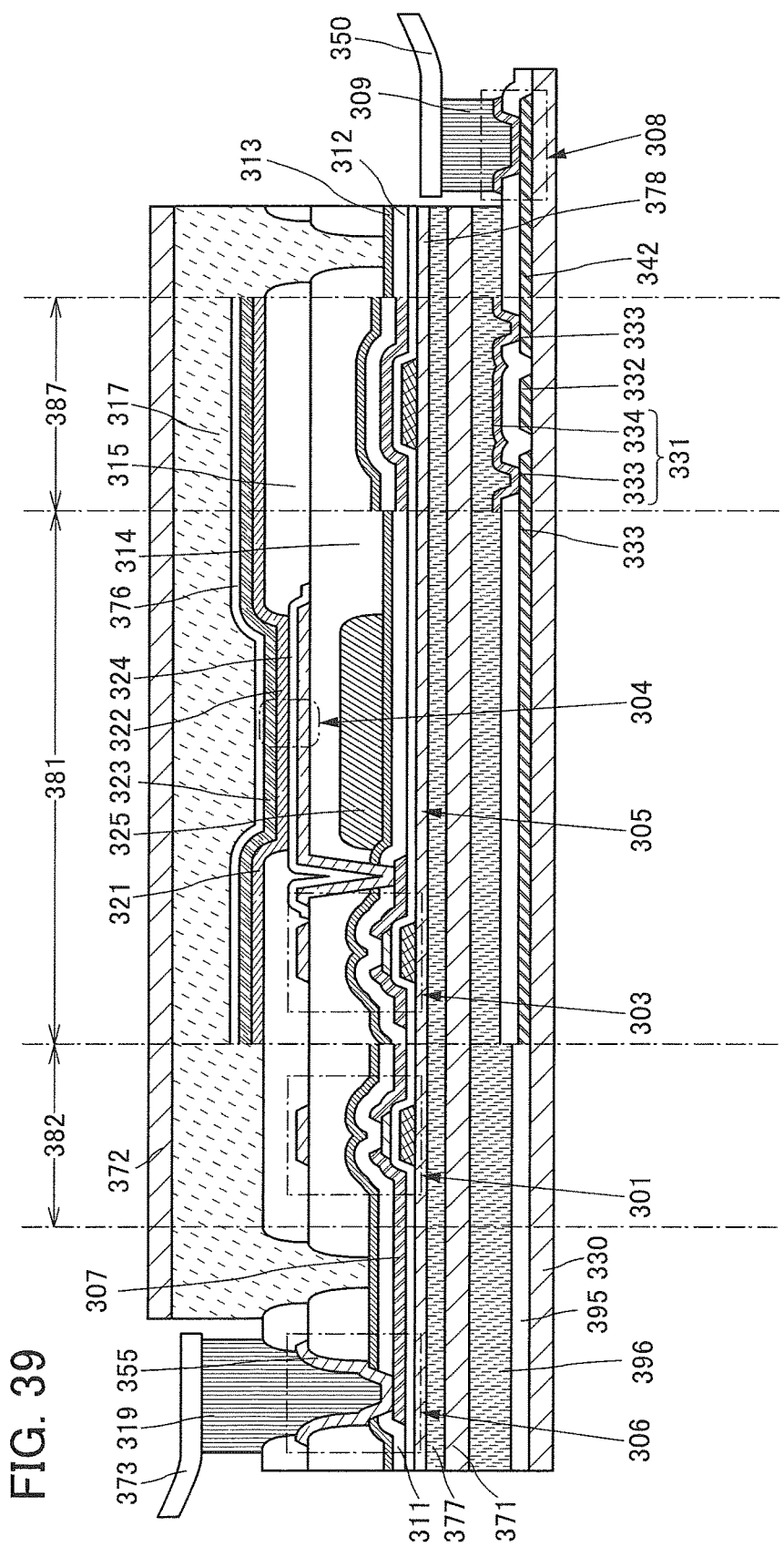
FIG. 39 is a cross-sectional view illustrating an example of a touch panel.

FIG. 39 shows an example of a touch panel in which a bottom-emission display panel and an input device are attached to each other with the bonding layer 396.

The display panel in FIG. 39 is different from that in FIG. 35A in that an insulating layer 376 is included. The input device in FIG. 39 is different from that in FIGS. 38A to 38D in that the insulating layer 393 is not provided and that the electrode 331, the electrode 332, and the like are provided directly on the flexible substrate 330.

Structure Example 7

Figure 40:
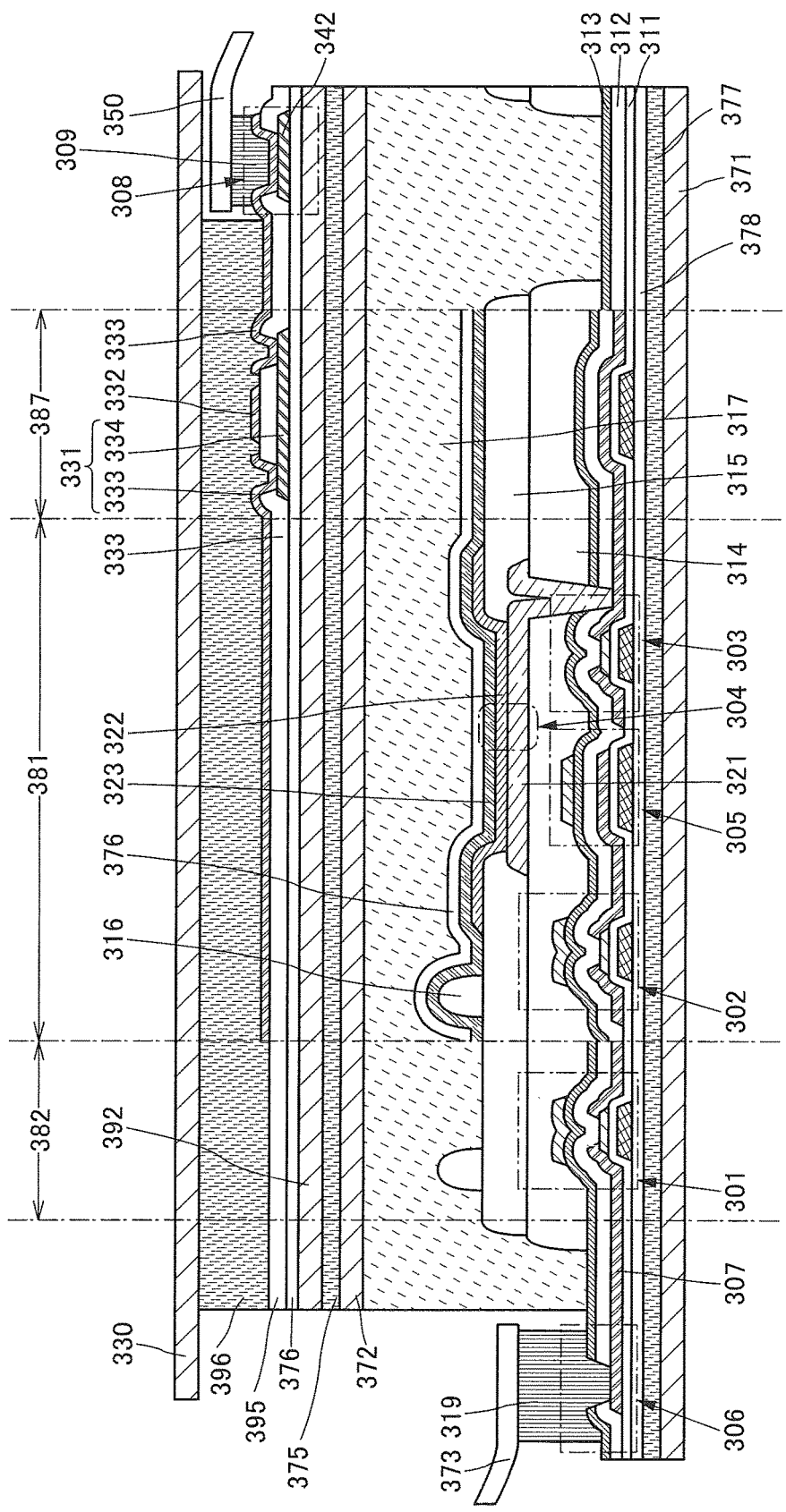
FIG. 40 is a cross-sectional view illustrating an example of a touch panel.

FIG. 40 shows an example of a touch panel in which a display panel using a separate coloring method and an input device are attached to each other with the bonding layer 375.

The display panel in FIG. 40 has a structure similar to that in FIG. 35B.

The input device in FIG. 40 includes the insulating layer 376 over a flexible substrate 392, and the electrode 334 and the wiring 342 over the insulating layer 376. The electrode 334 and the wiring 342 are covered with the insulating layer 395. The electrode 332 and the electrode 333 are provided over the insulating layer 395. The flexible substrate 330 is attached to the flexible substrate 392 with the bonding layer 396.

Structure Example 8

Figure 41:
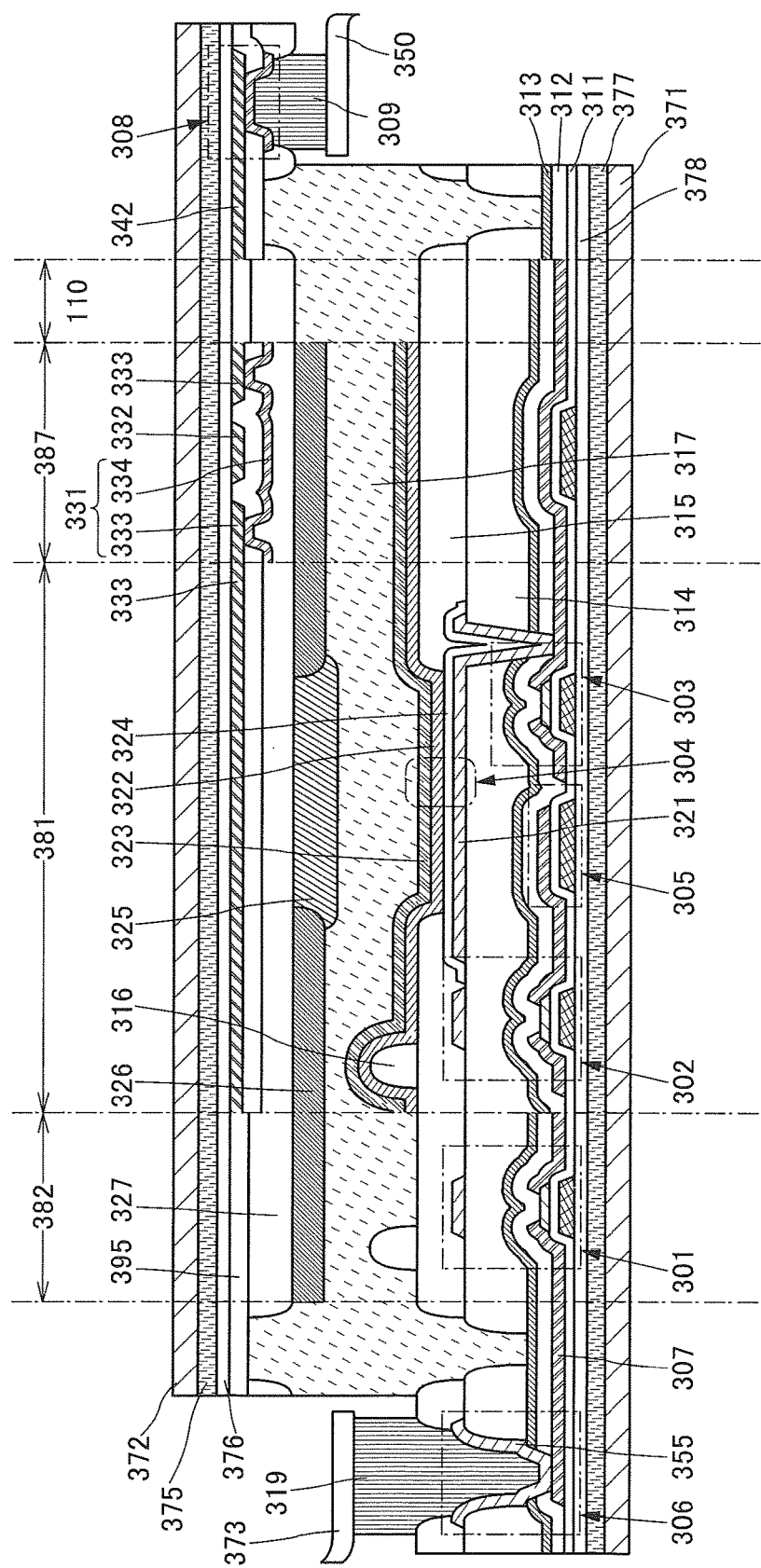
FIG. 41 is a cross-sectional view illustrating an example of a touch panel.

FIG. 41 shows an example in which a touch sensor and the light-emitting element 304 are provided between a pair of flexible substrates (the flexible substrate 371 and the flexible substrate 372). When two flexible substrates are used, the touch panel can be thin, lightweight, and flexible.

The structure in FIG. 41 can be fabricated by changing the structure of the layer to be separated that is formed over the formation substrate 411 in the manufacturing process example for the structure example 1. In the manufacturing process example for the structure example 1, as the layer to be separated that is formed over the formation substrate 411, the insulating layer 376, the coloring layer 325, and the light-blocking layer 326 are formed (FIG. 32B).

In the case where the structure in FIG. 41 is fabricated, after the insulating layer 376 is formed, the electrode 332, the electrode 333, and the wiring 342 are formed over the insulating layer 376. Then, the insulating layer 395 covering these electrodes is formed. Next, the electrode 334 is formed over the insulating layer 395. Then, the insulating layer 327 covering the electrode 334 is formed. After that, the coloring layer 325 and the light-blocking layer 326 are formed over the insulating layer 327. Then, attachment to the formation substrate 401 is performed, the formation substrates are separated, and the flexible substrate is attached; thus, the touch panel having the structure in FIG. 41 can be fabricated.

Structure Example 9

Figure 42A:
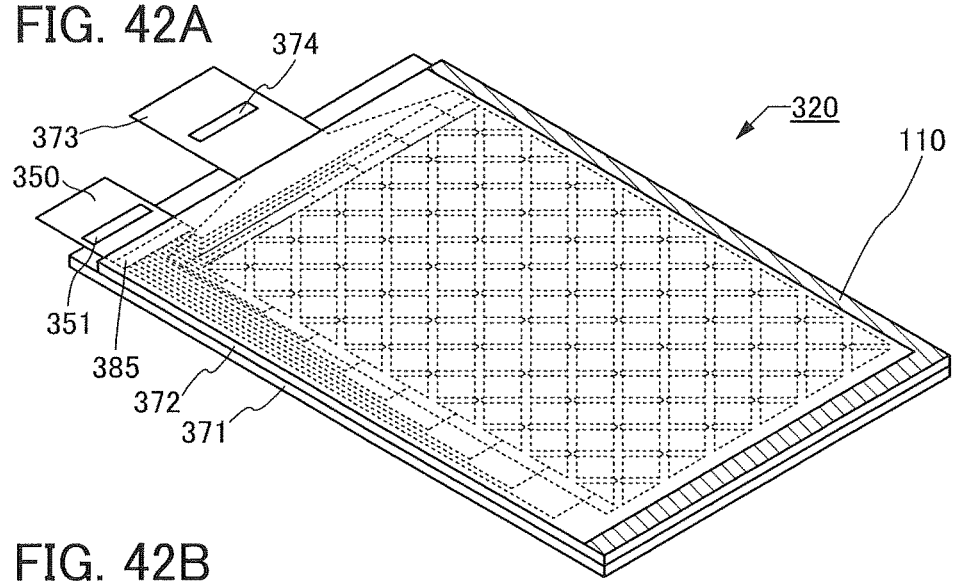
FIGS. 42A and 42B are perspective views illustrating an example of a touch panel.
Figure 42B:
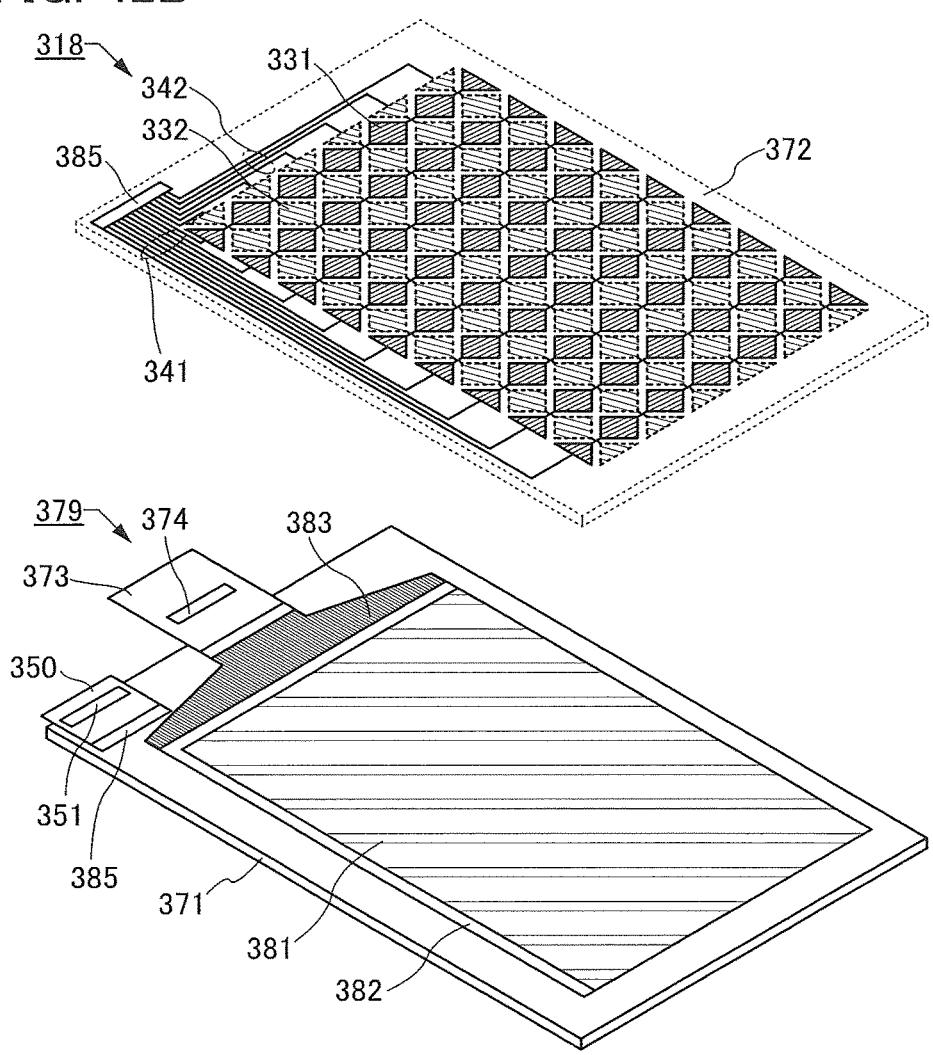

FIGS. 42A and 42B are schematic perspective views of a touch panel 320.

The touch panel 320 includes the region 110 that transmits visible light. The region 110 that transmits visible light is adjacent to the display portion 381 and provided along two sides of the display portion 381.

In FIGS. 42A and 42B, the flexible substrate 372 of a display panel 379 is provided with an input device 318. The wiring 341, the wiring 342, and the like of the input device 318 are electrically connected to the FPC 350 provided for the display panel 379.

With the above structure, the FPC connected to the touch panel 320 can be provided only on one substrate side (on the flexible substrate 371 side in this embodiment). FIGS. 42A and 42B illustrate the structure in which the touch panel 320 is provided with two FPCs. The touch panel 320 is not necessarily provided with a plurality of FPCs. When the touch panel 320 is provided with one FPC and signals are supplied to both the display panel 379 and the input device 318, the structure can be simplified.

The IC 374 has a function of driving the display panel 379. The IC 351 has a function of driving the input device 318.

Figure 43:
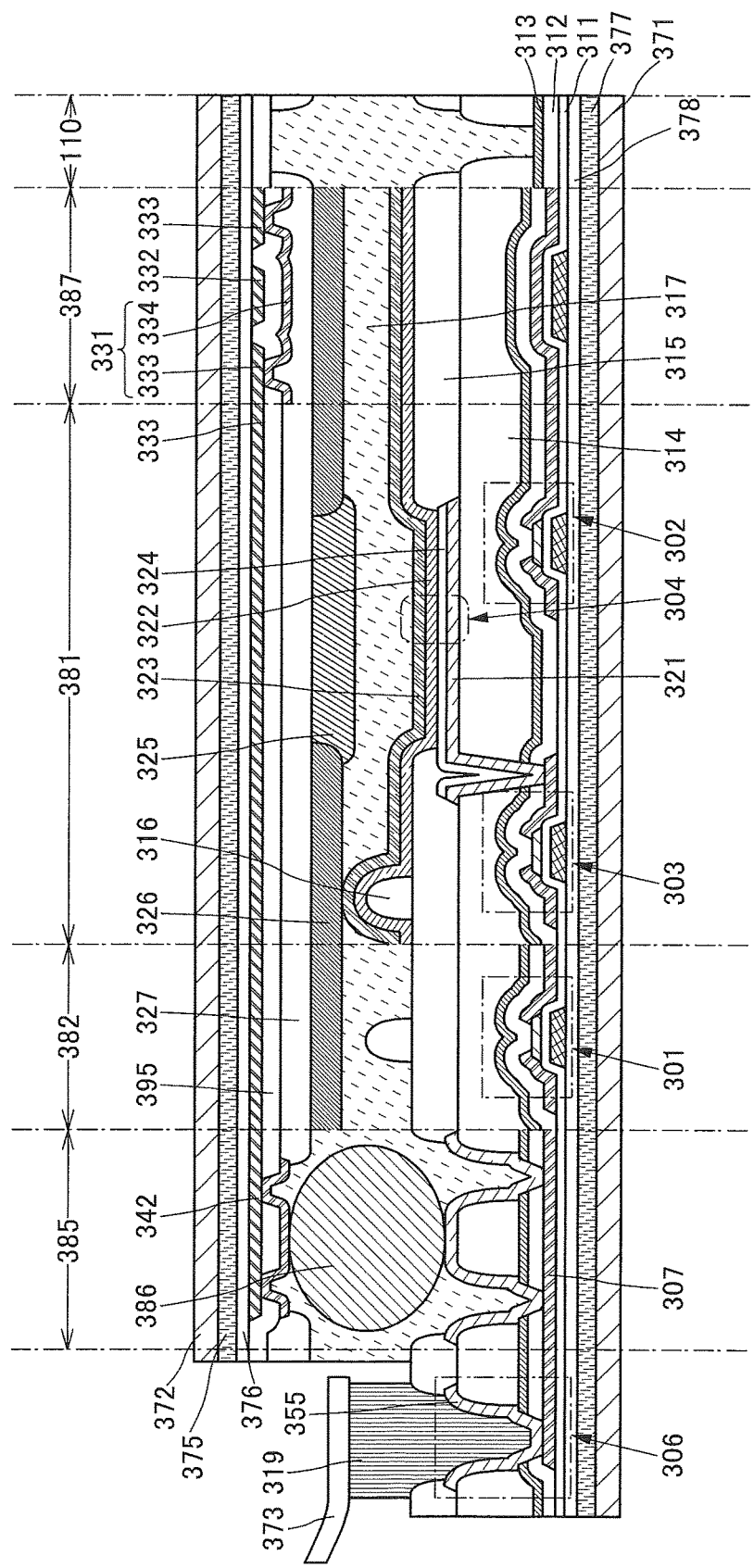
FIG. 43 is a cross-sectional view illustrating an example of a touch panel.

FIG. 43 illustrates an example of a cross-sectional view of the touch panel 320. FIG. 43 illustrates a cross-sectional structure of the display portion 381, the driver circuit portion 382, a connection portion 385, the region 110 that transmits visible light, the region including the FPC 373, and the like. Furthermore, FIG. 43 illustrates a cross-sectional structure of the crossing portion 387 where a wiring formed by processing a conductive layer used for forming the gate of the transistor and a wiring formed by processing a conductive layer used for forming the source and the drain of the transistor cross each other.

In the connection portion 385, one of the wirings 342 (or the wirings 341) and one of the conductive layers 307 are electrically connected to each other through a connector 386.

As the connector 386, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 386, a material capable of elastic deformation or plastic deformation is preferably used. As illustrated in FIG. 43, the conductive particle has a shape that is vertically crushed in some cases. With the crushed shape, the contact area between the connector 386 and a conductive layer electrically connected to the connector 386 can be increased, thereby reducing contact resistance and suppressing the generation of problems such as disconnection.

The connector 386 is preferably provided so as to be covered with the bonding layer 317. For example, a paste or the like for forming the bonding layer 317 may be applied, and then, the connectors 386 may be scattered in the connection portion 385. A structure in which the connection portion 385 is provided in a portion where the bonding layer 317 is provided can be similarly applied not only to a structure in which the bonding layer 317 is also provided over the light-emitting element 304 as illustrated in FIG. 43 (also referred to as a solid sealing structure) but also to, for example, a hollow sealing structure in which the bonding layer 317 is provided in the periphery of a light-emitting panel, a liquid crystal display panel, or the like.

FIG. 43 illustrates an example in which the optical adjustment layer 324 does not cover an end portion of the electrode 321. In the example in FIG. 43, the spacer 316 is also provided in the driver circuit portion 382.

Structure Example 10

In a touch panel illustrated in FIG. 44A, the light-blocking layer 326 is provided between the electrodes and the like in the touch sensor and the flexible substrate 372. Specifically, over the insulating layer 328, when seen from the flexible substrate 372 over which the light-blocking layer 326 is provided between the insulating layer 376 and the insulating layer 328, conductive layers such as the electrode 332, the electrode 333, and the wiring 342; the insulating layer 395 covering these components; the electrode 334 over the insulating layer 395; and the like are formed. Furthermore, the insulating layer 327 is provided over the electrode 334 and the insulating layer 395, and the coloring layer 325 is provided over the insulating layer 327.

The insulating layers 327 and 328 have a function as a planarization film. Note that the insulating layers 327 and 328 are not necessarily provided when not needed.

With such a structure, the light-blocking layer 326 provided in a position closer to the flexible substrate 372 side than the electrodes and the like of the touch sensor can prevent the electrodes and the like from being seen by a user. Thus, a touch panel with not only a small thickness but also improved display quality can be achieved.

As illustrated in FIG. 44B, the touch panel may include a light-blocking layer 326a between the insulating layer 376 and the insulating layer 328 and may include a light-blocking layer 326b between the insulating layer 327 and the bonding layer 317. Providing the light-blocking layer 326b can inhibit light leakage more surely.

This embodiment can be combined with any other embodiment as appropriate.

Embodiment 3

In this embodiment, electronic devices and lighting devices of embodiments of the present invention will be described with reference to drawings.

Examples of electronic devices include a television set, a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The electronic device or the lighting device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

In the display device of one embodiment of the present invention, the area of the display region can be increased unlimitedly by increasing the number of display panels. Thus, the display device of one embodiment of the present invention can be favorably used for digital signage, a PID, or the like. Furthermore, the shape of the display region of the display device of one embodiment of the present invention can be changed variously when the arrangement of the display panels is changed.

Figure 45A:
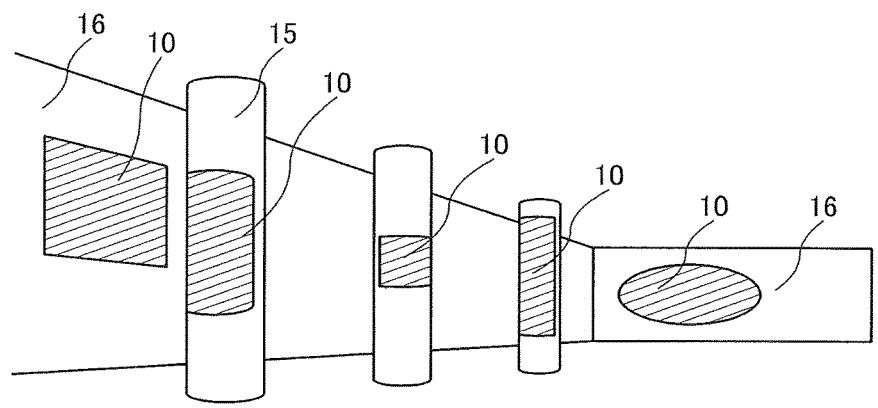
FIGS. 45A to 45F illustrate examples of electronic devices and a lighting device.

FIG. 45A illustrates an example in which the display device 10 of one embodiment of the present invention is provided for each of pillars 15 and walls 16. A flexible display panel is used as a display panel included in the display device 10, whereby the display device 10 can be placed along a curved surface.

Here, in particular, in the case where the display device of one embodiment of the present invention is used in digital signage or a HD, it is preferable to use a touch panel in a display panel because a device with such a structure does not just display a still or moving image on a display region, but can be operated by viewers intuitively. Alternatively, in the case where the display device of one embodiment of the present invention is used for providing information such as route information or traffic information, usability can be enhanced by intuitive operation. In the case of providing the display device on the walls of buildings, public facilities, or the like, a touch panel does not need to be used in the display panel.

FIGS. 45B to 45E illustrate examples of an electronic device including a display portion 7000 with a curved surface. The display surface of the display portion 7000 is bent, and images can be displayed on the bent display surface. The display portion 7000 may be flexible.

The display portion 7000 of each of the electronic devices illustrated in FIGS. 45B to 45E can be formed using the display device of one embodiment of the present invention.

Figure 45B:
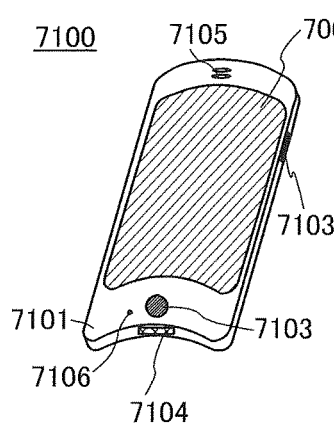

FIG. 45B illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 45B includes a touch sensor in the display portion 7000. Moreover, operations such as making a call and inputting a letter can be performed by touch on the display portion 7000 with a finger, a stylus, or the like.

With the operation buttons 7103, the power can be turned on or off. In addition, types of images displayed on the display portion 7000 can be switched; for example, switching images from a mail creation screen to a main menu screen is performed with the operation button 7103.

Figure 45C:
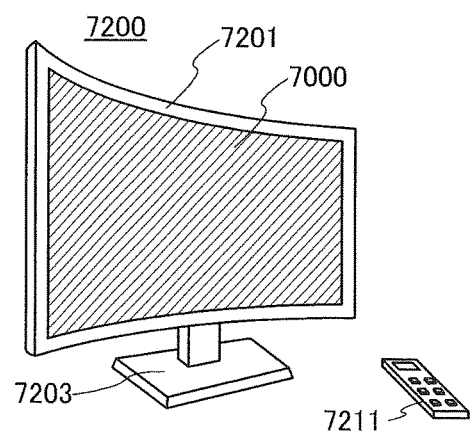

FIG. 45C illustrates an example of a television set. In a television set 7200, the display portion 7000 is incorporated into the housing 7201. Here, the housing 7201 is supported by a stand 7203.

The television set 7200 illustrated in FIG. 45C can be operated with an operation switch of the housing 7201 or a separate remote controller 7211. Furthermore, the display portion 7000 may include a touch sensor, and can be operated by touch on the display portion with a finger or the like. Furthermore, the remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, or the like. A general television broadcast can be received with the receiver. Furthermore, when the television set is connected to a communication network with or without wires via the modem, one-way (from a transmitter to a receiver) or two-way (between a transmitter and a receiver or between receivers) data communication can be performed.

Figure 45D:
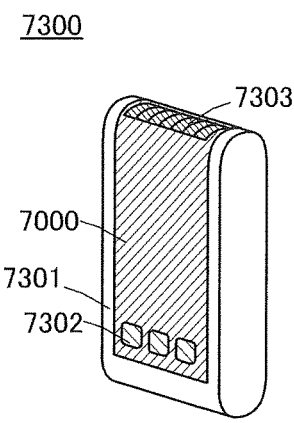

FIG. 45D illustrates an example of a portable information terminal. A portable information terminal 7300 includes a housing 7301 and the display portion 7000. The portable information terminal may also include an operation button, an external connection port, a speaker, a microphone, an antenna, a battery, or the like. The display portion 7000 is provided with a touch sensor. An operation of the portable information terminal 7300 can be performed by touching the display portion 7000 with a finger, a stylus, or the like.

Figure 45E:
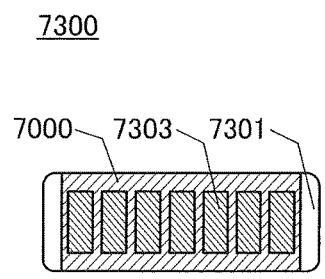

FIG. 45D is a perspective view of the portable information terminal 7300. FIG. 45E is a top view of the portable information terminal 7300.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminal 7300 can display letters or an image on its plurality of surfaces. For example, as illustrated in FIG. 45D, three operation buttons 7302 can be displayed on one surface, and information 7303 indicated by a rectangle can be displayed on another surface. FIGS. 45D and 45E illustrate an example in which information is displayed at the top of the portable information terminal. Alternatively, information may be displayed on the side of the portable information terminal. Information may also be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed in place of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

Figure 45F:
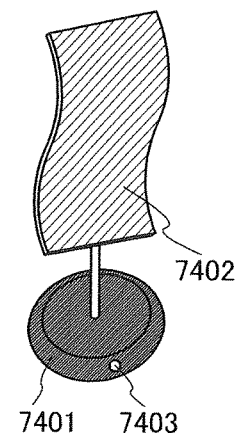

FIG. 45F illustrates an example of a lighting device having a curved light-emitting portion.

The light-emitting portion included in the lighting device illustrated in FIG. 45F can be manufactured using the display device of one embodiment of the present invention.

A lighting device 7400 illustrated in FIG. 45F includes a light-emitting portion 7402 having a wave-shaped light-emitting surface, which is a good-design lighting device.

The light-emitting portion included in the lighting device 7400 may be flexible. The light-emitting portion may be fixed on a plastic member, a movable frame, or the like so that a light-emitting surface of the light-emitting portion can be bent freely depending on the intended use.

The lighting device 7400 includes a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

FIGS. 46A1, 46A2, and 46B to 46I each illustrate an example of a portable information terminal including a display portion 7001 having flexibility.

The display portion 7001 is manufactured using the display device of one embodiment of the present invention. For example, a display device including a display panel that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

FIGS. 46A1 and 46A2 are a perspective view and a side view, respectively, illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power on/off, switching of displayed images, and the like can be performed. Although FIGS. 46A1, 46A2, and 46B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 46B illustrates the portable information terminal 7500 in a state where the display portion 7001 is pulled out. Images can be displayed on the display portion 7001 in this state. The display portion 7001 can be extracted by the display portion tab 7502. In addition, the portable information terminal 7500 may perform different displays in the state where part of the display portion 7001 is rolled as illustrated in FIG. 46A1 and in the state where the display portion 7001 is pulled out as illustrated in FIG. 46B. For example, in the state illustrated in FIG. 46A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 46C to 46E illustrate an example of a foldable portable information terminal. FIG. 46C illustrates a portable information terminal 7600 that is opened. FIG. 46D illustrates the portable information terminal 7600 that is being opened or being folded. FIG. 46E illustrates the portable information terminal 7600 that is folded. The portable information terminal 7600 is highly portable when folded, and is highly browsable when opened because of a seamless large display area.

A display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 46F and 46G illustrate an example of a foldable portable information terminal. FIG. 46F illustrates a portable information terminal 7650 that is folded so that the display portion 7001 is on the inside. FIG. 46G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 46H illustrates an example of a flexible portable information terminal. The portable information terminal 7700 includes a housing 7701 and the display portion 7001. In addition, the portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, and the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 46I illustrates an example of a wrist-watch-type portable information terminal. The portable information terminal 7800 includes a band 7801, the display portion 7001, an input-output terminal 7802, operation buttons 7803, or the like. The band 7801 has a function of a housing. A flexible battery 7805 can be mounted on the portable information terminal 7800. The battery 7805 may overlap with the display portion 7001 or the band 7801, for example.

The band 7801, the display portion 7001, and the battery 7805 have flexibility. Thus, the portable information terminal 7800 can be easily curved to have a desired shape.

With the operation button 7803, a variety of functions such as time setting, on/off of the power, on/off of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figures 47A, 47B, 47C:
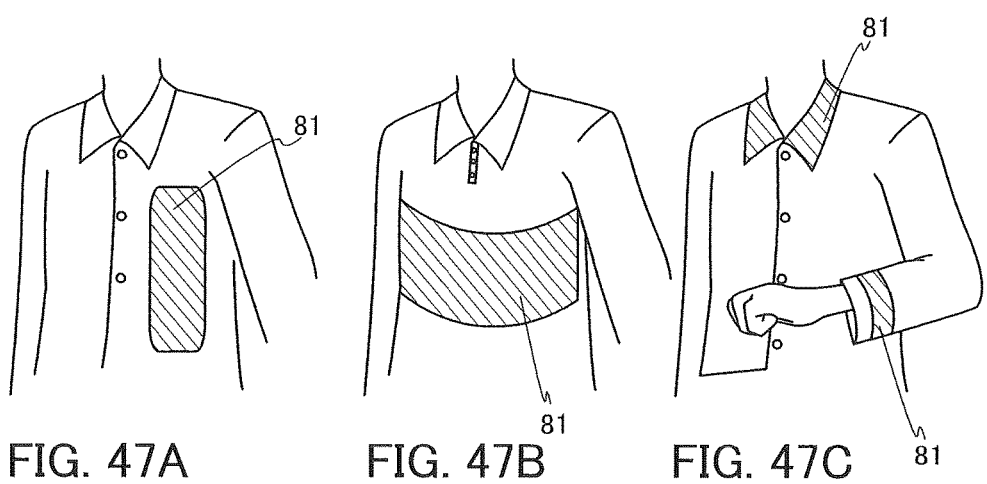
FIGS. 47A to 47C illustrate usage examples of a display device and an electronic device.

Since the display device of one embodiment of the present invention is flexible, thin, and lightweight, it can be used while being worn on clothes like a device 81 illustrated in FIGS. 47A to 47C.

Non-limiting examples of where the device 81 is to be attached include the front, back, collar, sleeve, and hood of clothes.

Non-limiting examples of the clothes to which the device 81 is attached include a top such as a shirt or a blouse; a bottom such as slacks or skirt; a dress; and overalls. The device 81 may be attached to a scarf, a necktie, or the like.

The device 81 is attached to the front of a shirt in FIG. 47A, the front of a polo shirt in FIG. 47B, and the collar and sleeve of a shirt in FIG. 47C.

The device 81 may be attachable to and detachable from clothes. For example, when the device 81 might be damaged by washing, the device is preferably detachable from clothes.

This embodiment can be combined with any other embodiment as appropriate.

REFERENCE NUMERALS

10: display device, 12: display device, 13: display region, 15: pillar, 16: wall, 31: light-emitting element, 36: pixel electrode, 38: common electrode, 40: light-emitting element, 41: display region, 49: display region, 51: signal line, 52: scan line, 55: power supply line, 70a: selection transistor, 70b: driving transistor, 70b1: driving transistor, 70b2: driving transistor, 70c: driving transistor, 72a: semiconductor layer, 72b1: semiconductor layer, 72b2: semiconductor layer, 74b: conductive layer, 76: conductive layer, 77: gate, 80: pixel circuit, 81: device, 83a: light-emitting region, 83b: light-emitting region, 85: capacitor, 100: display panel, 100a: display panel, 100b: display panel, 100c: display panel, 100d: display panel, 101: display region, 101a: display region, 101b: display region, 101c: display region, 101d: display region, 102: region, 102a: region, 102b: region, 103: light-transmitting layer, 109: display region, 109a: display region, 109b: display region, 110: region, 110a: region, 110b: region, 110c: region, 110d: region, 112a: FPC, 112b: FPC, 115b: IC, 120: region, 120a: region, 120b: region, 131: resin layer, 132: protective substrate, 133: resin layer, 134: protective substrate, 141: pixel, 141a: pixel, 141b: pixel, 141c: pixel, 141d: pixel, 142a: wiring, 142b: wiring, 145: wiring, 149: pixel, 149a: pixel, 154: bonding layer, 300: touch panel, 301: transistor, 302: transistor, 303: transistor, 304: light-emitting element, 305: capacitor, 306: connection portion, 307: conductive layer, 308: connection portion, 309: connector, 310: input device, 311: gate insulating layer, 312: insulating layer, 313: insulating layer, 314: insulating layer, 315: insulating layer, 316: spacer, 317: bonding layer, 318: input device, 319: connector, 320: touch panel, 321: electrode, 322: EL layer, 323: electrode, 324: optical adjustment layer, 325: coloring layer, 326: light-blocking layer, 326a: light-blocking layer, 326b: light-blocking layer, 327: insulating layer, 328: insulating layer, 329: overcoat, 330: flexible substrate, 331: electrode, 332: electrode, 333: electrode, 334: electrode, 341: wiring, 342: wiring, 347: region, 348: region, 349: region, 350: FPC, 351: IC, 355: conductive layer, 370: display panel, 371: flexible substrate, 372: flexible substrate, 373: FPC, 374: IC, 375: bonding layer, 376: insulating layer, 377: bonding layer, 378: insulating layer, 379: display panel, 381: display portion, 382: driver circuit portion, 383: wiring, 385: connection portion, 386: connector, 387: crossing portion, 391: bonding layer, 392: flexible substrate, 393: insulating layer, 395: insulating layer, 396: bonding layer, 401: formation substrate, 403: separation layer, 411: formation substrate, 413: separation layer, 723: back gate, 728: insulating layer, 729: insulating layer, 742: semiconductor layer, 743: gate, 744a: conductive layer, 744b: conductive layer, 747a: opening, 747b: opening, 747c: opening, 747d: opening, 772: insulating layer, 848: transistor, 7000: display portion, 7001: display portion, 7100: mobile phone, 7101: housing, 7103: operation button, 7104: external connection port, 7105: speaker, 7106: microphone, 7200: television set, 7201: housing, 7203: stand, 7211: remote controller, 7300: portable information terminal, 7301: housing, 7302: operation button, 7303: information, 7400: lighting device, 7401: stage, 7402: light-emitting portion, 7403: operation switch, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703a: button, 7703b: button, 7704a: speaker, 7704b: speaker, 7705: external connection port, 7706: microphone, 7709: battery, 7800: portable information terminal, 7801: band, 7802: input-output terminal, 7803: operation button, 7804: icon, 7805: battery.

This application is based on Japanese Patent Application serial no. 2015-176532 filed with Japan Patent Office on Sep. 8, 2015, the entire contents of which are hereby incorporated by reference.

The invention claimed is:

1. A display device comprising:
   a first display panel; and
   a second display panel,
   wherein the first display panel comprises a first display region and a region that transmits visible light,
   wherein the second display panel comprises a second display region, a third display region, and a region that blocks visible light,
   wherein the first display region is adjacent to the region that transmits visible light,
   wherein the third display region is positioned between the second display region and the region that blocks visible light and is adjacent to the second display region and the region that blocks visible light,
   wherein the region that transmits visible light is located on a display surface side of the second display region to overlap with the second display region, wherein the region that blocks visible light overlaps with the first display region, wherein at least one of the first display region and the region that transmits visible light overlaps with the third display region, wherein the second display region comprises a plurality of pixels arranged in m rows and n columns, wherein the third display region comprises a plurality of pixels arranged in a column direction, wherein the third display region is adjacent to the pixel in an n-th column in the second display region, wherein a gate signal and a source signal supplied to the pixel in an i-th row in the third display region are the same as a gate signal and a source signal supplied to the pixel in the i-th row and the n-th column in the second display region, wherein m and n separately represent an integer of greater than or equal to 2, and wherein i represents an integer of greater than or equal to 1 and less than or equal to m.

2. The display device according to claim 1, wherein the pixel in the i-th row and the n-th column in the second display region comprises a first light-emitting element and a first driving transistor, wherein the pixel in the i-th row in the third display region comprises a second light-emitting element and a second driving transistor, wherein a source or a drain of the first driving transistor is electrically connected to the first light-emitting element, and wherein a source or a drain of the second driving transistor is electrically connected to the second light-emitting element.

3. The display device according to claim 2, wherein an area of the second light-emitting element is larger than an area of the first light-emitting element.

4. The display device according to claim 3, wherein a W/L ratio between a channel length (L) and a channel width (W) of the second driving transistor is larger than a W/L ratio of the first driving transistor.

5. The display device according to claim 2, wherein the first driving transistor is a single-gate transistor, and wherein the second driving transistor is a dual-gate transistor.

6. The display device according to claim 1, wherein the second display panel comprises a plurality of source lines, and wherein the source lines in n+1-th and subsequent columns are connected to the source line in the n-th column.

7. The display device according to claim 1, wherein the pixel in the i-th row and the n-th column in the second display region comprises a first light-emitting element, a first driving transistor, and a selection transistor, wherein the pixel in the i-th row in the third display region comprises a second light-emitting element and a second driving transistor, wherein a source or a drain of the first driving transistor is electrically connected to the first light-emitting element, wherein a source or a drain of the second driving transistor is electrically connected to the second light-emitting element, and wherein a source or a drain of the selection transistor is electrically connected to a gate of the first driving transistor and a gate of the second driving transistor.

8. The display device according to claim 1, wherein the pixel in the i-th row and the n-th column in the second display region comprises a first light-emitting element, a selection transistor, and a first driving transistor, wherein the pixel in the i-th row in the third display region comprises a second light-emitting element, wherein a source or a drain of the first driving transistor is electrically connected to a pixel electrode of the first light-emitting element and a pixel electrode of the second light-emitting element, and wherein a source or a drain of the selection transistor is electrically connected to a gate of the first driving transistor.

9. The display device according to claim 1, wherein the pixel in the i-th row in the third display region has the same color as the pixel in the i-th row and the n-th column in the second display region.

10. The display device according to claim 1, wherein the third display region comprises a plurality of pixels arranged in a row direction, wherein the third display region is adjacent to the pixel in an m-th row in the second display region, wherein a gate signal and a source signal supplied to the pixel in a j-th column in the third display region are the same as a gate signal and a source signal supplied to the pixel in the m-th row and the j-th column in the second display region, and wherein j represents an integer of greater than or equal to 1 and less than or equal to n.

11. The display device according to claim 10, wherein the second display panel comprises a plurality of gate lines, and wherein the gate lines in m+1-th and subsequent rows are connected to the gate line in the m-th row.

12. The display device according to claim 10, wherein the pixel in the j-th column in the third display region has the same color as the pixel in the m-th row and the j-th column in the second display region.

13. The display device according to claim 1, wherein the second display region and the third display region comprise m+x rows and n+y columns of pixels in total, wherein a gate signal and a source signal supplied to each of the pixels in an m+1-th and subsequent rows and n+1-th and subsequent columns are the same as a gate signal and a source signal supplied to the pixel in the m-th row and the n-th column, and wherein x and y separately represent an integer of greater than or equal to 1.

14. The display device according to claim 13, wherein the pixels in the m+1-th and subsequent rows and the n+1-th and subsequent columns have the same color as the pixel in the m-th row and the n-th column.

15. The display device according to claim 1, wherein the first display panel and the second display panel have flexibility.

16. An electronic device comprising:

the display device according to claim 1, and an antenna, a battery, a housing, a camera, a speaker, a microphone, or an operation button.

17. A display device comprising:

a first display panel; and a second display panel, wherein the first display panel comprises a first display region and a region that transmits visible light, wherein the second display panel comprises a second display region and a region that blocks visible light, wherein the first display region is adjacent to the region that transmits visible light, wherein the second display region is adjacent to the region that blocks visible light, wherein the region that transmits visible light is located on a display surface side of the second display region to overlap with the second display region, wherein the region that blocks visible light overlaps with the first display region, wherein the second display region comprises a plurality of pixels arranged in m rows and n columns, wherein the region that blocks visible light is adjacent to the pixel in an n-th column, wherein the pixel in an i-th row and an n−1-th column comprises a first light-emitting element and a first driving transistor, wherein the pixel in the i-th row and the n-th column comprises a second light-emitting element and a second driving transistor, wherein a source or a drain of the first driving transistor is electrically connected to the first light-emitting element, wherein a source or a drain of the second driving transistor is electrically connected to the second light-emitting element, wherein an area of the second light-emitting element is larger than an area of the first light-emitting element, wherein m and n separately represent an integer of greater than or equal to 2, and wherein i represents an integer of greater than or equal to 1 and less than or equal to m.

18. The display device according to claim 17, wherein a W/L ratio between a channel length (L) and a channel width (W) of the second driving transistor is larger than a W/L ratio of the first driving transistor.

19. The display device according to claim 17, wherein the first driving transistor is a single-gate transistor, and wherein the second driving transistor is a dual-gate transistor.

* * * * *